US012608519B2

(12) United States Patent
Meinders

(10) Patent No.: US 12,608,519 B2
(45) Date of Patent: Apr. 21, 2026

(54) TOOL FOR DESIGNING ARTIFICIAL INTELLIGENCE SYSTEMS

(71) Applicant: Christine Meinders, Altadena, CA (US)

(72) Inventor: Christine Meinders, Altadena, CA (US)

( * ) Notice: Subject to any disclaimer, the term of this patent is extended or adjusted under 35 U.S.C. 154(b) by 1068 days.

(21) Appl. No.: 17/234,752

(22) Filed: Apr. 19, 2021

(65) Prior Publication Data

US 2021/0240892 A1 Aug. 5, 2021

Related U.S. Application Data

(63) Continuation-in-part of application No. 16/382,016, filed on Apr. 11, 2019.

(60) Provisional application No. 62/656,278, filed on Apr. 11, 2018.

(51) Int. Cl.
*G06F 30/27* (2020.01)
*G06F 8/76* (2018.01)
*G06N 5/04* (2023.01)

(52) U.S. Cl.
CPC ............... *G06F 30/27* (2020.01); *G06F 8/76* (2013.01); *G06N 5/04* (2013.01)

(58) Field of Classification Search
CPC .......... G06F 30/27; G06N 5/04; G06N 3/045; G06N 5/01; G06N 7/01; G06N 20/00; G06N 20/10
See application file for complete search history.

(56) References Cited

U.S. PATENT DOCUMENTS

| | | | |
|---|---|---|---|
| 8,108,422 B2 | 1/2012 | Anderson et al. | |
| 10,175,979 B1 * | 1/2019 | Elwell | G06F 8/71 |
| 10,521,655 B1 * | 12/2019 | Carbune | G06V 30/153 |
| 10,861,439 B2 * | 12/2020 | Doyle | G06N 3/044 |
| 11,429,859 B2 | 8/2022 | Lehr et al. | |
| 11,651,248 B2 | 5/2023 | Marvaniya et al. | |
| 2007/0010940 A1 | 1/2007 | Tan | |

(Continued)

FOREIGN PATENT DOCUMENTS

| | | |
|---|---|---|
| EP | 4327229 | 2/2024 |
| IN | 202327075280 A | 4/2024 |

OTHER PUBLICATIONS

D. F. Mujtaba and N. R. Mahapatra, "Ethical Considerations in AI-Based Recruitment," 2019 IEEE International Symposium on Technology and Society (ISTAS), Medford, MA, USA, 2019, pp. 1-7, doi: 10.1109/ISTAS48451.2019.8937920 (Year: 2019).*

(Continued)

*Primary Examiner* — James D. Rutten
(74) *Attorney, Agent, or Firm* — Jennifer Hayes; Nixon Peabody LLP

(57) ABSTRACT

The present disclosure is directed towards artificial intelligence systems and methods for receiving and analyzing data. An exemplary method provides for receiving input, at an interface on a computing device. The input includes a dataset, an analysis for the dataset, and an output medium. The method then provides for selecting, based on the received input, at least one algorithm from a plurality of algorithms. The method then provides for processing, via the computing device, the received input with the at least one algorithm to yield an output. The output is provided at the interface on the computing device.

18 Claims, 72 Drawing Sheets

(56) References Cited

U.S. PATENT DOCUMENTS

| | | | |
|---|---|---|---|
| 2012/0078804 | A1 | 3/2012 | Scarborough |
| 2012/0158726 | A1* | 6/2012 | Musgrove ............. G06F 16/353 |
| | | | 707/E17.089 |
| 2012/0159389 | A1 | 6/2012 | Keith et al. |
| 2014/0249500 | A1 | 9/2014 | Estes |
| 2014/0279771 | A1 | 9/2014 | Golovashkin |
| 2016/0303483 | A1 | 10/2016 | Snoddy |
| 2017/0006430 | A1 | 1/2017 | Chao |
| 2017/0293858 | A1* | 10/2017 | Larsen ................... G06N 5/022 |
| 2018/0029293 | A1 | 2/2018 | Neibecker et al. |
| 2019/0057356 | A1* | 2/2019 | Larsen ................... G06V 40/28 |
| 2019/0099653 | A1* | 4/2019 | Wanke .............. A63B 24/0062 |
| 2019/0121855 | A1 | 4/2019 | Alexander et al. |
| 2019/0318262 | A1 | 10/2019 | Meinders |
| 2020/0126533 | A1* | 4/2020 | Doyle .................. G10L 15/063 |
| 2021/0027182 | A1* | 1/2021 | Harris ................... G06N 20/20 |
| 2022/0374604 | A1* | 11/2022 | Sivakumar .......... G06F 16/3329 |

OTHER PUBLICATIONS

Sap et al. "Social Bias Frames: Reasoning about Social and Power Implications of Language" (Jul. 2020) Association for Computational Linguistics, Proceedings of the 58th Annual Meeting of the ACL, pp. 5477-5490 (Year: 2020).*

Y. Kim, T. Soyata and R. F. Behnagh, "Towards Emotionally Aware AI Smart Classroom: Current Issues and Directions for Engineering and Education," in IEEE Access, vol. 6, pp. 5308-5331, 2018, doi: 10.1109/ACCESS.2018.2791861. (Year: 2018).*

Wekinator online publication regarding Wekinator Software. Available at: www.wekinator.org/instructions/.

International Search Report and Written Opinion for PCT/US2022/024875 dated Aug. 16, 2022, 8 pages.

Datta et al., Automated Experiments on Ad Privacy Settings—A Tale of Opacity, Choice and Discrimination, 2015, Proceedings on Privacy Enhancing Technologies, pp. 1-26.

Meinders, C., Embodying Artificial Knowing, Critical Practices: MFA Thesis (part 1), Media Design Practices, ArtCenter College of Design, 2017, 24 pages.

Recasens et al., Linguistic Models for Analyzing and Detecting Biased Language, Proceedings from the 51st Annual Meeting of the Association for Computational Linguistics, 2013, pp. 1650-1659.

Meinders, C., et al., Participatory AI—How to Make Better AI?, 2021, Retrieved from the Internet: https://web.archive.org/web/20210305163332/https://share.hek.ch/en/participatory-ai-how-to-make-better-ai/retrieved on Jan. 19, 2025.

EP 22792236.6 Extended European Search Report dated Feb. 7, 2025.

* cited by examiner

100

110. Receive input comprising a dataset, an analysis, and an output medium.

120. Select an algorithm based on the received input.

130. Process the received input with the selected algorithm.

140. Display the output.

201
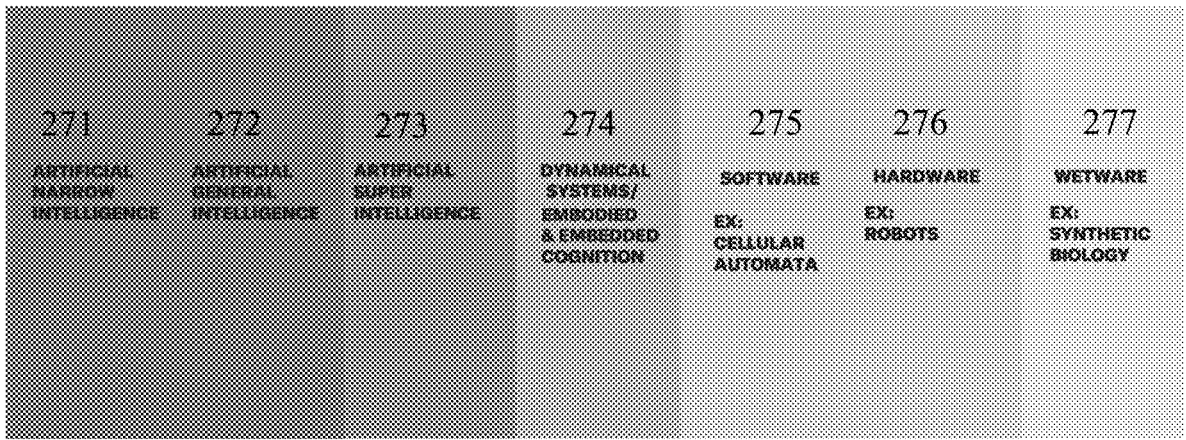
| 271 | 272 | 273 | 274 | 275 | 276 | 277 |
|---|---|---|---|---|---|---|
| ARTIFICIAL NARROW INTELLIGENCE | ARTIFICIAL GENERAL INTELLIGENCE | ARTIFICIAL SUPER INTELLIGENCE | DYNAMICAL SYSTEMS/ EMBODIED & EMBEDDED COGNITION | SOFTWARE EX: CELLULAR AUTOMATA | HARDWARE EX: ROBOTS | WETWARE EX: SYNTHETIC BIOLOGY |
202
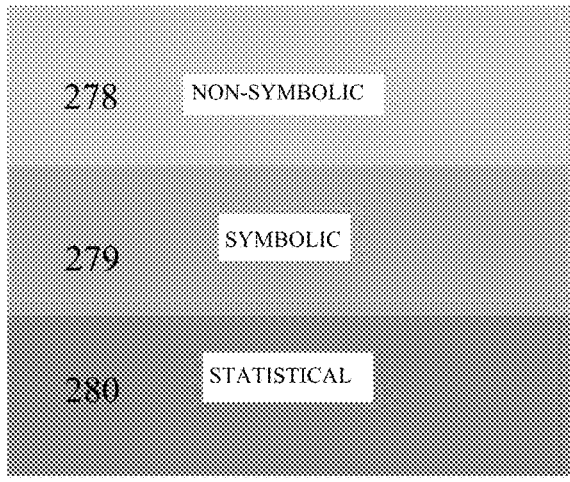
278     NON-SYMBOLIC
279     SYMBOLIC
280     STATISTICAL
FIG. 2A

200B

| | |
|---|---|
| Body | 210 |
| Smart Home Device - Alexa | 211 |
| Algorithm | 212 |
| Autonomous Car Interface | 213 |
| Chatbot | 214 |
| Infrastructure | 215 |
| Wearable | 216 |

| | |
|---|---|
| Physical (CalmingTouch, JarringVibration, IdealPosture, EmpathyEyes) | 241 |
| Social (FaceProtest, PlantProtest, AlgoTransparency, AlgoDiscrimination) | 242 |
| Emotional (ValenceRadio, ArousalLight, EmotionScent) | 243 |
| Creative (GenerateOnReceiptOfIntents, GenerativeIntents) | 244 |
| Ethical (CancelIntent, SubvertCV, ModifyPitch, NoDecision) | 245 |
| Cultural (EngageDiplomacy, GetEmpathy, Provoke, Subvert) | 246 |
| Bookflight (pre-programmed, GetWeather, GetCab, FollowUpIntents) | 247 |

FIG. 2E

| | |
|---|---|
| Printed Language | 250 |
| Synthetic Speech | 251 |
| Physical Object Manipulation | 252 |
| Device change (pitch of voice output) | 253 |
| AI Tagging | 254 |
| Report Summary / Visuals | 255 |
| Exportable code output and/or data (upload or stream) | 256 |

| | |
|---|---|
| Physical (Touch, Talk, Move, Smile, Swirl, Scream, Occupying) | 260 |
| Social (Mirroring, Exposing, CodeSwitching, Subverting) | 261 |
| Emotional (Internalizing, Externalizing, Defiant, Contagious) | 262 |

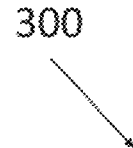
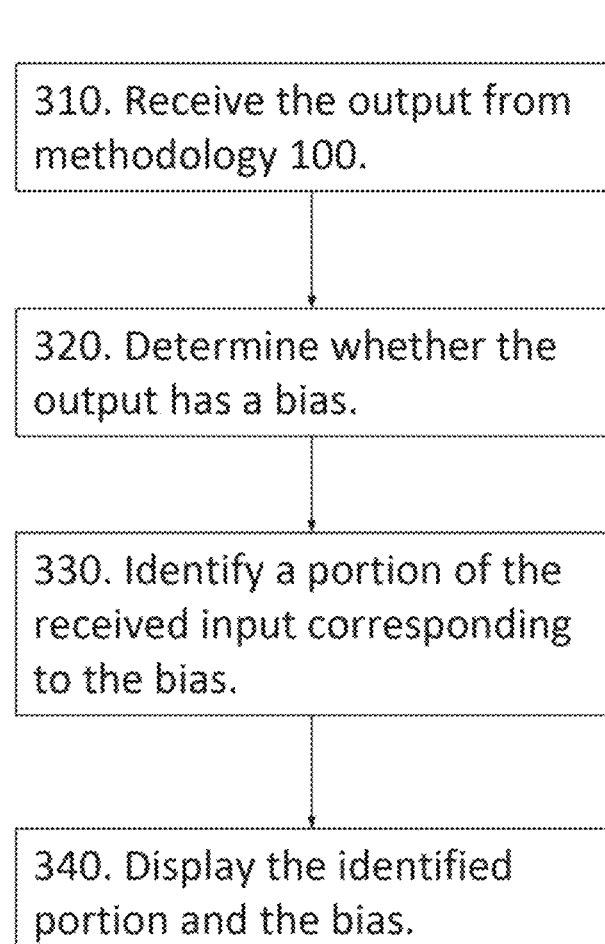
300
310. Receive the output from methodology 100.
320. Determine whether the output has a bias.
330. Identify a portion of the received input corresponding to the bias.
340. Display the identified portion and the bias.
FIG. 3

Figure 4:
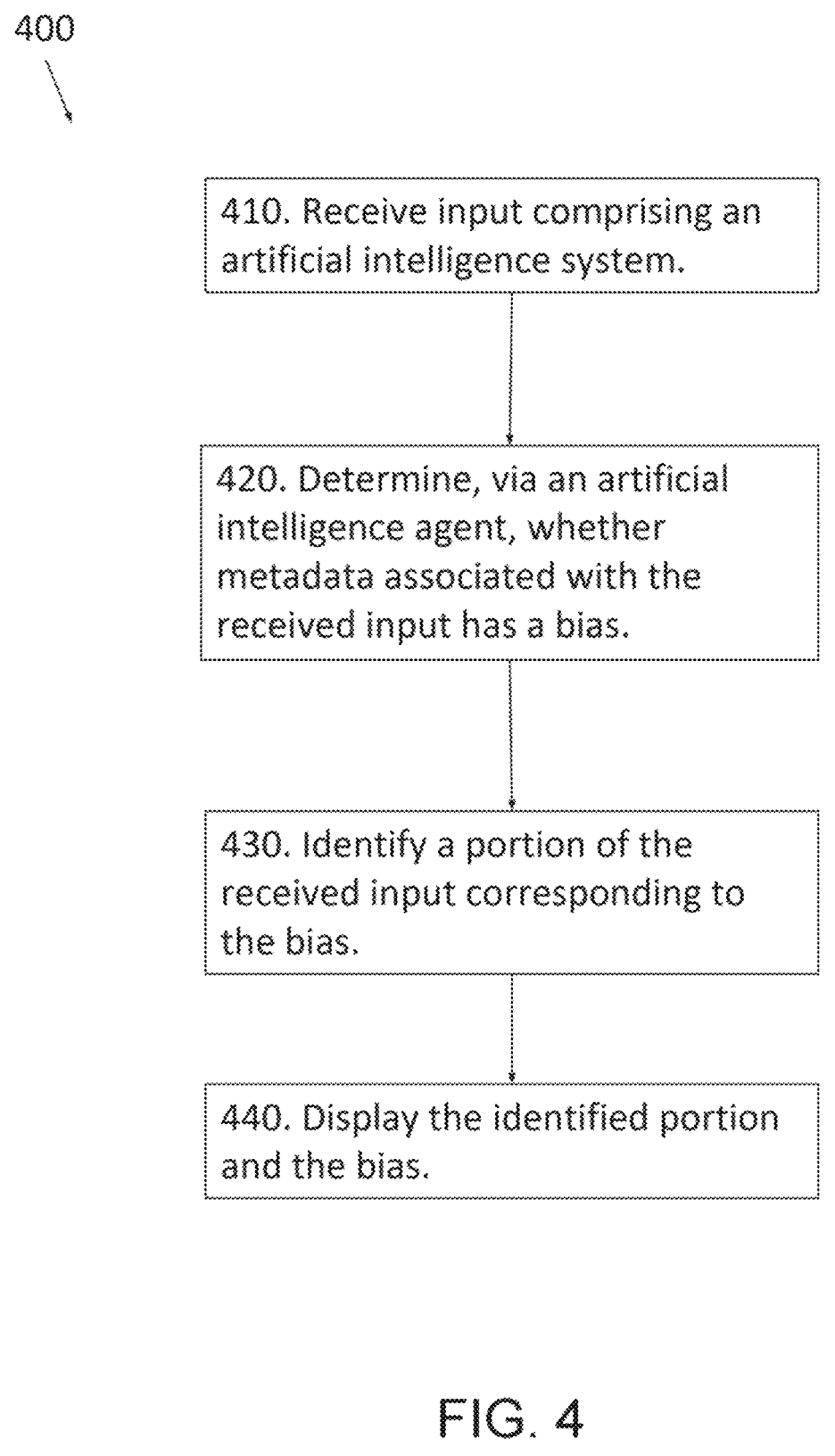

400

410. Receive input comprising an artificial intelligence system.

420. Determine, via an artificial intelligence agent, whether metadata associated with the received input has a bias.

430. Identify a portion of the received input corresponding to the bias.

440. Display the identified portion and the bias.

510. Remove the identified portion from the received input.

520. Retrieve supplementary input data and display the supplementary input data.

530. Receive a request to process a second selection of input data including the supplementary input data.

540. Process the second selection of input data to yield a second output.

550. Display the second output.

Figure 8:
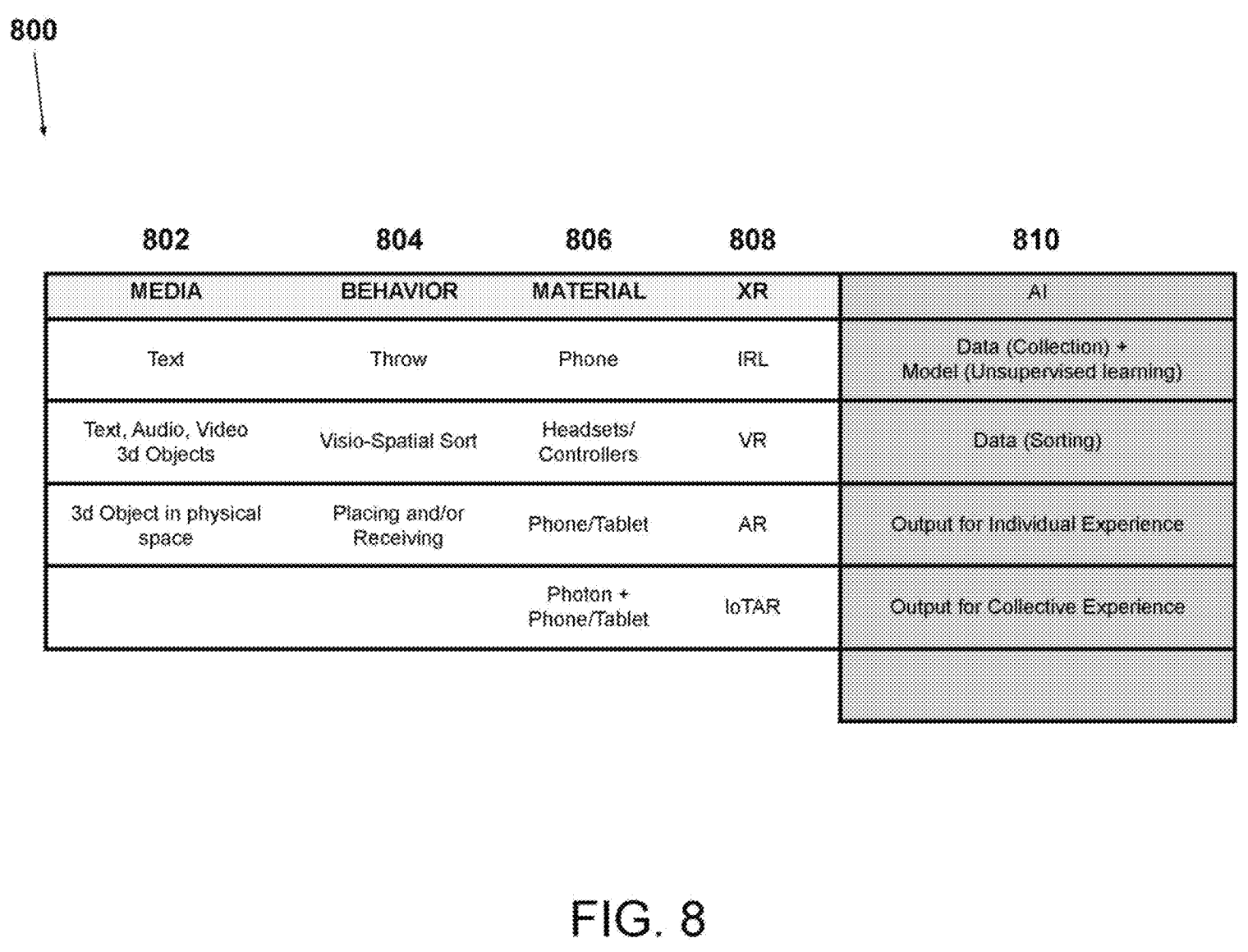

| | 802 | 804 | 806 | 808 | 810 |
|---|---|---|---|---|---|
| | MEDIA | BEHAVIOR | MATERIAL | XR | AI |
| | Text | Throw | Phone | IRL | Data (Collection) + Model (Unsupervised learning) |
| | Text, Audio, Video 3d Objects | Visio-Spatial Sort | Headsets/ Controllers | VR | Data (Sorting) |
| | 3d Object in physical space | Placing and/or Receiving | Phone/Tablet | AR | Output for Individual Experience |
| | | | Photon + Phone/Tablet | IoTAR | Output for Collective Experience |

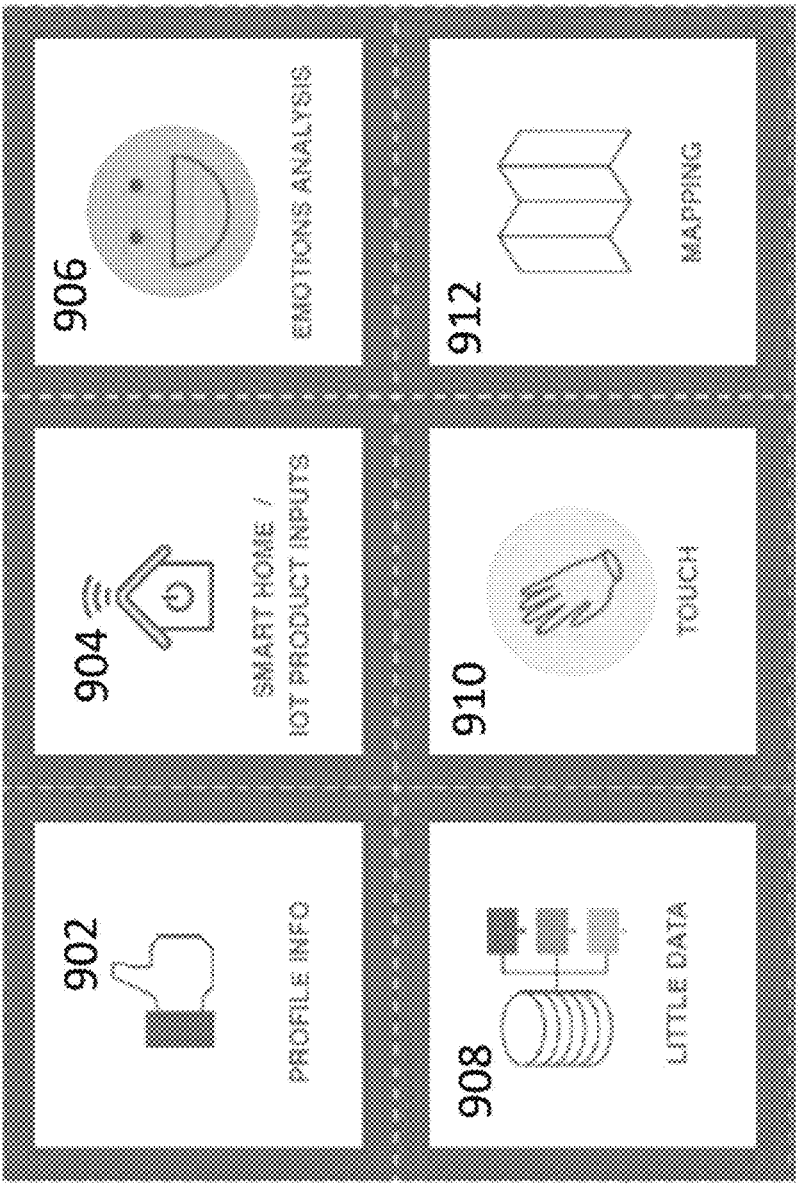
FIG. 9A

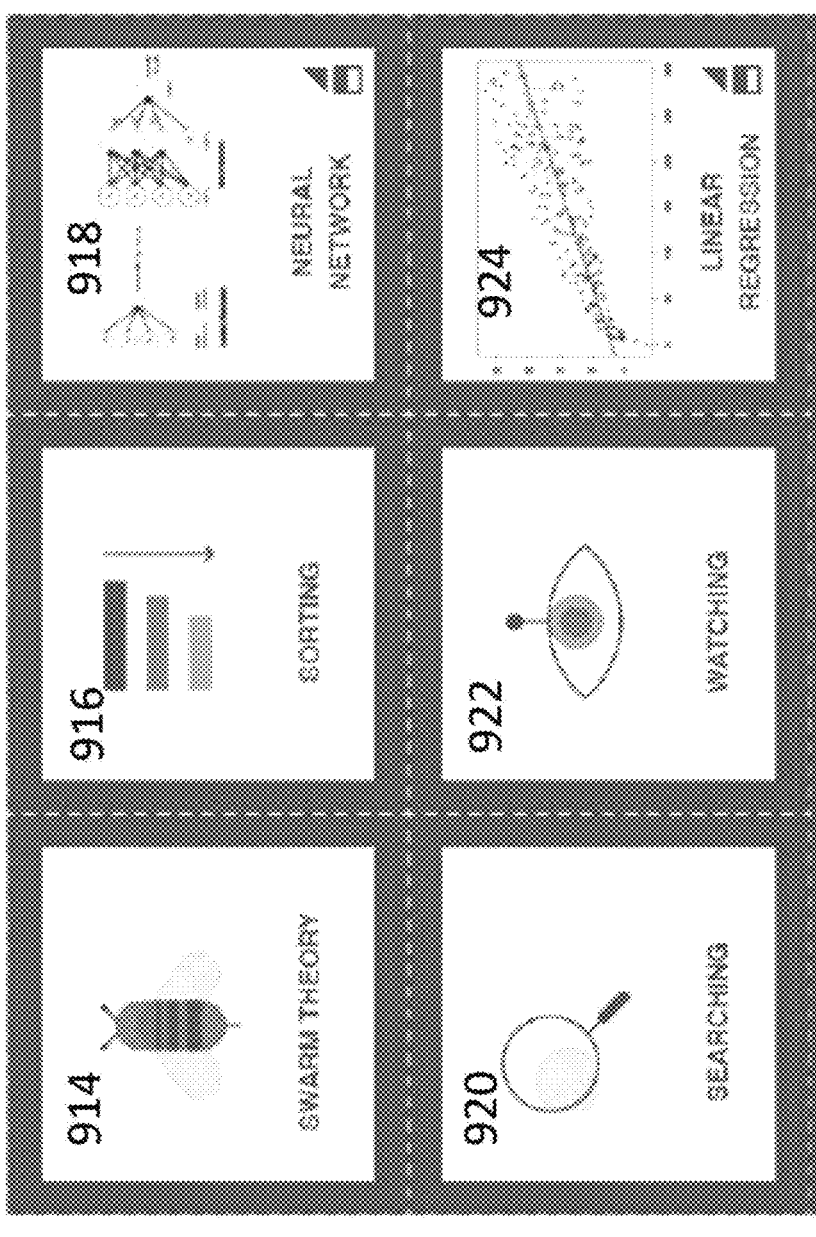
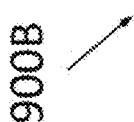
FIG. 9B

900C

Figure 16:
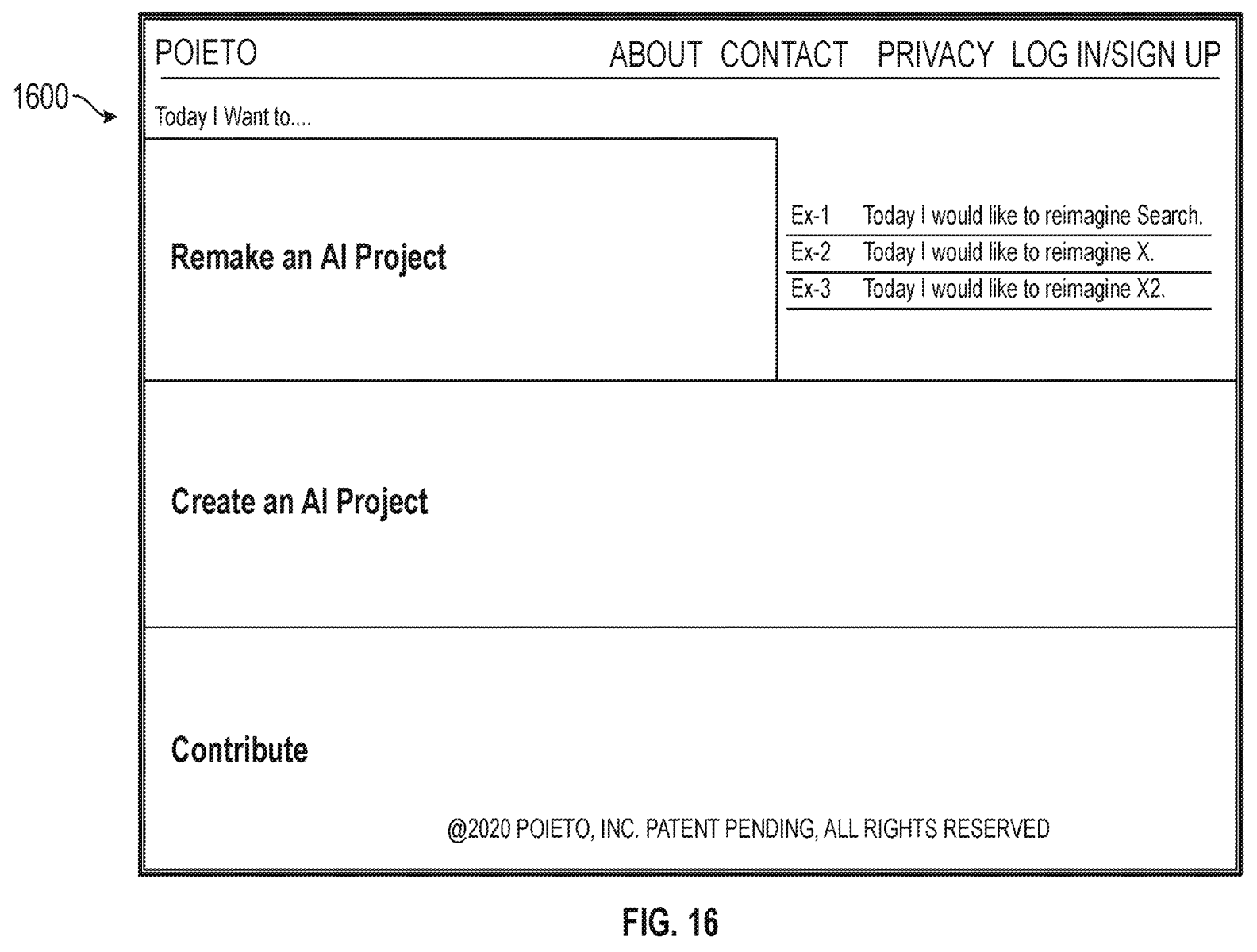

POIETO

ABOUT  CONTACT  PRIVACY  LOG IN/SIGN UP

Today I Want to....

Remake an AI Project

Ex-1  Today I would like to reimagine Search.

Ex-2  Today I would like to reimagine X.

Ex-3  Today I would like to reimagine X2.

Create an AI Project

Contribute

1600

@2020 POIETO, INC. PATENT PENDING, ALL RIGHTS RESERVED

FIG. 16 poieto

Figure 17:
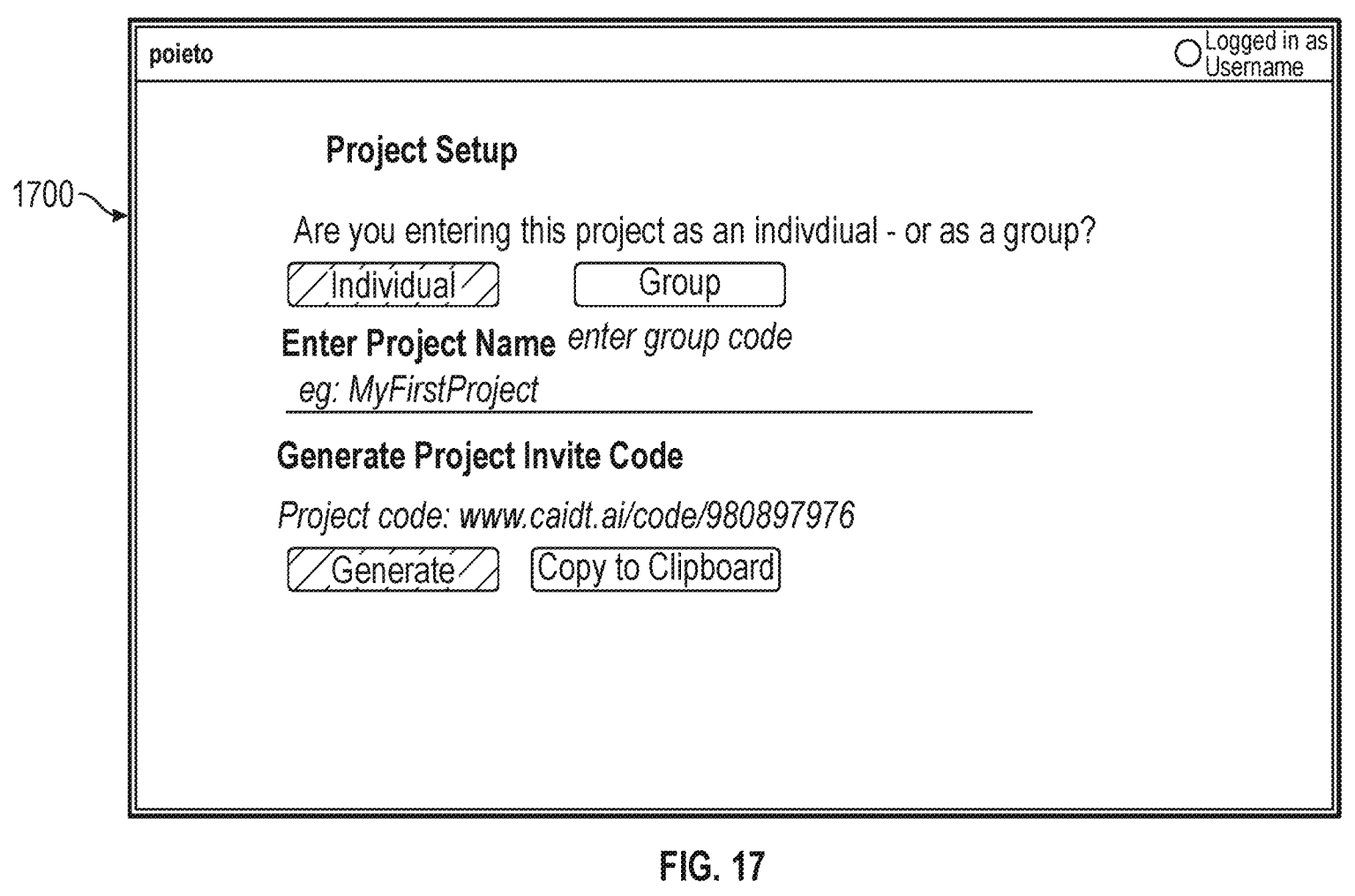

○ Logged in as
   Username

Project Setup

Are you entering this project as an indivdiual - or as a group?

[Individual]    [Group]

Enter Project Name *enter group code*

*eg: MyFirstProject*

Generate Project Invite Code

*Project code: www.caidt.ai/code/980897976*

[Generate]    [Copy to Clipboard]

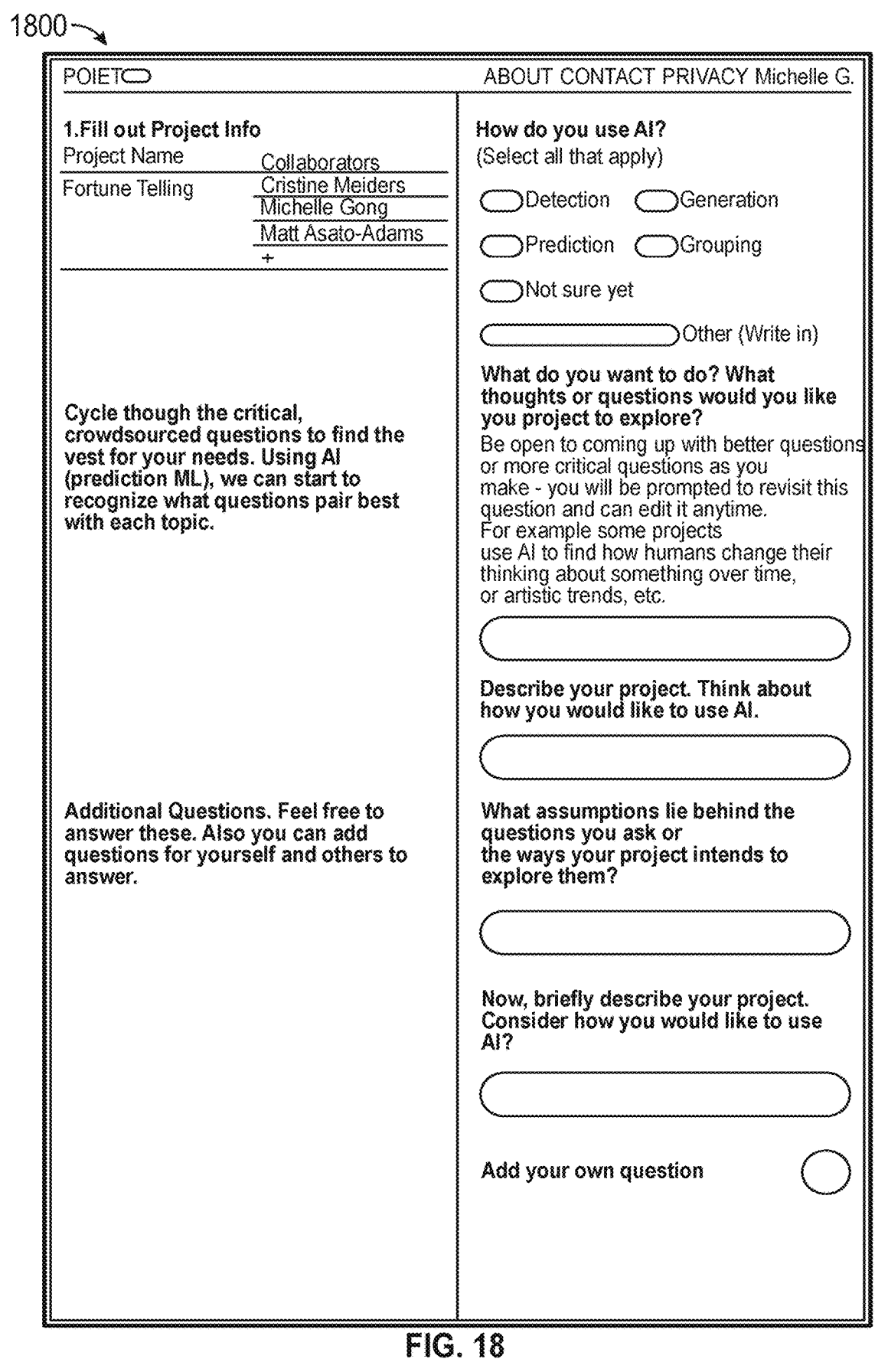

POIET◯                  ABOUT CONTACT PRIVACY Michelle G.

1.Fill out Project Info

Project Name

Fortune Telling

Collaborators
Cristine Meiders
Michelle Gong
Matt Asato-Adams
+

How do you use AI?
(Select all that apply)

◯Detection      ◯Generation

◯Prediction      ◯Grouping

◯Not sure yet

◯_____◯Other (Write in)

Cycle though the critical, crowdsourced questions to find the vest for your needs. Using AI (prediction ML), we can start to recognize what questions pair best with each topic.

What do you want to do? What thoughts or questions would you like you project to explore?
Be open to coming up with better questions or more critical questions as you
make - you will be prompted to revisit this question and can edit it anytime.
For example some projects
use AI to find how humans change their thinking about something over time,
or artistic trends, etc.

⬭

Describe your project. Think about how you would like to use AI.

⬭

Additional Questions. Feel free to answer these. Also you can add questions for yourself and others to answer.

What assumptions lie behind the questions you ask or the ways your project intends to explore them?

⬭

Now, briefly describe your project. Consider how you would like to use AI?

⬭

Add your own question      ◯

FIG. 18

Figure 19:
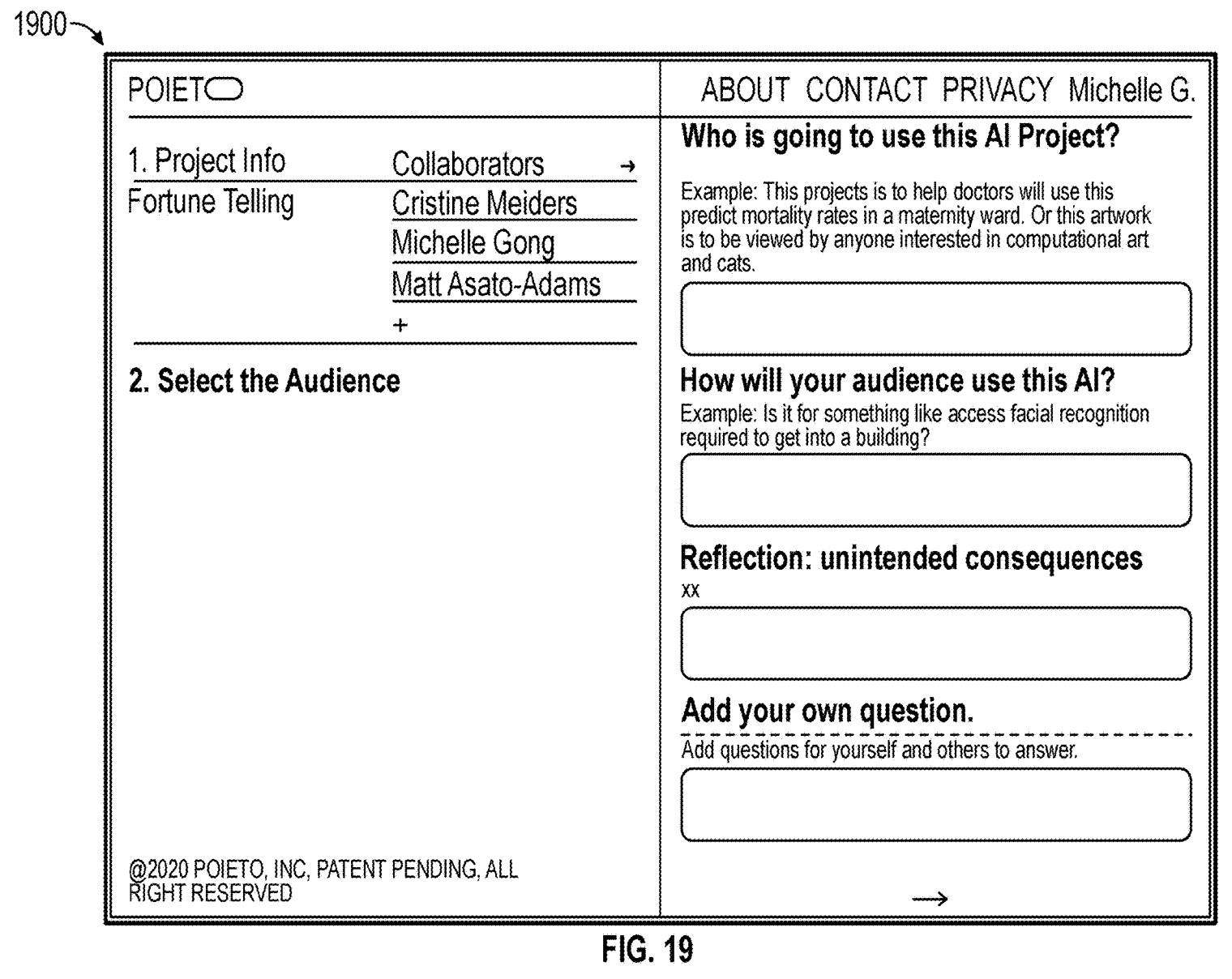

POIETO

ABOUT  CONTACT  PRIVACY  Michelle G.

1. Project Info     Collaborators    ↑

Fortune Telling     Cristine Meiders

Michelle Gong

Matt Asato-Adams

+

Who is going to use this AI Project?

Example: This projects is to help doctors will use this predict mortality rates in a maternity ward. Or this artwork is to be viewed by anyone interested in computational art and cats.

2. Select the Audience

How will your audience use this AI?

Example: Is it for something like access facial recognition required to get into a building?

Reflection: unintended consequences xx

Add your own question.

Add questions for yourself and others to answer.

Frminist. AI Philosphy

8 made by people
affected by tech

No Image Yet

2100

POIET○

| 1. Project Info | Collaborators | ↑ |
|---|---|---|
| Fortune Telling | Christine Meinders | |
| | Michelle Gong | |
| | Matt Asato-Adams | |
| | + | |

2. Audience     ↑

3. Create a Blueprint

Speculate about how you think it functions

The 6 cards in this section are locked–so you don't have to do anything here right now!

Please contribute to the lenses additions and data addition.

Blueprint – Part 1: What does it do?

Input

Spoken or Typed words. Text (hypertext) is connected to other text through links (hyperlinks) and ranks and indexes them.

google.com/search/how searchworks

Actions

Typed words use this index and crawlers to find what you are searching for-the results are ranked and appear on the webpage.

google.com/search/how searchworks

Output

Ranked Search Results

Blueprint Part 2: How does it work?

Data

Known entities like dates and movies

Key factors like: meaning, context & relevance google.com/search/how searchworks

Rules(model/algo)

learning to identify unknown entities) (ex: semi -supervised learning)

There are multiple algorithms used in search.

google.com/search/how searchworks

Form / Material

This can take place on a screen or smart speaker or microcontoller.

FIG. 21A

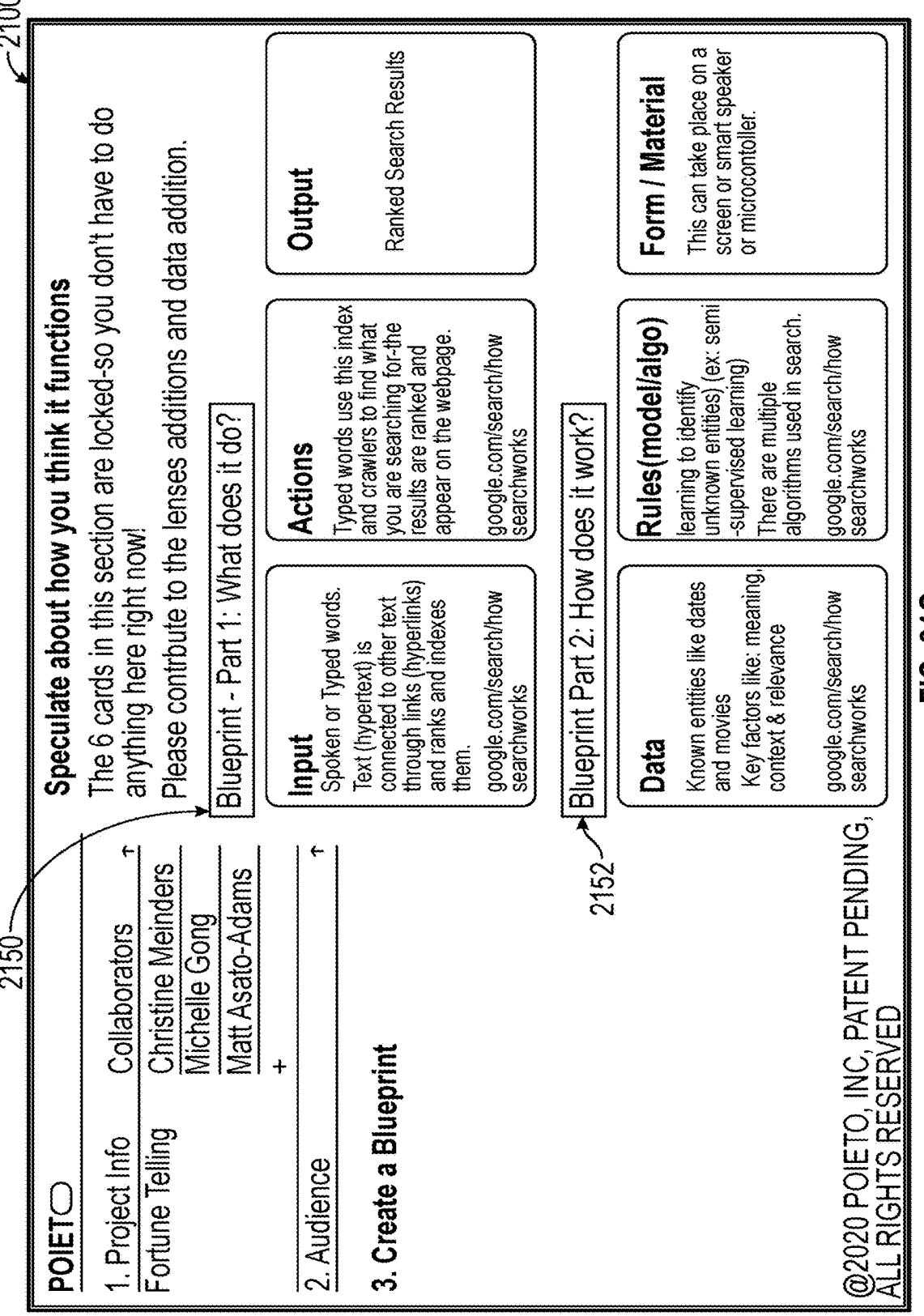

POIETO ◯

1. Project Info

Fortune Telling

Collaborators    ↑

Christine Meinders
Michelle Gong
Matt Asato-Adams

+

2. Audience    ↑

3. Create a Blueprint

2150

2152

Speculate about how you think it functions

The 6 cards in this section are locked-so you don't have to do anything here right now!

Please contribute to the lenses additions and data addition.

Blueprint - Part 1: What does it do?

Input

Spoken or Typed words.
Text (hypertext) is connected to other text through links (hyperlinks) and ranks and indexes them.

google.com/search/how searchworks

Actions

Typed words use this index and crawlers to find what you are searching for-the results are ranked and appear on the webpage.

google.com/search/how searchworks

Output

Ranked Search Results

Blueprint Part 2: How does it work?

Data

Known entities like dates and movies

Key factors like: meaning, context & relevance google.com/search/how searchworks

Rules(model/algo)

learning to identify unknown entities) (ex: semi -supervised learning)

There are multiple algorithms used in search.

google.com/search/how searchworks

Form / Material

This can take place on a screen or smart speaker or microcontoller.

Add New Data

What is beauty, add text, images, or both

SD-01

Fem-S

AOO-FAI-Sara

Provide information

What is Beauty? Please separate thoughts by commas.

Drag an image here or click Browse

Add

Figure 23A:
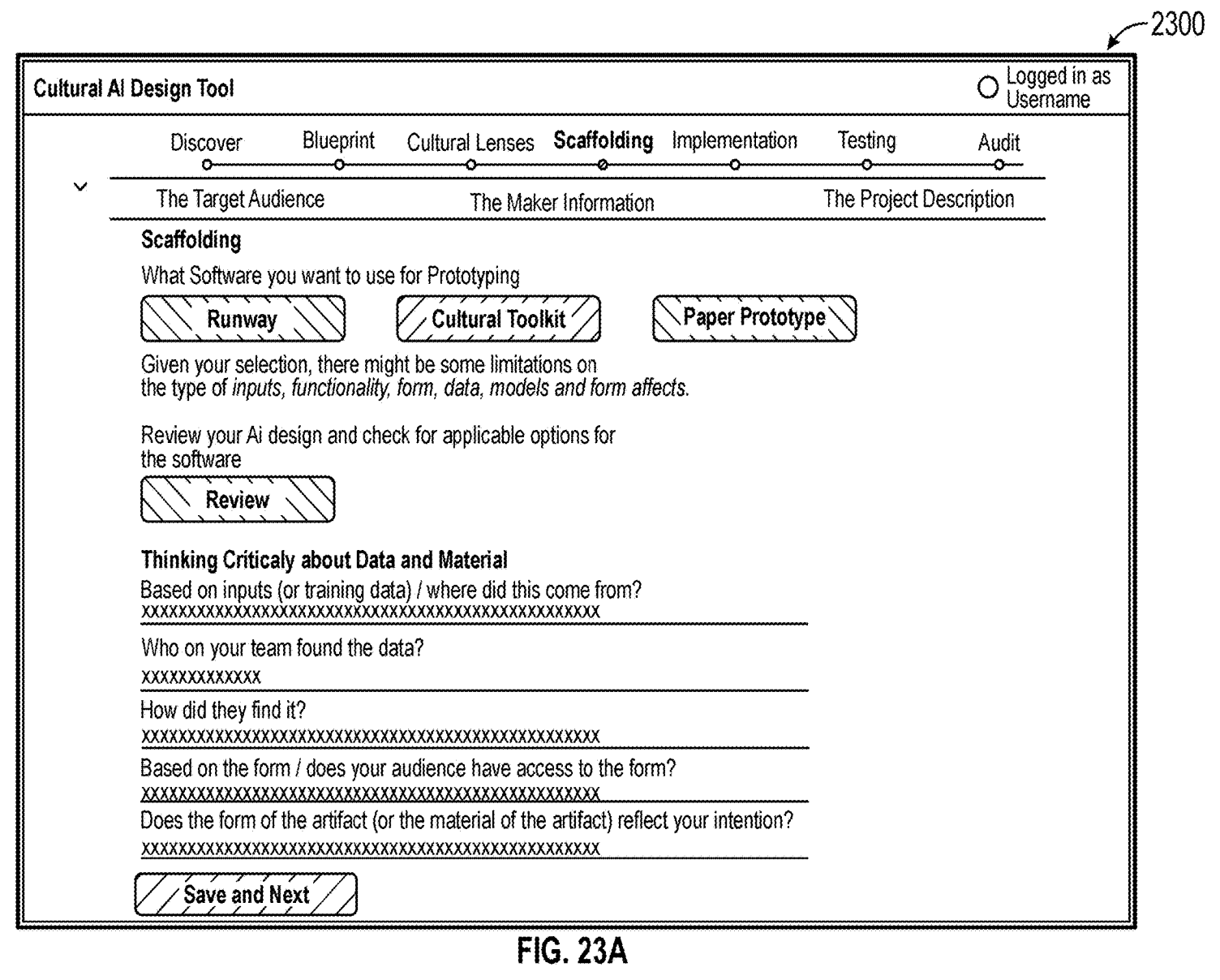

2300

Cultural AI Design Tool

○ Logged in as
Username

Discover    Blueprint    Cultural Lenses    Scaffolding    Implementation    Testing    Audit The Target Audience    The Maker Information    The Project Description

Scaffolding

What Software you want to use for Prototyping

| Runway | Cultural Toolkit | Paper Prototype |

Given your selection, there might be some limitations on the type of *inputs, functionality, form, data, models and form affects.*

Review your Ai design and check for applicable options for the software

| Review |

Thinking Critically about Data and Material

Based on inputs (or training data) / where did this come from?
xxxxxxxxxxxxxxxxxxxxxxxxxxxxxxxxxxxxxxxxxxxxxxxxxxxx Who on your team found the data?
xxxxxxxxx How did they find it?
xxxxxxxxxxxxxxxxxxxxxxxxxxxxxxxxxxxxxxxxxxxxxxxxxxxxx Based on the form / does your audience have access to the form?
xxxxxxxxxxxxxxxxxxxxxxxxxxxxxxxxxxxxxxxxxxxxxxxxxxxx Does the form of the artifact (or the material of the artifact) reflect your intention?
xxxxxxxxxxxxxxxxxxxxxxxxxxxxxx

| Save and Next |

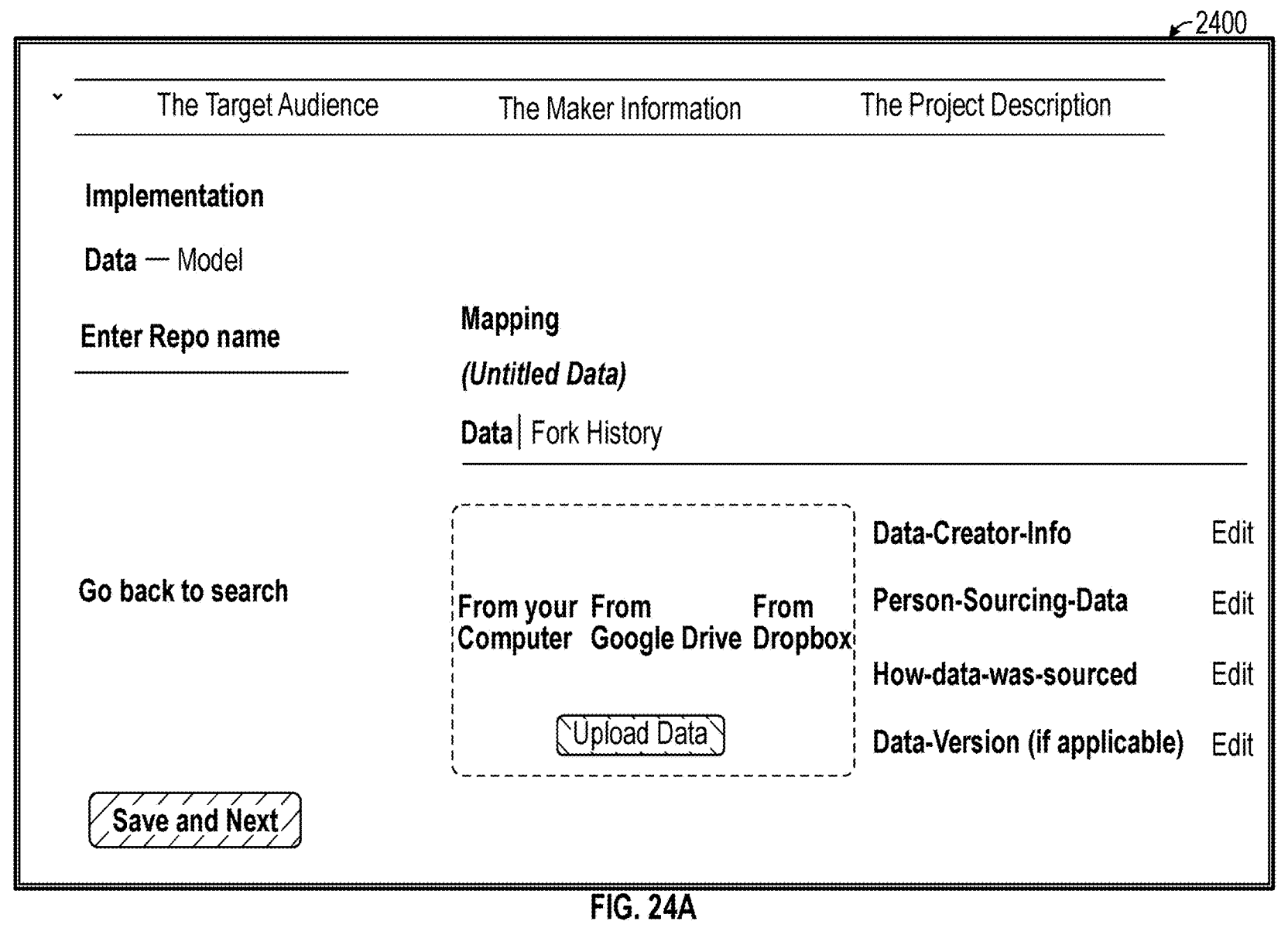

The Target Audience | The Maker Information | The Project Description

Implementation

Data — Model

Enter Repo name

Mapping

*(Untitled Data)*

Data | Fork History

From your   From        From
Computer   Google Drive Dropbox

Upload Data

Data-Creator-Info                          Edit

Person-Sourcing-Data                       Edit

How-data-was-sourced                       Edit

Data-Version (if applicable)               Edit

Go back to search

Save and Next

FIG. 24A

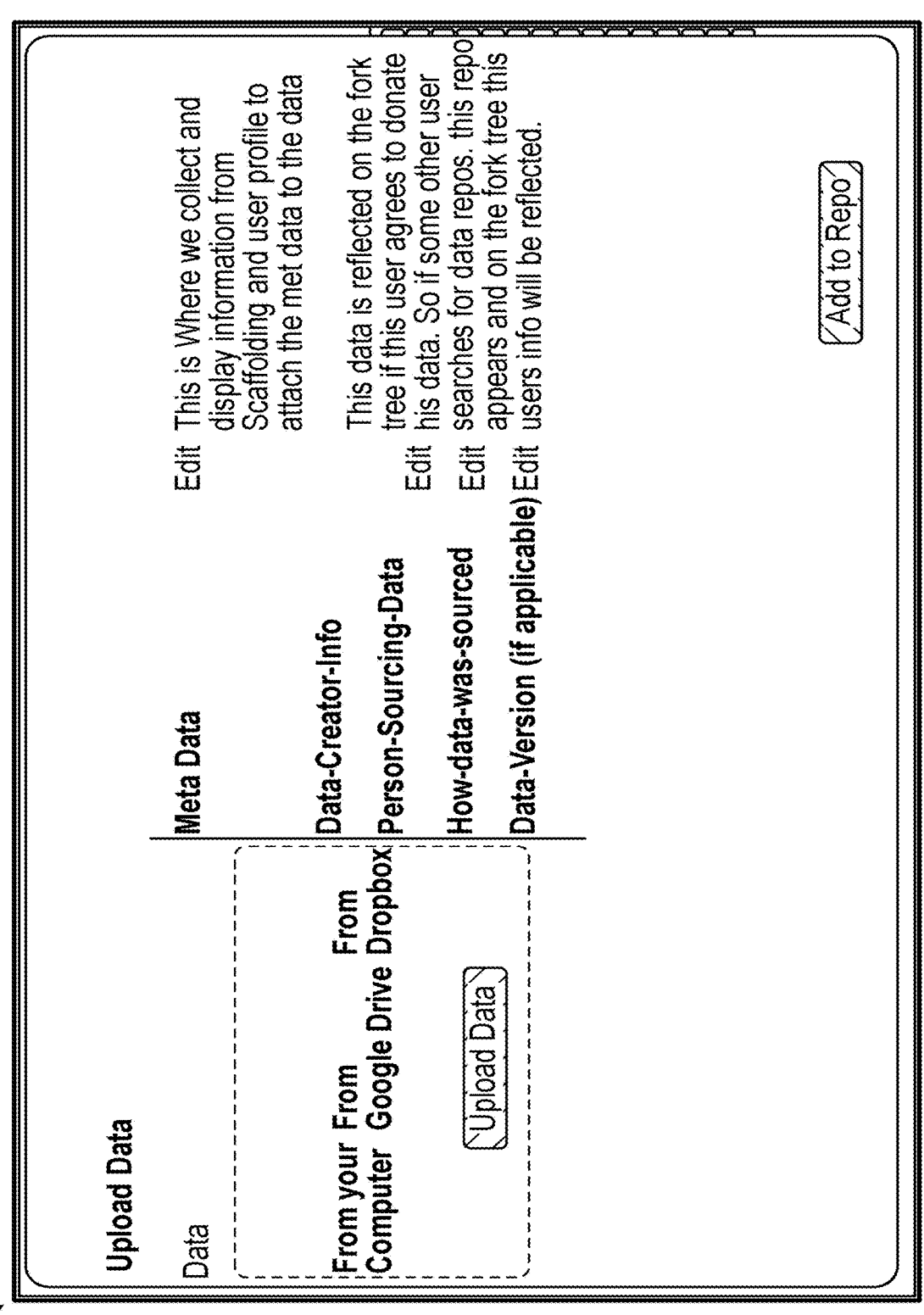

Upload Data

Data

Meta Data

Data-Creator-Info        Edit  This is Where we collect and
                                   display information from
                                   Scaffolding and user profile to
                                   attach the met data to the data

Person-Sourcing-Data           This data is reflected on the fork
                                   tree if this user agrees to donate
                             Edit  his data. So if some other user

How-data-was-sourced     Edit  searches for data repos. this repo
                                   appears and on the fork tree this

Data-Version (if applicable) Edit  users info will be reflected.

From your    From
Computer  Google Drive Dropbox

Upload Data

Add to Repo

The Target Audience      The Maker Information      The Project Description

Implementation

Data — Model

Mapping
*(Forked)*

Face-Data-Repo-6

Forked Face-Data-Repo-6
Data | Fork History

Resume Repo

| Add your own data to repo |

| Keep the Repo as is |

Go back to search

| | |
|---|---|
| Data Point Name | Data File.jpg | P | This Is s preview button |
| Data Point Name | Data File.jpg | P | that w open a |
| Data Point Name | Data File.jpg | P | modal to show the image/text |
| Data Point Name | Data File.jpg | P | etc |
| Data Point Name | Data File.jpg | P | |
| Data Point Name | Data File.jpg | P | |
| Data Point Name | Data File.jpg | P | |
| Data Point Name | Data File.jpg | P | |
| Data Point Name | Data File.jpg | P | |
| Data Point Name | Data File.jpg | P | |
| Data Point Name | Data File.jpg | P | |
| Data Point Name | Data File.jpg | P | |

2400

| Save and Next |

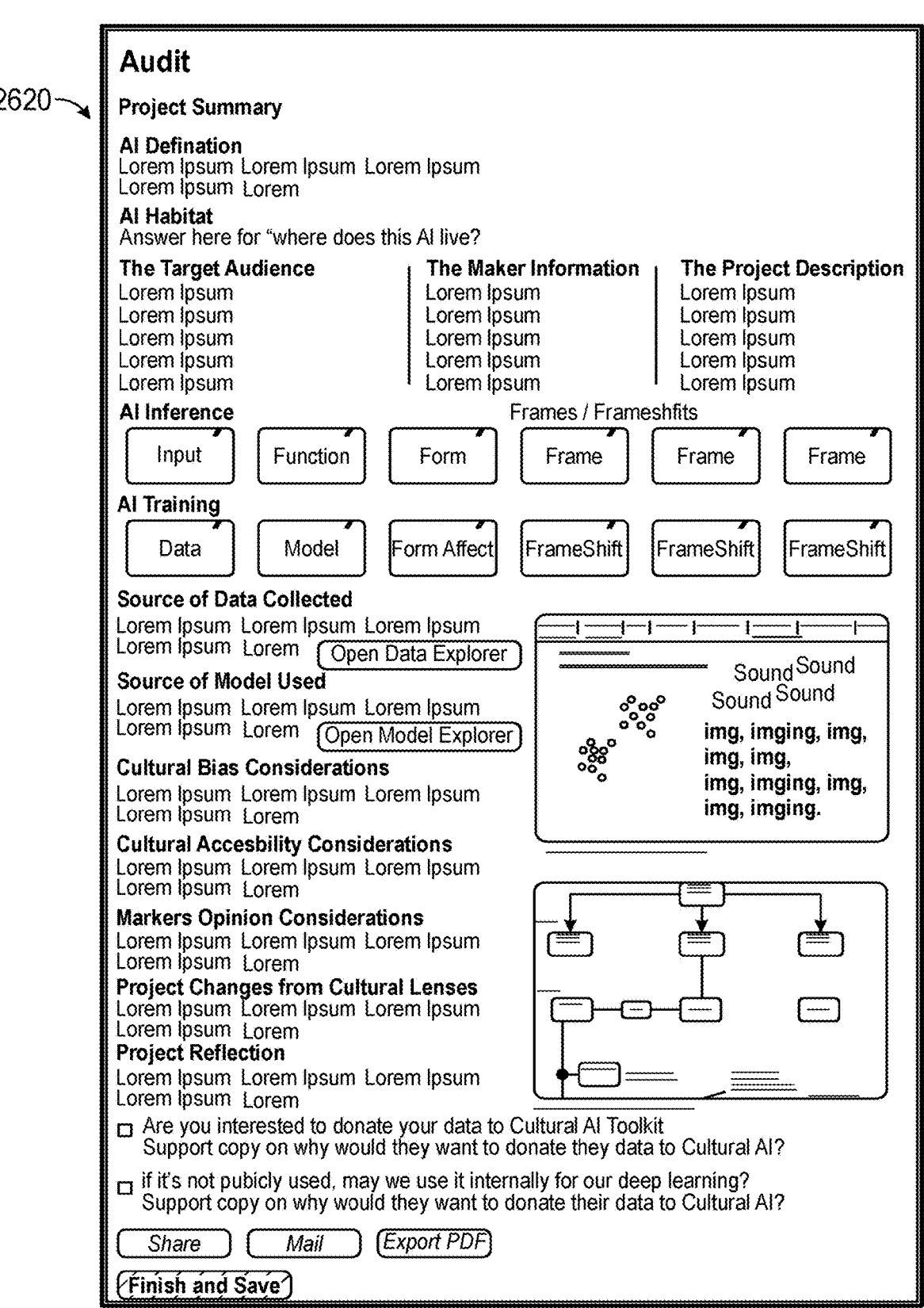

Audit

Project Summary

AI Defination
Lorem Ipsum Lorem Ipsum Lorem Ipsum
Lorem Ipsum Lorem

AI Habitat
Answer here for "where does this AI live?

| The Target Audience | The Maker Information | The Project Description |
|---|---|---|
| Lorem Ipsum | Lorem Ipsum | Lorem Ipsum |
| Lorem Ipsum | Lorem Ipsum | Lorem Ipsum |
| Lorem Ipsum | Lorem Ipsum | Lorem Ipsum |
| Lorem Ipsum | Lorem Ipsum | Lorem Ipsum |
| Lorem Ipsum | Lorem Ipsum | Lorem Ipsum |

AI Inference      Frames / Frameshfits

| Input | Function | Form | Frame | Frame | Frame |
|---|---|---|---|---|---|

AI Training

| Data | Model | Form Affect | FrameShift | FrameShift | FrameShift |
|---|---|---|---|---|---|

Source of Data Collected
Lorem Ipsum Lorem Ipsum Lorem Ipsum
Lorem Ipsum Lorem   [Open Data Explorer]

Source of Model Used
Lorem Ipsum Lorem Ipsum Lorem Ipsum
Lorem Ipsum Lorem   [Open Model Explorer]

Cultural Bias Considerations
Lorem Ipsum Lorem Ipsum Lorem Ipsum
Lorem Ipsum Lorem

Cultural Accesbility Considerations
Lorem Ipsum Lorem Ipsum Lorem Ipsum
Lorem Ipsum Lorem Sound Sound
Sound Sound img, imging, img,
img, img,
img, imging, img,
img, imging.

Markers Opinion Considerations
Lorem Ipsum Lorem Ipsum Lorem Ipsum
Lorem Ipsum Lorem

Project Changes from Cultural Lenses
Lorem Ipsum Lorem Ipsum Lorem Ipsum
Lorem Ipsum Lorem

Project Reflection
Lorem Ipsum Lorem Ipsum Lorem Ipsum
Lorem Ipsum Lorem

☐ Are you interested to donate your data to Cultural AI Toolkit
   Support copy on why would they want to donate they data to Cultural AI?

☐ if it's not pubicly used, may we use it internally for our deep learning?
   Support copy on why would they want to donate their data to Cultural AI?

[Share]   [Mail]   [Export PDF]

[Finish and Save]

Figure 26D:
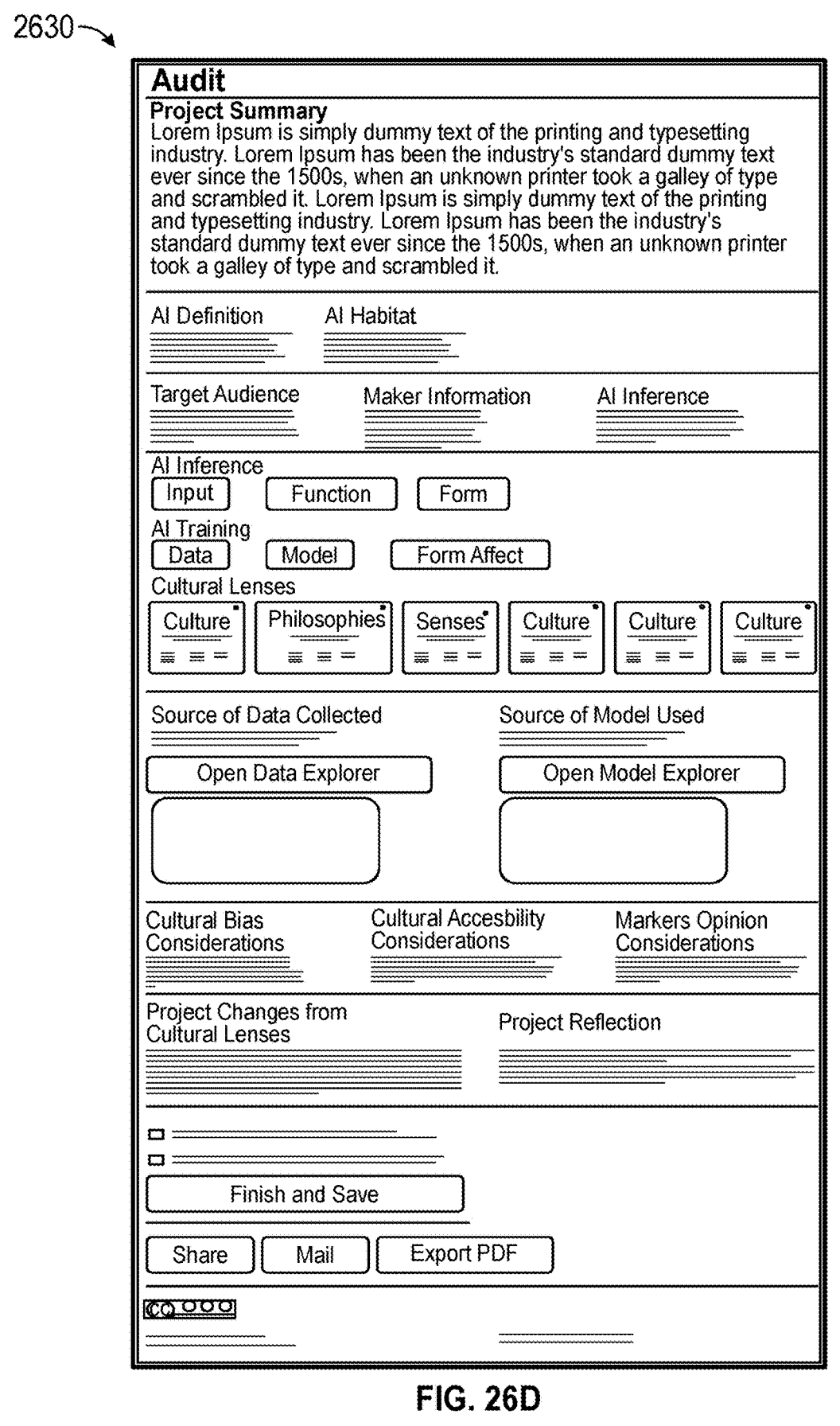

Audit

Project Summary
Lorem Ipsum is simply dummy text of the printing and typesetting industry. Lorem Ipsum has been the industry's standard dummy text ever since the 1500s, when an unknown printer took a galley of type and scrambled it. Lorem Ipsum is simply dummy text of the printing and typesetting industry. Lorem Ipsum has been the industry's standard dummy text ever since the 1500s, when an unknown printer took a galley of type and scrambled it.

AI Definition      AI Habitat

Target Audience      Maker Information      AI Inference

AI Inference
[ Input ]   [ Function ]   [ Form ]

AI Training
[ Data ]   [ Model ]   [ Form Affect ]

Cultural Lenses
[ Culture ]   [ Philosophies ]   [ Senses ]   [ Culture ]   [ Culture ]   [ Culture ]

Source of Data Collected      Source of Model Used

[ Open Data Explorer ]      [ Open Model Explorer ]

Cultural Bias Considerations      Cultural Accesbility Considerations      Markers Opinion Considerations Project Changes from Cultural Lenses      Project Reflection

☐
☐

[ Finish and Save ]

[ Share ]   [ Mail ]   [ Export PDF ]

Figure 26E:
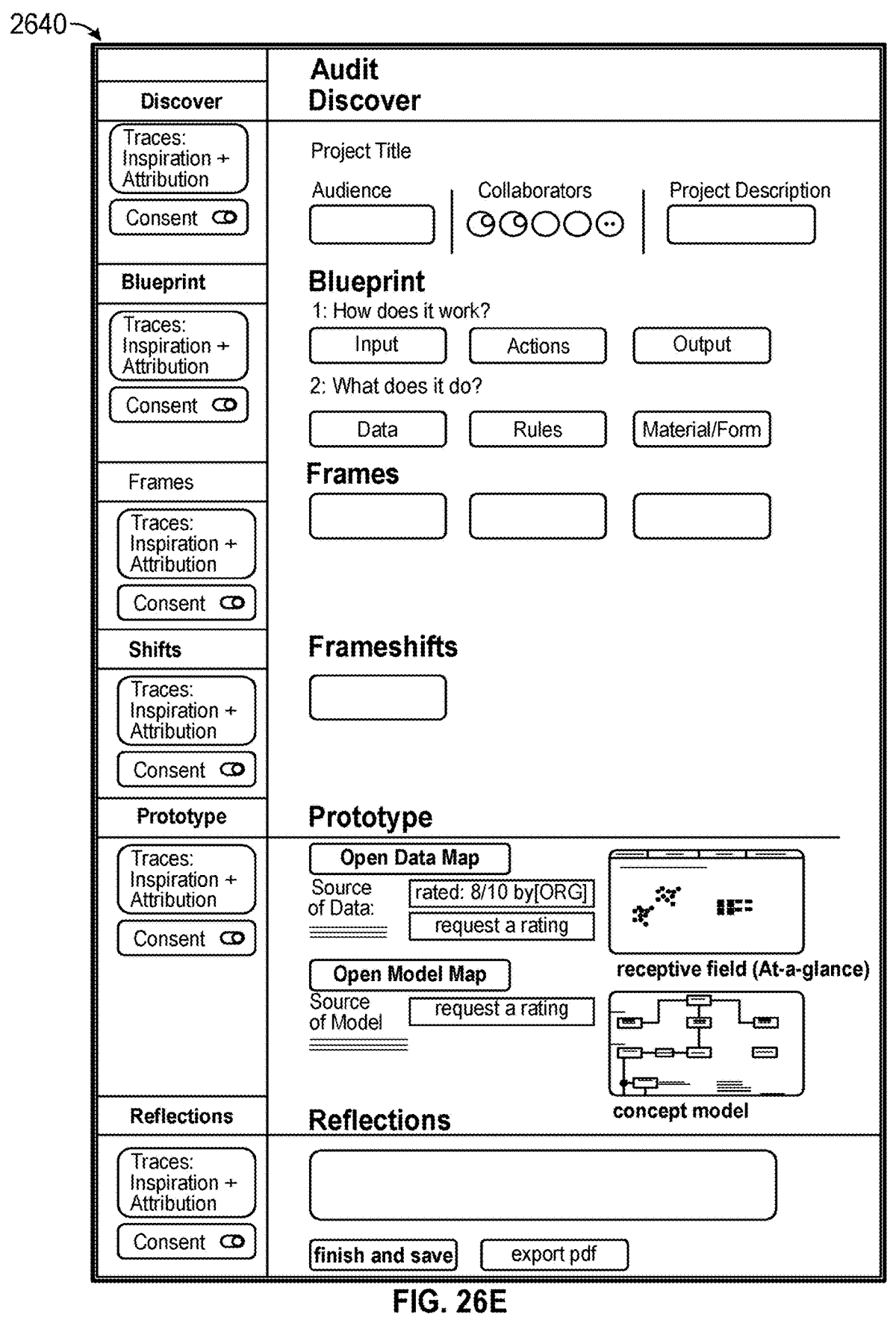

Discover

| Discover |
| --- |
| Traces: Inspiration + Attribution |
| Consent ⊂⊃ |

| Blueprint |
| --- |
| Traces: Inspiration + Attribution |
| Consent ⊂⊃ |

| Frames |
| --- |
| Traces: Inspiration + Attribution |
| Consent ⊂⊃ |

| Shifts |
| --- |
| Traces: Inspiration + Attribution |
| Consent ⊂⊃ |

| Prototype |
| --- |
| Traces: Inspiration + Attribution |
| Consent ⊂⊃ |

| Reflections |
| --- |
| Traces: Inspiration + Attribution |
| Consent ⊂⊃ |

Audit
Discover

Project Title

Audience | Collaborators | Project Description

Blueprint

1: How does it work?

[ Input ] [ Actions ] [ Output ]

2: What does it do?

[ Data ] [ Rules ] [ Material/Form ]

Frames

Frameshifts

Prototype

Open Data Map

Source of Data:    rated: 8/10 by[ORG]
request a rating receptive field (At-a-glance)

Open Model Map

Source of Model    request a rating concept model

Reflections

[ finish and save ] [ export pdf ]

Figure 27A:
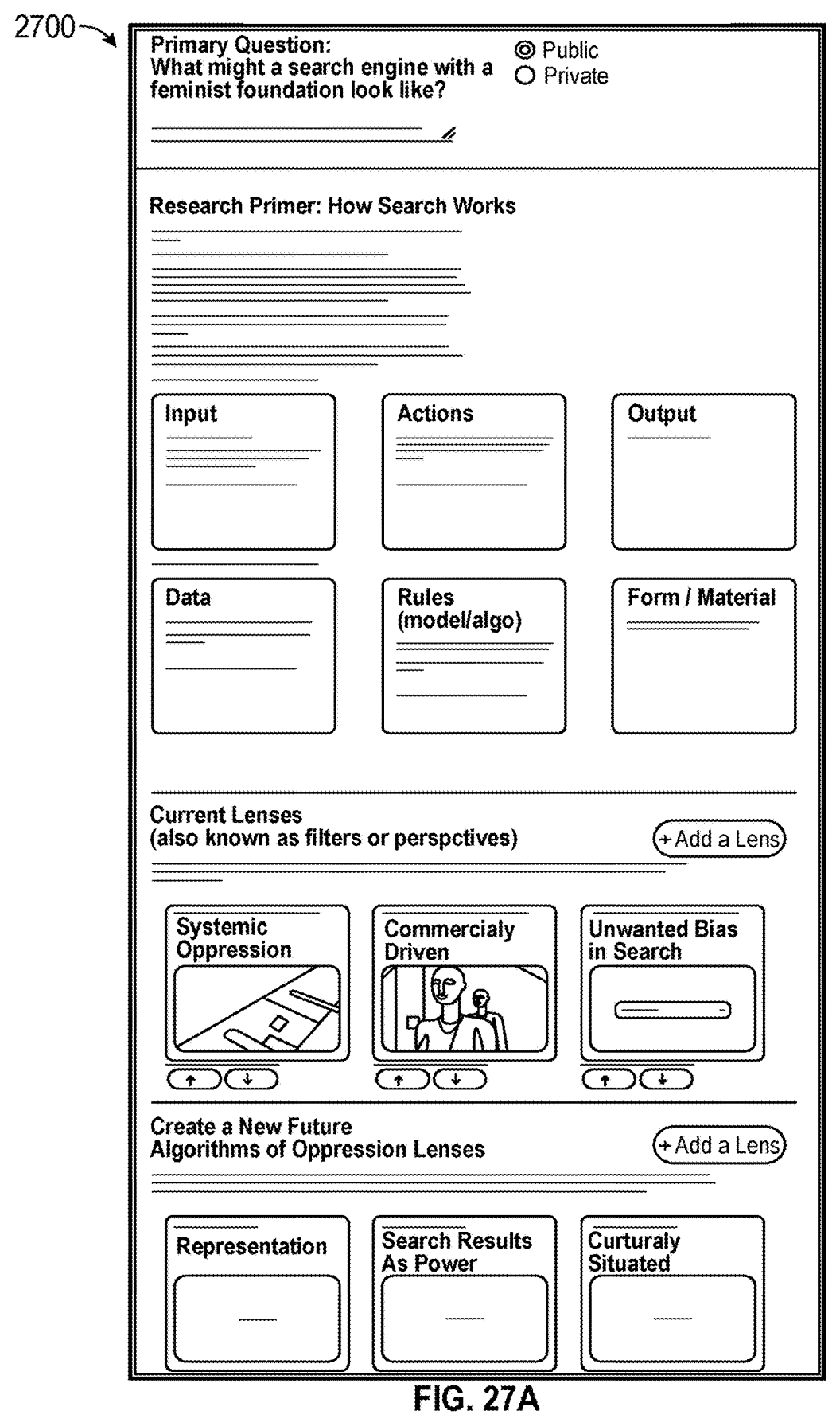

Primary Question:
What might a search engine with a
feminist foundation look like?

◉ Public
○ Private

Research Primer: How Search Works

| Input | Actions | Output |
|---|---|---|

| Data | Rules (model/algo) | Form / Material |
|---|---|---|

Current Lenses
(also known as filters or perspctives)                    (+Add a Lens)

| Systemic Oppression | Commercialy Driven | Unwanted Bias in Search |
|---|---|---|

(↑) (↓)      (↑) (↓)      (↑) (↓)

Create a New Future
Algorithms of Oppression Lenses                    (+Add a Lens)

| Representation | Search Results As Power | Curturaly Situated |
|---|---|---|

| | | | | | |
|---|---|---|---|---|---|

Source of New Data Collected

Datasets - what information is important to you. Contribute your thoughts to other projects here including: Algorithms of Oppression inspired Encode projects, Feminist AI projects, and additional Academic, Industry, and Community Projects.

Primary Question: Data Collection for Feminist Search from Algorithms of Oppression

These are 1 datasets at the Poieto that you have access to

Filter the datasets

2735

| actions | Icon | Name | community | authors | project |
|---|---|---|---|---|---|
| + ↓ ⟳ | ◉ | FS-04 | Fem-S | FAI-AOO-Sara-2020 | Concepts of Beauty |

Items per page 5 ▾   1-1 of 1   |< < > >|

Data Collection for Additional Algorithms of Oppression / Encode inspired projects:

These are 6 datasets at the Poieto that you have access to

Filter the datasets

| actions | Icon | Name | community | authors | project |
|---|---|---|---|---|---|
| + ↑ ↓ ⟳ | ⊘ | EC-01 | Bias | FAI-TMRW-People-2029 | Future of Bias |
| + ↑ ↓ ⟳ | ⊘ | FS-01 | Bias | FAI-AOO-Cristine-2020 | Centering the Social |
| + ↑ ↓ ⟳ | ⊘ | VD-05 | Voice-Design | FAI-Jade-2020 | Code Switching Voice Research |
| + ↑ ↓ ⟳ | ⊘ | EC-03 | Tiktok | FAI-AOO-Sarah-2020 | The Anatomy of Tiktok |

Items per page 5 ▾   1-5 of 6   |< < > >|

Data Collection for Feminist AI Projects

These are 4 datasets at the Poieto that you have access to

Filter the datasets

| actions | Icon | Name | community | authors | project ↑ |
|---|---|---|---|---|---|
| + ↑ ↓ ⟳ | ⊘ | CN-01 | CN | FAI-Astha-2018 | Contextual Normalcy |
| + ↑ ↓ ⟳ | ⊘ | VD-01 | Voice-Design | FAI-2016/2017 | Thoughtful Voice Design |
| + ↑ ↓ ⟳ | ⊘ | IP-05 | Protest | FAI-2016/2017 | Intelligent Protest |
| + ↑ ↓ ⟳ | ⊘ | LML-01 | Local-ML | FAI-LocalML-2019 | Community Based ML |

Items per page 5 ▾   1-4 of 4   |< < > >|

2720

---

Add New Data   ✕

What is beauty, add text, images, or both

Name : FS-04
Authors : FAI-AOO-Sara-2020
Community Name : Fem-S
Project Name : Concepts of Beauty

Provide Information

What is beauty?

Provide photo

Can we follow up with an email about this data?

☐ Yes- I'd like for you to reach out with more questions ( Add New Data )

TOOL FOR DESIGNING ARTIFICIAL INTELLIGENCE SYSTEMS

CROSS-REFERENCE TO RELATED APPLICATIONS

This application is a continuation-in-part application of U.S. patent application Ser. No. 16/382,016, entitled "Tool for Designing Artificial Intelligent Systems," filed Apr. 11, 2019, which claims priority under 35 U.S.C. § 119 to U.S. Provisional Application No. 62/656,278, entitled, "Artificial Intelligent Design Tool," filed Apr. 11, 2018, the contents of which are incorporated herein by reference.

FIELD

The present invention is directed to artificial intelligence design tools.

BACKGROUND

The following description includes information that may be useful in understanding the present invention. It is not an admission that any of the information provided herein is prior art or relevant to the presently claimed invention, or that any publication specifically or implicitly referenced is prior art.

Conventional artificial intelligence (AI) systems often suffer from severe biases in how the systems are constructed. The systems are trained on datasets, and the datasets can have inherent limitations in the data provided. For example, conventional face recognition software protocols might be trained on primarily Caucasian faces and have trouble recognizing other races. In another example, conventional voice recognition systems (often seen in smart assistants) were predominantly trained with primarily male voices. These limitations of the datasets training the AI systems correspond to the creation of systems that cannot adequately 'scale' to a wide audience. Even if a user wanted to create a system which was exposed to a wider range of training data, conventional users typically lack the ability and resources to identify and use appropriate training data. Therefore, conventional AI systems become brittle when encountering more complicated, real world situations with unexpected circumstances. This is a detriment to the usage of an AI system as humans can adapt to these unexpected circumstances, but conventional AI systems struggle greatly with input that deviates from the standard input. These limitations of conventional datasets primarily go unidentified because AI systems are deployed without discussion of the data training the AI system.

Conventional AI systems also suffer from model biases, as the models typically incorporate tools and assessments from existing western diagnostics, systems, and frameworks in computer/machine vision, vocal intonation, and natural language processing. In a specific example, products that incorporate emotions detection draw largely on existing western mental health diagnostics, which have their own assumptions. These models for emotion detection favor a very specific perspective; additionally, these models often focus on "taking" emotional information from a user without their consent. No conventional methods exist for an AI system designer to broaden the models used or to restrict user data uploaded.

Therefore, a conventional AI system suffers from unnoticed algorithmic injustices related to the algorithms that are used to analyze the input data and the data used to train the algorithm.

SUMMARY

The various examples of the present disclosure are directed towards artificial intelligence methods for receiving and analyzing data. In a first embodiment of the present disclosure, a method provides for receiving input, at an interface on a computing device. The input includes a dataset, an analysis for the dataset, and an output medium. The method then provides for selecting, based on the received input, at least one algorithm from a plurality of algorithms. The method then provides for processing, via the computing device, the received input with the at least one algorithm to yield an output. The output is provided at the interface on the computing device.

In some examples, selecting at least one algorithm includes determining whether the received input corresponds to requirements associated with each algorithm in the plurality of algorithms. The method then provides for selecting algorithms of the plurality of algorithms, based on determining that the received input corresponds to requirements associated with the selected algorithms.

In some examples, the input includes a format for the output, a supplementary dataset, a type of the dataset, and/or input consideration variables.

In some examples, the at least one algorithm includes an artificial intelligence model. The artificial intelligence model can be selected from a plurality of artificial intelligence approaches, including: an artificial narrow intelligence approach, a non-symbolic artificial intelligence approach, a symbolic artificial intelligence approach, a hybrid symbolic and non-symbolic artificial intelligence approach, and a statistical artificial intelligence approach.

In some examples, the at least one algorithm includes a machine learning model. The machine learning model can be selected from a plurality of machine learning models, including: a decision tree, a Bayesian network, an artificial neural network, a support vector machine, a convolutional neural networks, and a capsule network. In some examples, the machine learning model was trained on the received input. In some examples, the machine learning model was trained, via the computing device, on a subset of a database of artificial intelligence systems. The subset can include artificial intelligence systems with datasets comprising metadata corresponding to metadata of the received dataset and/or the output medium.

In some examples, the output includes an indication of whether the at least one algorithm successfully processed the received input.

In some examples, the method includes additional steps. The additional steps can provide for determining, via the computing device, whether the output comprises at least one bias in a plurality of biases. For example, the present disclosure searches for an unwanted bias (a bias unwanted by the user). Based on determining that the output comprises the at least one bias, the method provides for identifying a portion of the received input which corresponds to the determined bias. The method then provides for displaying the identified portion of the received input at the interface on the computing device.

In some examples, the method provides for removing the identified portion (which includes the at least one bias) from the received input to yield updated input. The method then provides for retrieving, via the computing device, supplementary input data in a database of artificial intelligence systems. The supplementary input data corresponds to the identified portion of the received input and does not comprise the at least one bias. The method then provides for displaying the supplementary input data at the interface on the computing device.

In some examples, the method additionally provides for receiving a request, via the interface on the computing device, to process a second selection of input data. The second selection of input data includes the received input with the supplementary input data in place of the identified portion. The method then provides for processing, via the computing device, the second selection of input data with the at least one algorithm. This yields a second output. The method provides for displaying the second output at the interface on the computing device.

In some examples, the second-output can be a revision of the first output.

In some examples, identifying the portion of the received input corresponding to the determined bias includes processing metadata associated with each of the received input. The metadata can include AI tagging, or identification of biases in the plurality of biases corresponding to each of the received input.

In a second embodiment of the present disclosure, a method provides for receiving input, at an interface on a computing device. The input includes a dataset, an analysis for the dataset, an output medium, and/or a processed output. The processed output includes an artificial intelligence system based on the dataset, the analysis for the dataset, and the output medium. The method provides for determining, via the computing device, whether metadata associated with the received input comprises at least one bias in a plurality of biases. The method then provides for identifying a portion of the received input corresponding to the at least one bias. The method then provides for displaying, at the interface on the computing device, the identified portion and the at least one bias.

In some examples, the method provides for retrieving, via the computing device, supplementary input data from a database of artificial intelligence systems. The supplementary input data corresponds to the identified portion of the received input and does not comprise the at least one bias. The method then provides for displaying the supplementary input data at the interface on the computing device.

In some examples, the method provides for receiving a request, via the interface for the computing device, to process a second selection of input data. The second selection of input data includes the received input with the supplementary input data in place of the identified portion. The method then provides for processing, via the computing device, the second selection of input data to yield an output. The method then provides for displaying the output at the interface on the computing device.

A third embodiment of the present disclosure provides for a non-transitory computer-readable medium. The non-transitory computer-readable medium includes embedded computer-readable code. The code, when loaded on a computing device, causes the computing device to perform a series of steps. The steps include receiving input, at an interface on the computing device. The input includes a dataset, an analysis for the dataset, and/or an output medium. The steps then provide for selecting, based on the received input, at least one algorithm from a plurality of algorithms. The steps then provide for processing, via the computing device, the received input with the at least one algorithm to yield an output. The steps then provide for displaying the output at the interface on the computing device.

In some examples, the steps provide for determining, via the computing device, whether the output comprises at least one bias in a plurality of biases. The steps then provide for identifying a portion of the received input corresponding to the determined bias, based on determining that the output comprises at least one bias. The steps then provide for displaying the identified portion of the received input at the interface on the computing device.

In some examples, the steps provide for removing the identified portion from the received input to yield updated input. The steps then provide for retrieving, via the computing device, supplementary input data in a database of artificial intelligence systems. The supplementary input data corresponds to the identified portion of the received input and does not comprise the at least one bias. The steps then provide for displaying the supplementary input data at the interface on the computing device.

In some examples, the steps provide for receiving a request, via the interface on the computing device, to process a second selection of input data. The second selection of input data includes the received input with the supplementary input data in place of the identified portion. The steps then provide for processing, via the computing device, the second selection of input data with the at least one algorithm to yield a second output. The second output is displayed at the interface on the computing device.

In some examples, identifying the portion of the received input corresponding to the determined bias further includes processing metadata associated with each of the received input. The metadata includes identification of biases in the plurality of biases corresponding to each of the received input.

The present disclosure refers to various machine learning or artificial intelligence algorithms or models. Any machine learning or artificial intelligence algorithm, as known in the art, can be used to perform various steps of the present disclosure, as would be readily apparent to one skilled in the art.

In some examples, the at least one algorithm (discussed above) is created from a learning algorithm. The present disclosure uses "algorithms" and "models" interchangeably. The disclosed tool allows users to define the type of artificial intelligence or artificial life they are designing within. Conventionally, users only design with artificial narrow intelligence and artificial life, but the present disclosure provide examples of artificial narrow intelligence and artificial super intelligence to reference additional approaches to AI. The AI tool also includes symbolic, non-symbolic and statistical systems.

The present disclosure refers to various systems and medium. Any system and/or output medium can be used by the disclosed AI tool, as would be readily contemplated by one skilled in the art.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The accompanying drawings exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIGS. 2A-2G demonstrate exemplary input selections for an AI interface, according to various embodiments of the present disclosure.

FIG. 3 shows an exemplary methodology for identifying a bias in a created AI system, according to an embodiment of the present disclosure.

FIG. 4 shows an exemplary methodology for identifying a bias in an externally created AI system, according to an embodiment of the present disclosure.

FIG. 8 shows an exemplary comparison of how AI data specific to one medium is used in a variety of mediums, according to an embodiment of the present disclosure.

FIGS. 9A-9C show exemplary input selections in an AI interface, according to an embodiment of the present disclosure.

FIG. 16 illustrates an exemplary user interface of a section where users can select whether to remake (transform), create (encode), deconstruct (decode) or contribute to a social technology project, according to an embodiment of the present disclosure.

FIG. 17 illustrates an exemplary user interface where the project creator is asked if they will enter as an individual or as a group, according to an embodiment of the present disclosure.

FIG. 18 illustrates an exemplary user interface illustrating a discover section of the tool, according to an embodiment of the present disclosure.

FIG. 19 is an exemplary user interface section of the tool where the user or group identifies the intended audience of the project, according to an embodiment of the present disclosure.

FIGS. 21A-H illustrate exemplary user interfaces relating to the blueprint section, according to embodiments of the present disclosure.

FIGS. 23A and 23B illustrate an example of the scaffolding section of the tool, according to embodiments of the present disclosure.

FIGS. 24A-F are exemplary user interfaces relating to the data implementation section of the tool, according to embodiments of the present disclosure.

FIGS. 26A-E illustrate alternative variations of the audit section of the tool, according to embodiments of the present disclosure.

FIGS. 27A-D are exemplary user interfaces that illustrate a project page with data collection sections, frame collection sections and voting sections, according to embodiments of the present disclosure.

DETAILED DESCRIPTION

Figure 1:
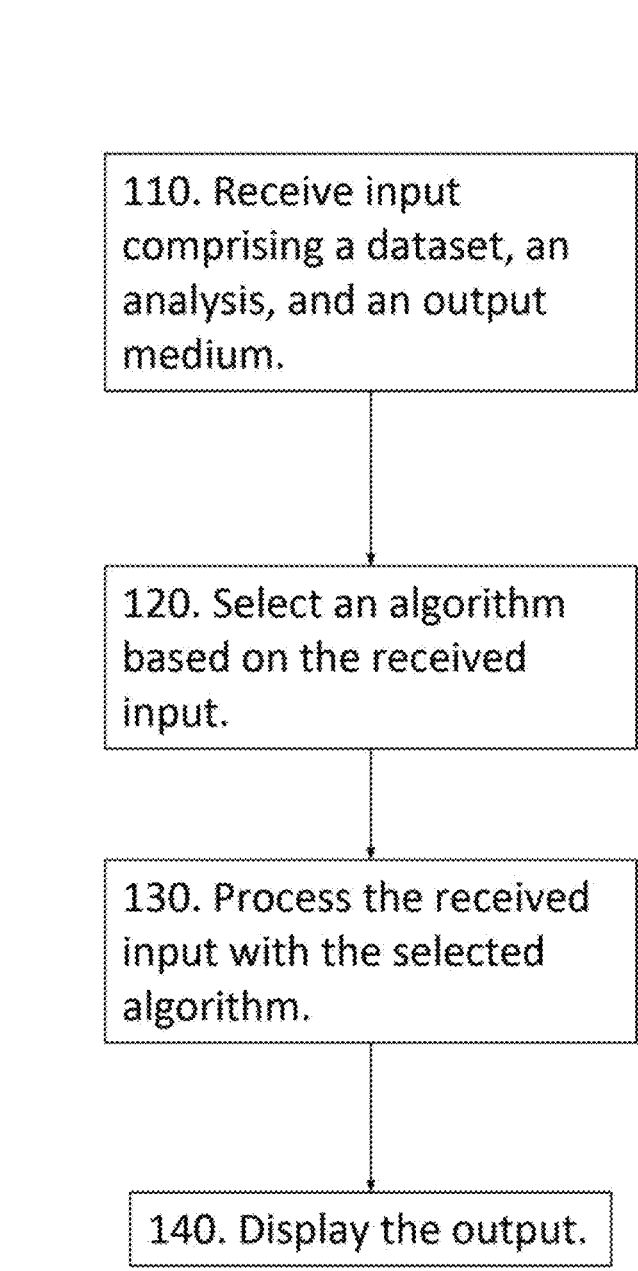
FIG. 1 shows an exemplary methodology for creating an AI system, according to an embodiment of the present disclosure.

Various examples of the invention will now be described. The following description provides specific details for a thorough understanding and enabling description of these examples. One skilled in the relevant art will understand, however, that the invention may be practiced without many of these details. Likewise, one skilled in the relevant art will also understand that the invention can include many other obvious features not described in detail herein. Additionally, some well-known structures or functions may not be shown or described in detail below, so as to avoid unnecessarily obscuring the relevant description.

The terminology used below is to be interpreted in its broadest reasonable manner, even though it is being used in conjunction with a detailed description of certain specific examples of the invention. Indeed, certain terms may even be emphasized below; however, any terminology intended to be interpreted in any restricted manner will be overtly and specifically defined as such in this Detailed Description section.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations may be depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Overview

AI systems, interfaces and experiences are becoming a foundational part of the re-search, design and development of products and experiences. The technical requirements of AI thinking can be challenging for those without programming experience. Therefore, the present disclosure provides an AI design tool for individuals to understand and engage in, not only the user experience of AI, but design for the systems and culture of AI. Additionally, this tool will use a deep learning architecture to find relationships from user-uploaded data.

The disclosed design tool provides a place for AI design thinking and creation that helps design teams, researchers, and developers start to make a space for inclusive AI design thinking. Accordingly, one embodiment of the present disclosure provides for an electronic tool for standardizing the AI design process; this tool helps users understand the different types and technical inputs for designing AI (algorithms, systems, agents, projects, experiences) and stresses the importance of culture and assumptions embedded in the design process.

This AI Design Tool helps designers, researchers, and developers build AI systems from technical and conceptual perspectives. The exemplary AI design tool provides for at least three modes, including (1) a design/prototyping mode, (2) a cultural probe mode, and (3) a playful exploration mode. The design/prototyping mode provides a technically accurate design, while still incorporating prompts for culture, bias and transparency. Some examples of the design/ prototyping mode provide for localization and varying levels of connectivity, according to user preferences. The cultural probe mode looks at the cultural and social considerations/ biases in AI systems that were already created (either by the AI design tool or by another, external system). The cultural probe mode therefore helps researchers identify bias in an existing system, remove unwanted or potential bias, and design further AI systems for transparency and opportunities for localization. The playful exploration mode allows users to build a new AI system that is primarily for learning purposes and does not need to include technically-perfect constructs.

Therefore, the disclosed AI design tool provides a variety of benefits to overcome the limitations of conventional AI systems. For example, the disclosed AI design tool can be used by users to learn about AI systems generally. In another example, the tool can identify and correct problematic assumption implicit in conventional AI products. In another example, the tool can provide ease of access to construct new AI systems without the biases of conventional systems.

Exemplary Methodologies and Systems

FIG. 1 shows a methodology 100 for creating an AI system using the disclosed AI design tool. The disclosed AI tool (in any embodiment of the present disclosure) can be an artificial intelligence tool or a computing device configured to perform artificial intelligence.

Methodology 100 begins at step 110 by receiving input. The input can be received at an interface for an artificial intelligence tool on a computing device (as discussed further with respect to FIG. 7). The input includes a dataset, an analysis for the dataset, and an output medium. In some examples, the input can include additional selections from a user related to the type of analysis, additional datasets, and acceptable output mediums (as discussed further with respect to FIGS. 2A-2H). In some examples, the input further includes a format for the output, a supplementary dataset, a type of the dataset, metadata corresponding to the dataset, and input consideration variables.

In some examples of step 110, a user "tags" the input dataset as including certain biases. For example, the user identifies the input dataset as being trained on only men, or only people of a particular race/ethnicity. In another example, the user identifies the analysis to be used on the database as created by only creators located in the Western Hemisphere.

In some examples of step 110, the tool prompts a user to choose whether to disclose or not disclose the uploaded data.

In some examples of step 110, the received input includes APIs, real time sensor information, existing data sets, or creating a new dataset.

At step 120, methodology 100 provides for selecting an algorithm and/or model based on the received input. In some examples, more than one algorithm can be selected. The algorithm can be selected from a plurality of algorithms stored at the artificial intelligence tool.

The methodology 100 can provide for any artificial intelligence approach, including an artificial narrow intelligence approach, an artificial general intelligence approach, an artificial intelligence super approach, a non-symbolic artificial intelligence approach, a symbolic artificial intelligence approach, a hybrid symbolic and non-symbolic artificial intelligence approach, a statistical artificial intelligence approach, and/or any other AI approach as known in the art.

For example, the machine learning model, as discussed further below, including any of: a decision tree, a Bayesian network, an artificial neural network, a support vector machine, a convolutional neural networks, and a capsule network.

In some examples, an algorithm provided by a selected machine learning model was trained on the received input. In some examples, the artificial intelligence tool comprises a database of pre-existing AI systems and datasets. The selected machine learning model was trained on a subset of these pre-existing AI systems and datasets, and can have been trained only on AI systems and datasets which have metadata corresponding to metadata of the input dataset and the output medium.

In some examples of step 120, the artificial intelligence tool determines whether the received input corresponds to requirements associated with each algorithm in the plurality of algorithms. For example, if the user wishes to build an AI system with a binary classifier as the output medium, the artificial intelligence tool will select a machine learning algorithm with a binary classifier. The artificial intelligence tool can verify that the dataset can be classified as a binary output.

Some examples of step 120 further include pre-processing the data. For example, the artificial intelligence tool identifies variables in the input dataset; these variables can correspond to variables that will be used by the selected algorithm.

In some examples of step 120, the algorithm is selected by an artificial intelligence process, as would be readily contemplated by one skilled in the art.

At step 130, methodology 100 provides for processing the received input with the selected algorithm. This yields an output. The output can be an AI system which is displayable on the output medium and is trained by the input dataset. In some examples of step 130, methodology 100 additionally provides an indication of whether the selected algorithm successfully processed the received input.

At step 140, methodology 140 provides for displaying the output. For example, the output can be displayed in the output medium. The output can be an AI system. The output medium can be any of the output formats discussed below with respect to screen 200F of FIG. 2F or screen 900C of FIG. 9C.

In some examples of step 140, the output is provided, and not displayed. For example, the system can provide for haptic feedback, tactile output, and/or auditory output. Any other sensory output or XR output can also be provided for by the AI tool. In some examples of step 140, the output is experience in real life, augmented reality, virtual reality, or any other emerging reality.

FIGS. 2A-2H demonstrate exemplary input selections for an AI interface, according to various embodiments of the present disclosure.

FIG. 2A shows an interface selection screen 201 and screen 202. Screen 201 prompts a user to select between an artificial narrow intelligence 271, an artificial general intelligence 272, an artificial super intelligence 273, a dynamical systems/embodied and embedded cognition 274, a software (e.g., cellular automata) 275, a hardware 276 (e.g., robots), and a wetware 277 (e.g., synthetic biology). If a user chooses artificial narrow intelligence 271, they are prompted to go to screen 202. In screen 202, a user can be prompted to select a symbolic, a non-symbolic, or a statistical AI. The selection options of FIG. 2A enable a user to tailor the AI system that the disclosed artificial intelligence tool will build according to design needs of the user.

Figure 2B:
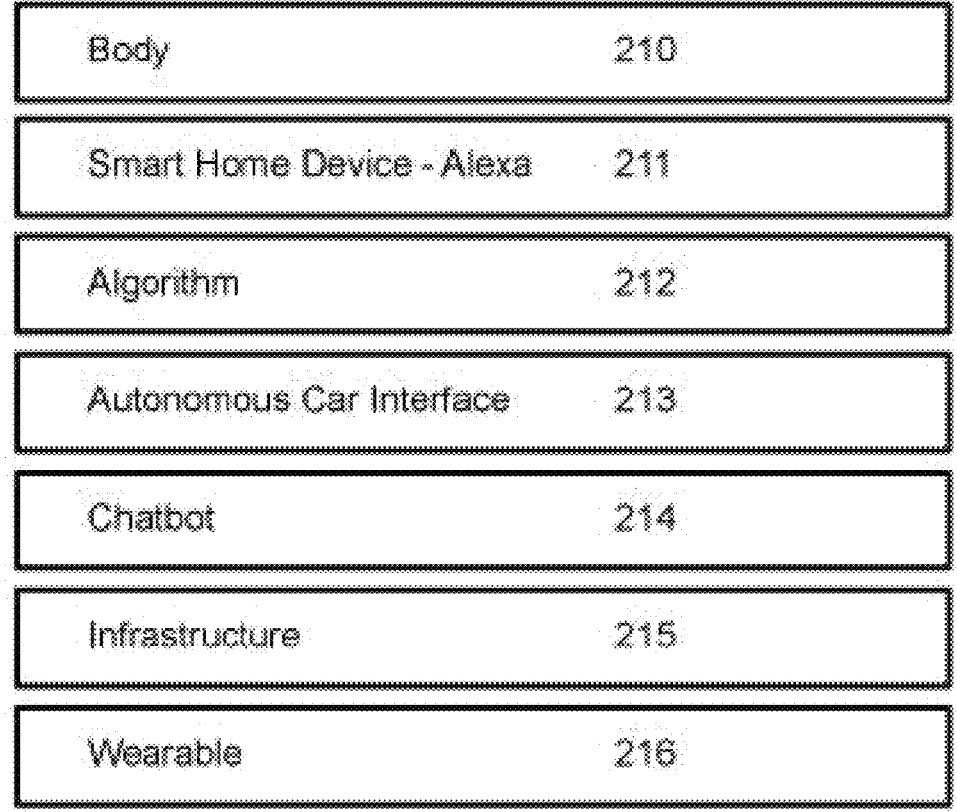

FIG. 2B shows an interface selection screen 200B which prompts the user to select an existing application, algorithm or hardware device. For example, a user chooses one of: a body 210, a smart home device (e.g., Alexa) 211, an algorithm 212, an autonomous car interface 212, a chatbot 214, an infrastructure 215, and a wearable 216. Therefore, the disclosed AI design tool provides an interface to integrate with, and modify, existing AI materials. Although a select number of existing AI materials are shown in screen 200B, the present disclosure contemplates any existing AI material, as known in the art, can be included on an exemplary screen 200B.

Figures 2C, 2D:
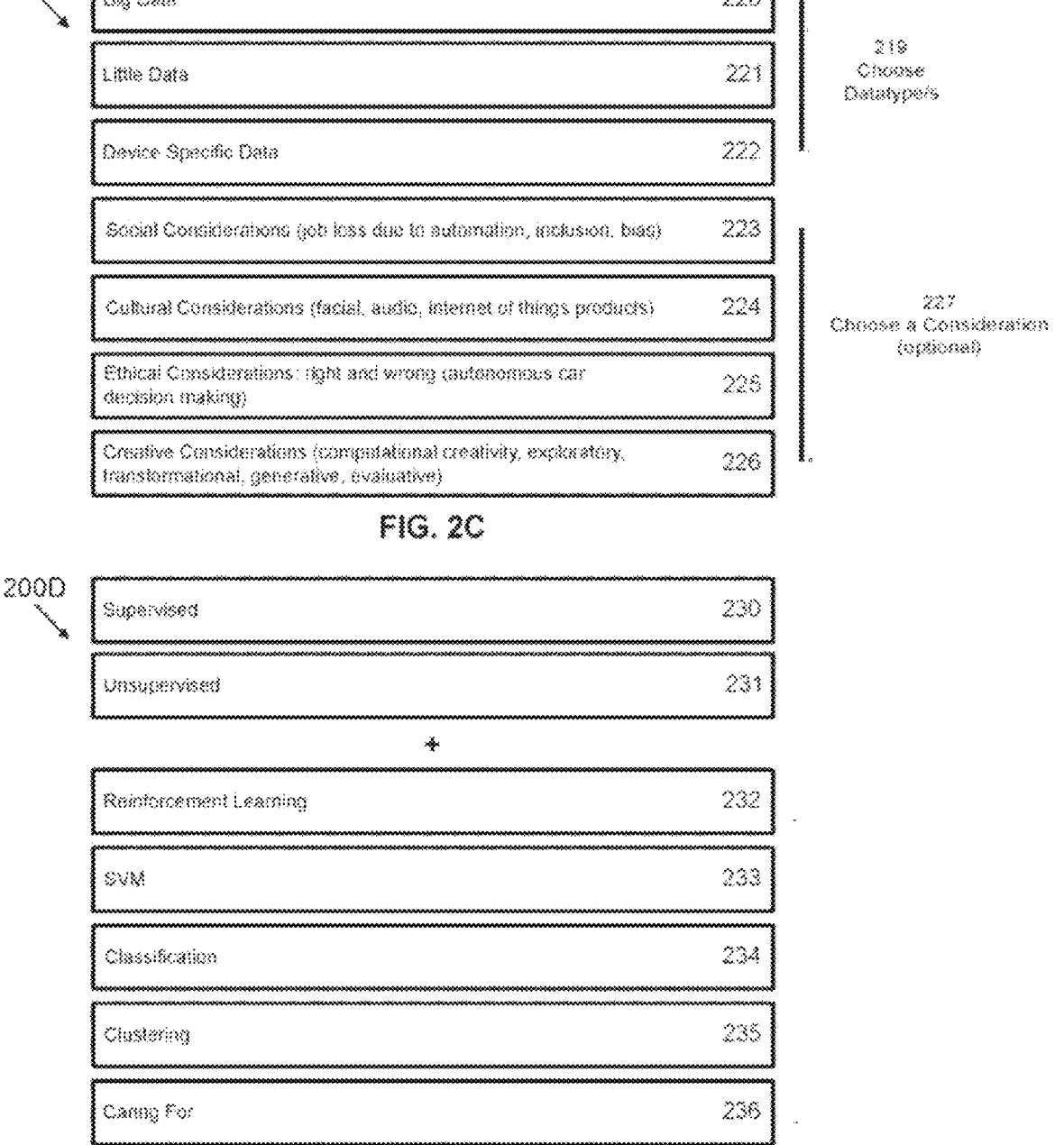

FIG. 2C shows an interface selection screen 200C which prompts the user to select an input. For example, the input can be a dataset 219 (e.g., big data 220, little data 221, or device specific data 222) and a consideration 227 (e.g., a social consideration 223, a cultural consideration 224, an ethical consideration 225, or a creative consideration 226). Social considerations 223 include, for example, job loss probability of an industry due to automation of a task, inclusion of a particular societal group or demographic, and bias towards or against a particular societal group or demographic. Cultural considerations 224 include, for example, facial/expression data, audio data, and internet of things products. Cultural considerations further include determining how emotion and feelings vary across cultures (or how various social preferences are location and cultural specific). Ethical considerations 225 include any determinations that must be made on a right or wrong (e.g., binary) basis. For example, ethical considerations 225 should be used for designing an AI system that produces autonomous car decision making. Creative considerations 226 include the user's desire for computational creativity, exploratory learning of AI development, a user's intention to transform particular data, a generational criterion, or an evaluative criterion.

Therefore, selection screen 200C provides a variety of datatype and potential considerations to choose from when a user is building an AI system. Upon receiving datatype(s) and a consideration, the artificial intelligence tool can eventually evaluate whether the final, created AI system achieves the selected consideration 227.

FIG. 2D shows an interface selection screen 200D which prompts the user to select a type of learning algorithm. For example, learning algorithm can be a supervised algorithm 230 or an unsupervised algorithm 231. The user makes a second selection, including reinforcement learning 232, a support vector machine 233, a classifier 234, a clustering technique 235, and a caring-for algorithm 236.

An exemplary caring-for algorithm 236 provides automated plant watering (e.g., ensuring that the plant had the correct nutrients in the soil, was watered routinely and with the right amount.) Additional caring-for algorithms 236 can be provided for personnel or other system tasks.

FIG. 2E shows an interface selection screen 200E which prompts a user to select an intent for the AI system. For example, the intent can be a physical intent 241, a social intent 242, an emotional intent 243, a creative intent 244, an ethical intent 245, a cultural intent 246, or a personal assistant intent 247.

A physical intent 241 corresponds to an AI system which is configured to provide some physical response to a user. For example, a physical response can include haptic feedback such as a jarring vibration and an emoji visual.

A social intent 242 corresponds to an AI system which is configured to facilitate political or socio-political activism. For example, an exemplary AI system with a social intent can facilitate participation in political rallies.

An emotional intent 243 can correspond to an AI system which is responsive to a user's emotions. Emotional intent 243 can be problematic if a user does not know who designed the emotions database and model, and from which cultural perspective; additionally, a user can prefer to opt in or consent to the utilization of an emotionally responsive AI. For example, an exemplary AI system with an emotional intent 243 provides sounds according to a user's mood, light changes according to a user's mood, and scent generation based on a user's mood.

A creative intent 244 corresponds to an AI system which does not need to correspond directly to algorithm accuracy, and can be used for user learning.

An ethical intent 24 corresponds to an AI system which must take into account ethical considerations.

A cultural intent 246 corresponds to an AI system which must take into account cultural norms of different societal groups.

A smart assistant intent 247 corresponds to an AI system which is configured to provide assistant to a user. For example, an AI system with a smart assistant intent 247 assists a user with travel arrangements (e.g. booking flights, seeing the weaver, booking a cab).

FIG. 2F shows an interface selection screen 200F with exemplary output formats. For example, the output formats can include printed language 250, synthetic speech 251, physical object manipulation 252, a device change 253, AI tagging 254, a report summary 255, and exportable code output or data production 256.

Interface selection screen 200F prompts a selection of a specific material/form for the construct AI system. Printed language 250 can include modifying language, or producing culturally/socially specific language. Synthetic speech 251 can include when users communicate or the system communicates (e.g. a synthetic speech system). In some examples, synthetic speech 251 modifies how language is personalized to users, in a transparent way. For example, a user can opt in to choosing specific type of speech. or producing culturally/socially specific language. Physical object manipulation 252 can include manipulating objects in the real or virtual worlds. Device change 253 can include pitch changing software. AI tagging 254 can include tagging input data, output data, or a model. Exportable code output or data production 256 can include an existing product that the user may export or link out to alternative databases or models.

Figure 2G:

FIG. 2G shows an interface selection screen 200G with exemplary behaviors. For example, interface selection screen 200G corresponds to a sociocultural design tool. Exemplary behaviors include, for example, physical behaviors 260, social behaviors 261, and emotional behaviors 262. A physical behavior 260 corresponds to an AI system which is configured to provide physical feedback to a user. The physical behavior 260 of the AI system can include, for example, physical touch, talking, movement of devices controlled by the AI system, and smiling emojis. A social behavior 261 corresponds to an AI system which is configured to provide social feedback to a user. The social behavior 261 of the AI system can include, for example, mirroring a user's behavior, identifying particular aspects of a user's behavior, or subverting particular actions of a user. An emotional behavior 262 corresponds to an AI system which is configured to provide emotional feedback to a user. The emotional behavior 262 of the AI system can include, for example, identifying that a user is internalizing certain feelings, that a user is externalizing certain feelings, and that a user is acting defiant.

In some examples of the disclosed AI design tool, a user can make more than one selections on any of screens 200A-200G. Although particular options are shown in each of screens 200A-200G, the present disclosure contemplates each of the screens 200A-200G can include any selections as known in the art.

In other examples of FIGS. 2A-2G, an exemplary interface screen provides a text box. A user can enter text related to a prompt; the disclosed tool can analyze the text with any algorithm discussed herein to provide additional learning for the disclosed tool or additional data for any aspect of the disclosed tool.

In other examples of the disclosed AI design tool, the artificial intelligence tool prompts the user for particular selections based on the user's previous input. For example, if the user makes selections in accordance with building an interface for Alexa, the artificial intelligence tool prompts the user to choose social considerations 223 on FIG. 2C and emotional intent on FIG. 2E.

In some examples, the artificial intelligence tool collects usage data of user selections on screens 200A-200G over a plurality of usage instances. The artificial intelligence tool learns patterns of the user according to the user selections (learning, for example, via a machine learning model as discussed further below). The artificial intelligence tool thereby identifies inherent biases of the user according to the user selections. The artificial intelligence tool can then prompt the user on the various screens 200A-200G.

FIG. 3 shows an exemplary methodology 300 for identifying a bias in a created AI system. For example, the created AI system can be the output displayed at step 140 of FIG. 1. Methodology 300 begins at step 310 by receiving an output.

At step 320, methodology 300 provides for determining whether the output has a bias. For example, the artificial intelligence tool can search for any bias in a plurality of biases (e.g., social biases, cultural biases, gender biases, racial biases, and interaction biases created through usage over time). In some examples of step 320, the artificial intelligence tool retrieves metadata or tagging of the input dataset to determine whether there are inherent limitations of the input dataset (e.g., was the dataset trained on only people of a particular race, gender, world-view, geography, or any other limitation as known in the art).

In some examples of step 320, the methodology 300 searches only for an unwanted bias. For example, the user can select biases that the artificial intelligence tool should identify. In other examples, the methodology 300 provides for suggesting what bias is likely, even if no bias is identified.

If a bias is not identified at step 320, methodology 300 can provide for displaying, at step 340, that no bias was identified.

If a bias is identified at step 320, methodology 300 proceeds to step 330 and identifies a portions of the received input corresponding to the bias. In some examples of step 330, the artificial intelligence tool can provide for processing metadata associated with each of the received input. The metadata can include identification of biases corresponding to each of the received input. Step 330 can identify the portion of the input dataset which has the bias identified at step 320.

At step 340, methodology 300 provides for displaying the identified portion and the bias. For example, the identified portion and the bias can be displayed at an interface display at a user's computing device.

FIG. 4 shows an exemplary methodology 400 for identifying a bias in an externally created AI system. Methodology 400 receives an artificial intelligence system as the input dataset at 410. Step 410 can additionally, or alternatively, receive a dataset, an analysis for the dataset, an output medium, an algorithm/model, and a processed output. The processed output can be an artificial intelligence system based on the dataset, the analysis for the dataset, and the output medium.

At step 420, methodology 400 provides for determining, via the disclosed artificial intelligence tool, whether metadata associated with the received input from step 410 has a bias.

Methodology 400 provides similar bias identification and display (steps 430 and 44) as steps 330 and 340 of methodology 300 of FIG. 3. Therefore, methodology 400 provides a method for analyzing existing artificial intelligence systems and identifying whether the existing system contains hidden limitations or biases. The disclosed AI tool provides for deconstructing problematic approaches to the design and development of conventional AI systems, while designing for new knowledge systems.

Figure 5:
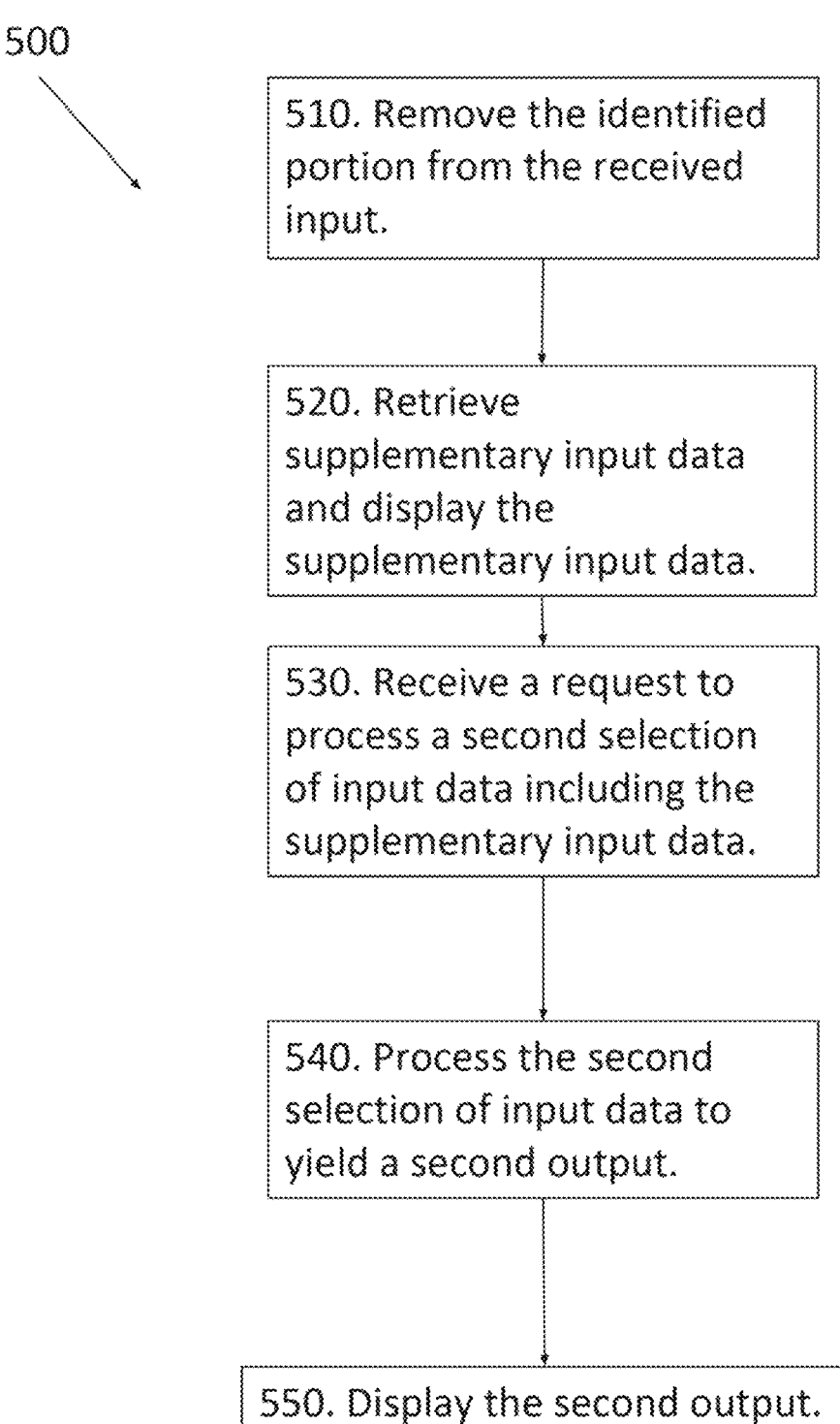
FIG. 5 shows an exemplary methodology for removing a bias in a created AI system, according to an embodiment of the present disclosure.

FIG. 5 shows an exemplary methodology 500 for removing an unwanted bias in a created AI system. Methodology 500 begins at step 510 with removing an identified portion from a received input. For example, the disclosed tool can provide for removing a portion of the data from the received input corresponding to an unwanted bias. The identified portion can be identified according to steps 330 and 430 of FIGS. 3 and 4, respectively.

Methodology 500 then proceeds to step 520 which provides for retrieving supplementary input data. The supplementary input data can be any of the input data discussed above with respect to step 110 of FIG. 1. In some examples of step 520, the disclosed tool can retrieve supplementary input data from a database of AI systems. The supplementary input data corresponds to the identified portion of the received input and does not include the selected bias.

In an example of steps 510 and 520, the disclosed tool identifies that a facial recognition AI system comprises a dataset of Caucasian faces with little other racial diversity. Therefore, the disclosed tool retrieves a dataset of faces comprising a greater amount of racial diversity. In another example, the disclosed tool retrieves an AI facial recognition system, which was trained on a dataset of faces with greater levels of racial diversity than the original AI facial recognition system.

Methodology 500 then proceeds to step 530 which provides for receiving a request to process a second selection of input data including the supplementary input data (retrieved at step 520). For example, the user can select the supplementary input data at a user interface (for example, the interface screens as discussed with respect to FIGS. 2A-2G).

Methodology 500 can then proceed to process the second selection of input data to yield a second output (step 540) and display the second output (step 550). Steps 540 and 550 of methodology 500 can correspond to steps 130 and 140 of methodology 100, as discussed above with respect to FIG. 1.

Therefore, FIG. 5 shows an exemplary methodology 500 which provides for minimizing biases in created AI systems.

In an exemplary implementation according to the disclosed methodologies, the disclosed design tool identifies that an artificial intelligence voice recognition system was trained by white male voices (and no other types of voices). Such an artificial intelligence voice recognition system might prioritize enunciation, choose a loud voice over a soft voice, etc. The disclosed design tool can identify and provide these biases to a user. In some examples, the disclosed design tool can suggest adjustments to the artificial intelligence voice recognition system; for example, adjusting the data set to include women, or artificially decreasing the volume and modifying the enunciation.

In another exemplary implementation according to the disclosed methodology, a user can use a neural network to analyze a dataset via the disclosed AI tool. The user then switches to a classification algorithm. The tool can provide for displaying the output from the neural network compared against the output from the classification algorithm. In some examples, the tool can identify the changes and determine which algorithm provided a more accurate output.

Figure 7:
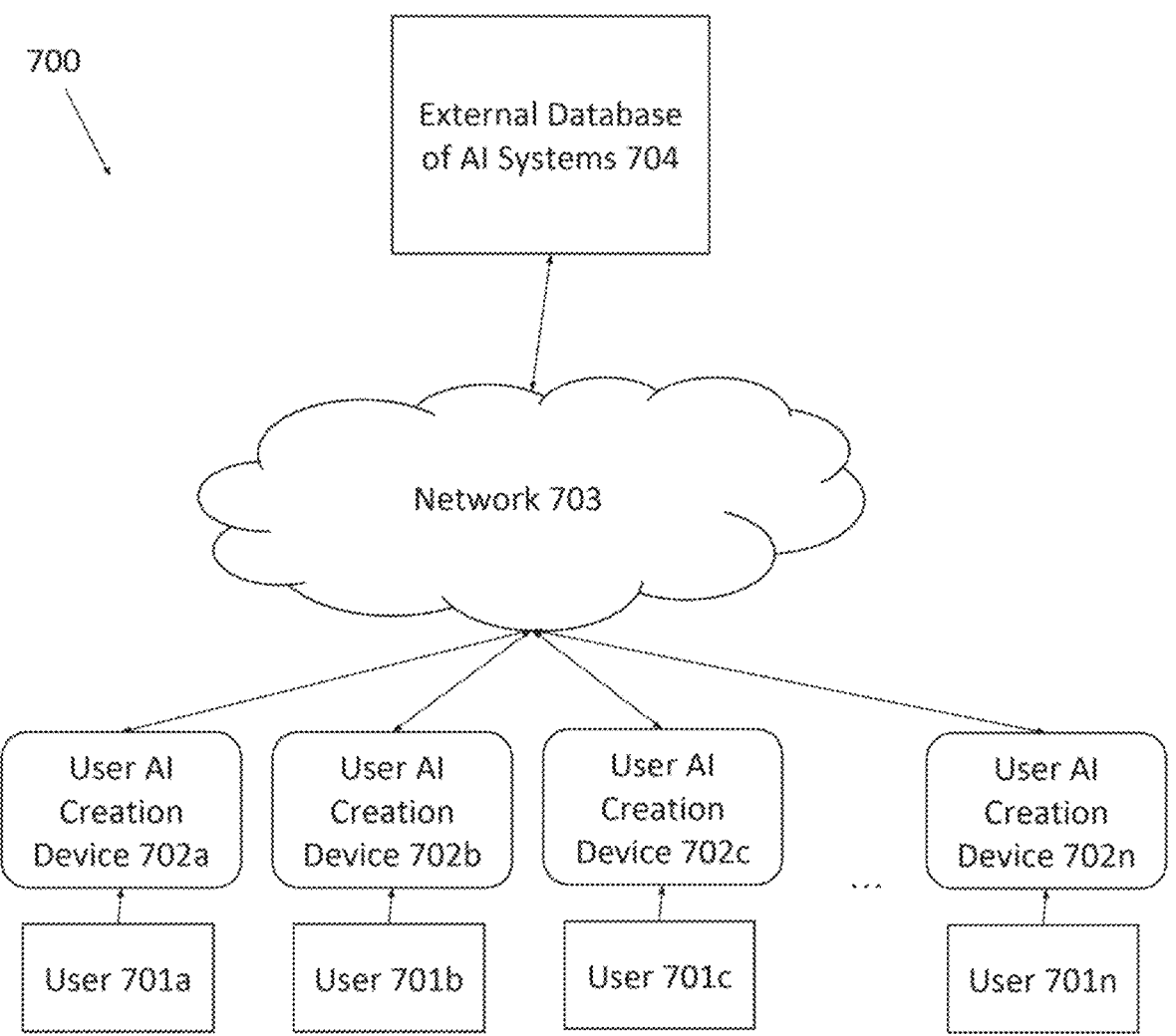
FIG. 7 shows an exemplary system for building and/or evaluating an AI system, according to an embodiment of the present disclosure.

Referring now to FIG. 7, the present disclosure provides a system 700. System 700 includes a plurality of users 701a, 701b, 701c . . . 701n; a plurality of user AI creation devices 702a, 702b, 702c . . . 701n; a network 703; and an external database 704. The plurality of users 701a, 701b, 701c . . . 701n each have an associated user AI creation devices 702a, 702b, 702c . . . 701n. The user AI creation devices 702a, 702b, 702c . . . 701n can include a software application running the disclosed AI tool, according to any of the embodiments discussed herein. In some examples, as shown in FIG. 7, the users 701a, 701b, 701c . . . 701n are connected to a network 703. By the network 703, the external computing device can facilitate information exchange between the plurality of user AI creation devices 702a, 702b, 702c . . . 701n and the users 701a, 701b, 701c . . . 701n. For example, when user 701a uploads a new database, any other of the users 701b, 701c . . . 701n can access the database via the network 703. In some examples, the database is uploaded to the external computing device 704.

In other examples of FIG. 7 (not shown), the users 701a, 701b, 701c . . . 701n can choose for their associated user AI creation devices 702a, 702b, 702c . . . 701n to be disconnected from the network 703.

In other examples of FIG. 7, the users 701a, 701b, 701c . . . 701n selectively choose which information/data is shared by their associated user AI creation devices 702a, 702b, 702c . . . 701n with the network 703.

Referring now to FIG. 9, additional interface screens are shown for an exemplary embodiment of the disclosed AI tool. For example, in screen 900A, the disclosed AI tool prompts the user to select profile info 902; smart home and/or internet of things product inputs 904; emotions analysis 906; little data 908; touch 910; and mapping data 912. In screen 900B, the disclosed AI tool prompts the user to select an analysis algorithm, including any of a swarm theory 914, a sorting algorithm 916, a neural network 918, a searching algorithm 920, a watching algorithm 922, and a linear regression analysis 924. In screen 900C, the disclosed AI tool prompts the user to select an output. The output can include any system or medium that the user intends to interact with the product provided by the AI tool. For example, screen 900C shows an autonomous car 926, a surveillance camera 928, an art generation product 930, an ocean product 932, an algorithm 934, a music generator 936, a digital profile or wearable device 938, a plant growth model 940, a fraud detection product 942, a chatbot or robot 944, a quilting design product 946, and an artificial intelligence healthcare product 948.

Figure 9C:

Although exemplary selections are shown in FIGS. 9A-9C, the present disclosure contemplates any selections (including multiple selections) can be provided to a user, as known in the art. For example, although particular algorithms are shown on screen 900B, any machine learning or artificial intelligence algorithm, as known in the art, can be used in the various embodiments of the present disclosure. In another example, although particular systems and medium are shown in screen 900C, the present disclosure contemplates that any system and/or output medium can be used by the disclosed AI tool, according to the various embodiments of the present disclosure.

Implementations

The disclosed AI tool can be an in-browser generator and/or a software application, which can be used in Virtual Reality, XR, Augmented Reality and/or real life. The present disclosure also contemplates that the disclosed AI tool can be operated in any form as known in the art. In other examples, it could be any computer program running on any computing device.

Exemplary Designer Mode

Figure 6A:
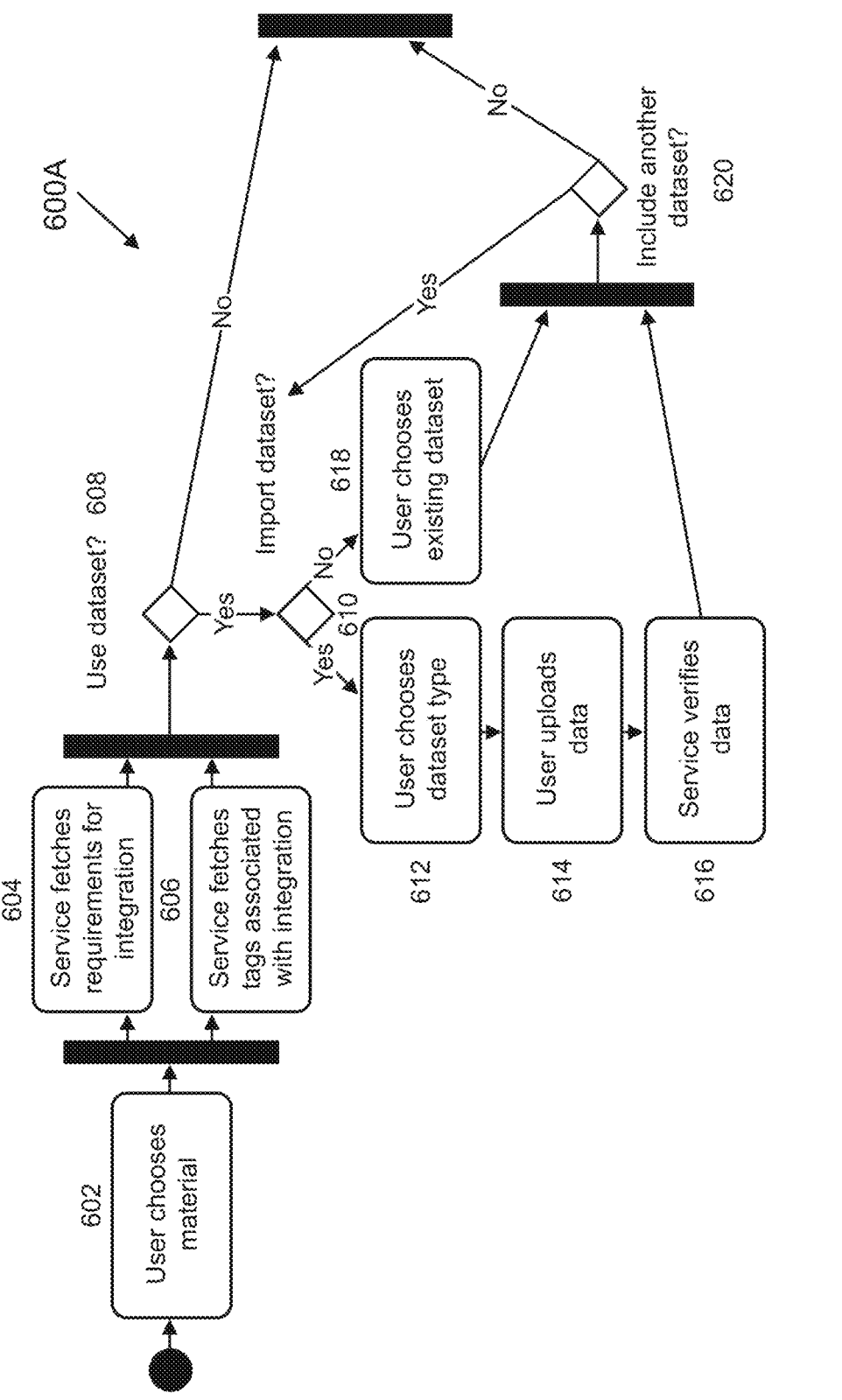
FIGS. 6A-6B show an exemplary methodology for a user to build an AI system, according to an embodiment of the present disclosure.
Figure 6B:
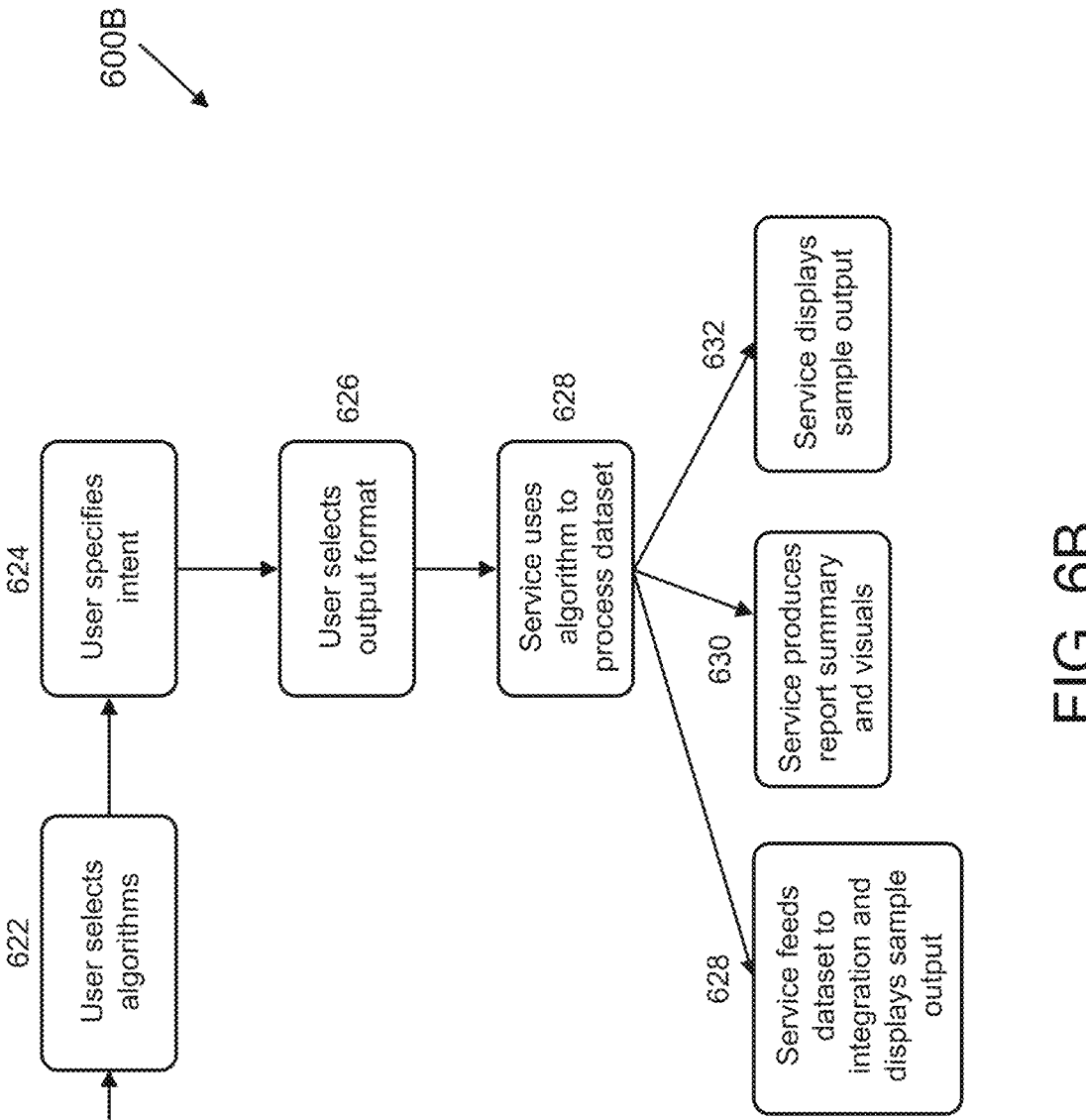

FIGS. 6A-6B show an exemplary methodology 600 for a user to build an AI system, according to another embodiment of the present disclosure. Methodology 600 can be the designer/prototyper mode. In an exemplary methodology 600, a user starts with a pre-determined AI design question or approach. For example, a user can intend to create transparency regarding the utilization of emotions analysis in voice interfaces. As discussed below, methodology 600 uses deep learning, the design question, any keywords and/or input data (whether user created or uploaded from an existing dataset) to (1) identify patterns, and (2) make comparisons with both labeled and unlabeled data in order to create new labels, relationships, models and/or context.

At step 602, the user identifies the material. Materials take both physical and digital forms in the design. The hardware of a product may lend itself to the utilization of specific data/models/algorithms intended for that specific product. For example, digital material includes a software application, a hardware device, or any other product utilizing Artificial Intelligence. In some examples, the materials comprise the form of the system; with more embodied AI devices, the materials and form themselves affect how the disclosed AI tool produces output. In some examples, the materials can produce the form.

In some examples of step 602, the user makes decisions regarding how and what will be designed. For example, if the user wants to design for a product like Amazon's cloud-based voice service, Alexa, only specific design choices will be available based on that product.

Once the material is chosen at step 602, the design tool (or service) fetches the requirements for the integration at step 604. In some examples, at step 606, the design tool can also retrieve any tagging information related to the material (or product) chosen in step 602.

At step 608, the user is then prompted to include data by one or many of these options: from existing data sets (step 618), user created data sets step (612). In other examples (not shown) the user can select real time data from a sensor or data from an API. The input can also include any AI tagging (or metadata) provided by any other product.

At step 612, the user creates a specific data type and then uploads the data type at step 614, having it verified by the service/design tool at step 616. Therefore, the data type conforms to the material chosen in step 602. The user can upload pre-existing data sets that conform to the new data type. Exemplary datasets include, for example:

https://docs.aws.amazon.com/AWSEC2/latest/APIReference/API_Types.html; and
  https://www.ibm.com/support/knowledgecenter/en/SS9PF4_1.1.0.4/src/tpc/mlz_algorithms.html;

In some examples, multiple datasets can be used at step 620.

In some examples of methodology 600 (not shown), the user is then prompted to enter a "consideration input" and/or an intent at step where they can add cultural context, ethics, etc. (any variable that should be considered in the design process). These input considerations will be output at the end, and can also be used to highlight information throughout the design that might be relevant to that consideration. There are several benefits to entering the "consideration input", the primary benefit is to build ethics, culture and bias controls into the design. In some examples of methodology 600, the users are reminded to design with and for these input considerations throughout the design process and not only at step.

At step 622, the user is provided with learning algorithms, which are populated by the material. Inputs to the learning algorithms (or models produced by these learning algorithms) can be existing datasets, user uploaded data sets, real-time sensor information, API's, and the design question/key words (or any other input as discussed above with respect to step 110 of FIG. 1). The input can also include any AI tagging (meta data) provided by a specific product (discussed further below). The user can train data locally with open source SDKs and/or scale using cloud services.

At step 624, the user identifies an intent, which reflects the intention of the design.

In some examples (not shown) the tool prompts users to identify a personal culture of the users, and/or a culture that the user is designing for. The tool can analyze and adapt later prompts to the user based on this input.

At step 626, the user identifies the format of the output.

At step 628, the service feeds a dataset to integrate and display in the sample output. There are many possible outputs from this tool. One output, shown at step 628, is a prototype built on an SDK with the data the user suggested (in the form of suggested code, API, AI Tagging and/or written information). Additional outputs (not shown) can include hardware, physical material, or auditory noise.

Another output is auto-generated analysis/visualization (a report summary with visuals), shown at step 630. This report can include technical and social/cultural considerations. In the report, the output can also highlight issues of concern with the AI design process or designed biases in data, models and demographic information about the creators. An exemplary output according to step 630 can provide a recommendation to utilize pitch changing to identify the presence of an algorithm (earcon). The report can include suggestions of pitch changing libraries. Step 630 can further provide for populating the output.

At step 632, the service then displays the sample output.

AI Tagging

In one embodiment of the present disclosure, the tool provides AI tagging (also referred to as meta tagging). AI tagging includes receiving content descriptors of (1) the algorithms/models, (2) input data used in the design of existing AI systems, (3) the demographic information of the humans or machines proposing the AI system, and (4) who created the materials and form of the AI system. The disclosed tool uses the AI tags to increase algorithmic transparency by providing data, algorithm/model information in the design and development process of an AI system. The disclosed tool also provides for tagging created AI systems with the demographics of the creators, content descriptors of the algorithms used, and/or content descriptors of the input data used. Therefore, the disclosed AI tool provides pre-build non-technical considerations AI system design, giving these considerations equal importance to the technical algorithm selection. Output from the disclosed AI tool therefore reduces unwanted bias that exists in conventionally-designed AI systems. The output can be displayed, felt, or heard through various devices (e.g., phones, embedded haptics in clothing, and/or sound produced in location specific ML systems)

Examples of this AI Tagging include:

<AI nativedata="Alexa SDK">

<AI data="gesture data from UCLA: trained on: gender (90% male-identified, 10% decline to state) and race figures (95% Caucasian, 5% Asian)">

<AI algorithm="supervised/SVM">

<AI contextcreation="Design Company team: gender (90% male-identified) and race (75% caucasian and 25% decline to state">

<AI locationcreation="90% San Francisco, CA, United States: 10% Chennai, India">

In some embodiments, AI tagging is incorporated at the beginning of the AI design process (e.g. before step 110 of FIG. 1, or before steps 310 and 410 of FIGS. 3 and 4, respectively), when the user imports information from a specific product and/or dataset. In other embodiments, AI tagging is output from the design tool.

In some examples, the disclosed AI tool receives AI tagging data from a user in his home, at a worksite, through a user's mobile device, through a scanner, through an RFID chip embedded in a computing device. In some examples, the user can access the AI tags through any of these devices, or while viewing a system in augmented realities. In other examples, a user receives a text message identifying the bias. Any other method for uploading an AI tag or displaying AI tagging can be used as well, as contemplated by one skilled in the art.

Form/Material/Medium Alternatives

Different media types afford the utilization of specific types of algorithms or AI development frameworks.

AI Design Tool Across Environments

Data collection has tremendous implications on user privacy and significantly effects conventional AI designs regarding culture and transparency. User privacy concerns change how users design, accept, contribute to, and opt into information, data, and models.

The disclosed AI tool provides for collecting data insights from multiple and varied realities in order to expand the reach of an AI system beyond conventional AI systems. This data provides more holistic cultural perspectives on the roles of user bodies, location, thinking about feelings, and user interaction with color; this holistic perspective provided by the disclosed AI tool provides a different cultural perspective for users than conventional AI systems.

In some examples, the disclosed AI tool receives user-rated data (e.g., embodied data sorting) or other reviews of conventionally-designed AI systems. The disclosed tool then identifies patterns in sorting to determine how the salience of objects and media varies across cultures.

The present disclosure provides additional examples of collecting data across realities, including:

Augmented Reality Data Collection—For example, the AI tool collects location-based feeling placement, when users identify where they would like to tag a feeling, by dropping a color-coded feeling in a specific location. Users can leave information in locations that can then be collected and used for a more complicated AI system, which can build across multiple data streams, across multiple realities to focus on more embodied AI experiences.

Virtual Reality Data Collection—Virtual reality data collection can be collected similarly to augmented reality data collection, as would be readily contemplated by one skilled in the art.

XR—"X" can expand across senses; some examples include biometric and other natural physical realities.

FIG. 8 provides a chart 800 showing how different data can be collected across realities. For example, chart 800 shows the datasets: media 802, behavior 804, material 806, reality type 808, and artificial intelligence model 810. An exemplary artificial intelligence model 810 can include one type of media 802, one behavior 804, one material 806, and one reality type 808.

For example, a collection and unsupervised learning artificial intelligence model can use textual media, throwing behavior, a phone as material, and data collected from real life.

For example, a data-sorting artificial intelligence model can receive media input from textual media, audio media, video media, and 3-D object media. The data-sorting artificial intelligence model can use visio-spatial sort behavior, use headset/controller material, and a virtual reality implementation.

For example, an AI system which provides output for an individual experience (i.e., a teaching model) can use 3-D objects in physical space, can cause the items to place and/or receive, can use a phone or tablet, and provide augmented realities.

In another example, an AI system which provides output for a collective experience provides a photon (i.e., electric communication) and a phone/tablet. The AI system is provided in Internet of Things augmented reality.

Contextual Normalcy

In one embodiment of the present disclosure, the AI design tool provides an interactive experience for a group of users around the world (for example, the group of users can be diverse). The AI design tool provides a set of questions to the group of users and receives personal refinement from each user. The set of questions can be directed towards the user's feelings. The questions range from general cultural concepts of feelings (e.g., "How would your community describe 'feeling average'?") to more personal ideas about how the users feel (eg., "How do you know you feel blue or melancholy?"). The AI design tool collects responses over an extended period of time. This information can be sorted or analyzed using various models, including supervised learning or unsupervised learning. For example, the AI design tool groups together keywords from the iterations of questions (much like a flocking algorithmic script).

From these groupings of culturally specific questions, the AI design tool (1) predicts which questions a particular user will be comfortable answering, according to the groupings; and (2) prompt a user to consent to any of a plurality of public disclosures of the user's data AFTER the user has honestly answered the question. Therefore, unlike conventional data collection systems which first require a user to opt-in to disclosure before the user has provided any information, the disclosed design tool provides a platform for users to first disclose their information and then decide what they are interested in sharing. Therefore, the disclosed design tool ensures greater accuracy in user responses over conventional systems.

With the grouped questions and the user responses, the disclosed AI tool examines emotional and behavioral patterns to determine future questions and to determine which questions should be provided to which users. Therefore, the disclosed AI tool provides a system for users to engage with feelings and develop their emotional health.

Additionally, the AI design tool reveals the assumptions in the design and development of conventional systems by increasing AI literacy through user workshops reliant on the disclosed tool. Using this tool, conventional approaches to AI development and design can be deconstructed; the tool can create new approaches; and the tool redefines and provides alternatives to existing problematic knowledge systems.

Using questions and data, the disclosed AI tool can identify response patterns to show traits of reported feelings across cultures and different demographics. The speculative, interactive, and design practices of the disclosed AI tool provides alternative embodiments than conventional treatments for mental health diagnosis and treatment.

In some examples of this embodiment, the disclosed AI tool collects and organizes different types of data across different realities or environments. For example, the AI design tool can collect data from crowd sourcing, embodied data sorting in virtual reality, and location-based feeling placement in augmented reality (e.g., the user drops a color-coded feeling in specific locations). The disclosed AI tool can use the data from each reality to provide a different strength for data collection.

User Testing

In some examples, the disclosed AI tool provides an interface for users to see how their responses to a question compare with (1) their previous response and (2) other responses around the world. Some embodiments include keyword search options and visualizations.

Mental Health Embodiment

Therefore, a tool according to the present disclosure develops a AI tool to diagnose depression; the developed tool has a lower bias than conventional diagnostic methods. The disclosed tool provides embodiments focusing on mental health for bots, browsers, digital materials, smart materials, haptics, handwriting, spoken words, and locations.

An exemplary tool according to this embodiment can take as input: (1) crowdsourced data about user feelings, (2) user thoughts about their feelings, (3) location data, (4) varied voluntary demographic information, and (5) clinical research regarding keyword patterns found in existing diagnostic systems and assessments. In some examples, the present tool provides for unwanted bias reduction by examining who designed the data collection, who contributed to the data, who created the models, which models where used, and why.

The exemplary tool provides supervised and unsupervised learning with more data collection. In an exemplary embodiment, the disclosed AI tool selects the algorithm to analyze the data based on the AI's database collection.

The exemplary tool provides a plurality of output options, including (1) visualization, (2) alternative information for inputs, (2) new words, (4) new classifications, (5) new language of emotions, (6) data from a contextual normalcy (according to the contextual normalcy embodiment discussed above, (7) data from an augmented reality distributed emotion application, and (8) intelligent location-based experiences.

Therefore, an embodiment of the present tool provides data primarily focused on individual and collective cultures as well as project-defined communities and teams.

Embodiments of the invention are directed to a collaborative software tool that facilitates new ways to create and shape emerging technologies. In some embodiments, the collaborative software tool places equal weight on both social and technical components of the design process, centers multiple perspectives and community driven design, and is explicitly exploratory (not prescriptive).

Figure 10:
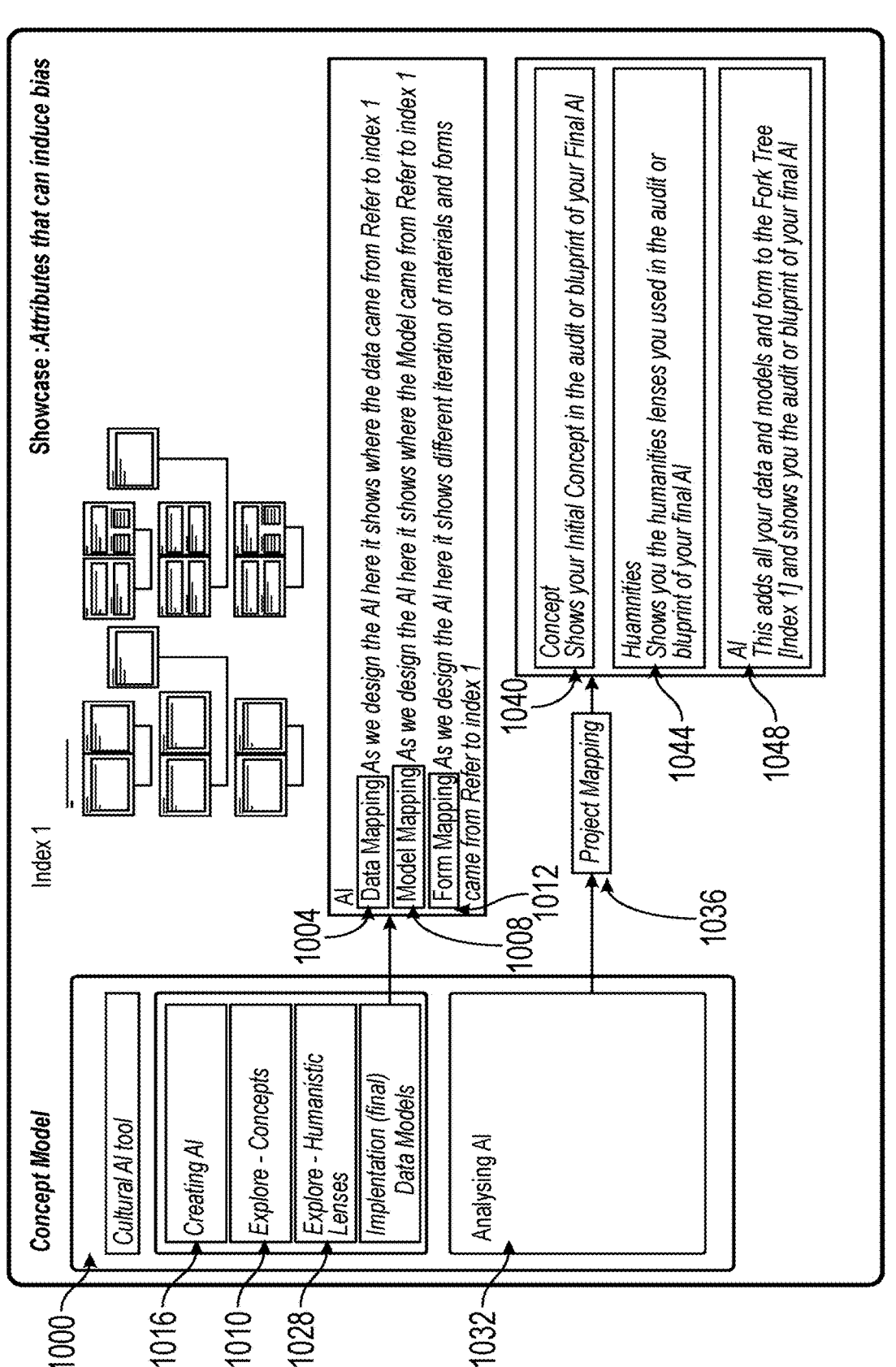
FIG. 10 illustrates a conceptual map of a collaborative software tool, according to an embodiment of the present disclosure.

FIG. 10 illustrates a conceptual map of the collaborative software tool 1000. As shown in FIG. 10, the tool 1000 includes tools for data mapping 1004, model mapping 1008, and form and material mapping 1012. The tool allows for creating AI 1016, exploring concepts 1020, exploring humanistic lenses 1024, and implementation using the final data models 1028. The tool 1000 may also include analyzing AI 1032, which includes project mapping 1036. The project mapping 1036 may include: a concept section 1040, humanities section 1044 and AI section 1048. As shown in FIG. 10, the concept section 1040 shows the initial concept in the blueprint or audit of the AI. The humanities section 1044 shows the humanities lenses used in the blueprint or audit of the AI. The AI section 1048 includes all of the data, models, and form and material and also shows the blueprint or audit of the final AI. The sections are modular and are movable in the tool. Additional details about the tool are disclosed hereinafter.

Figure 11:
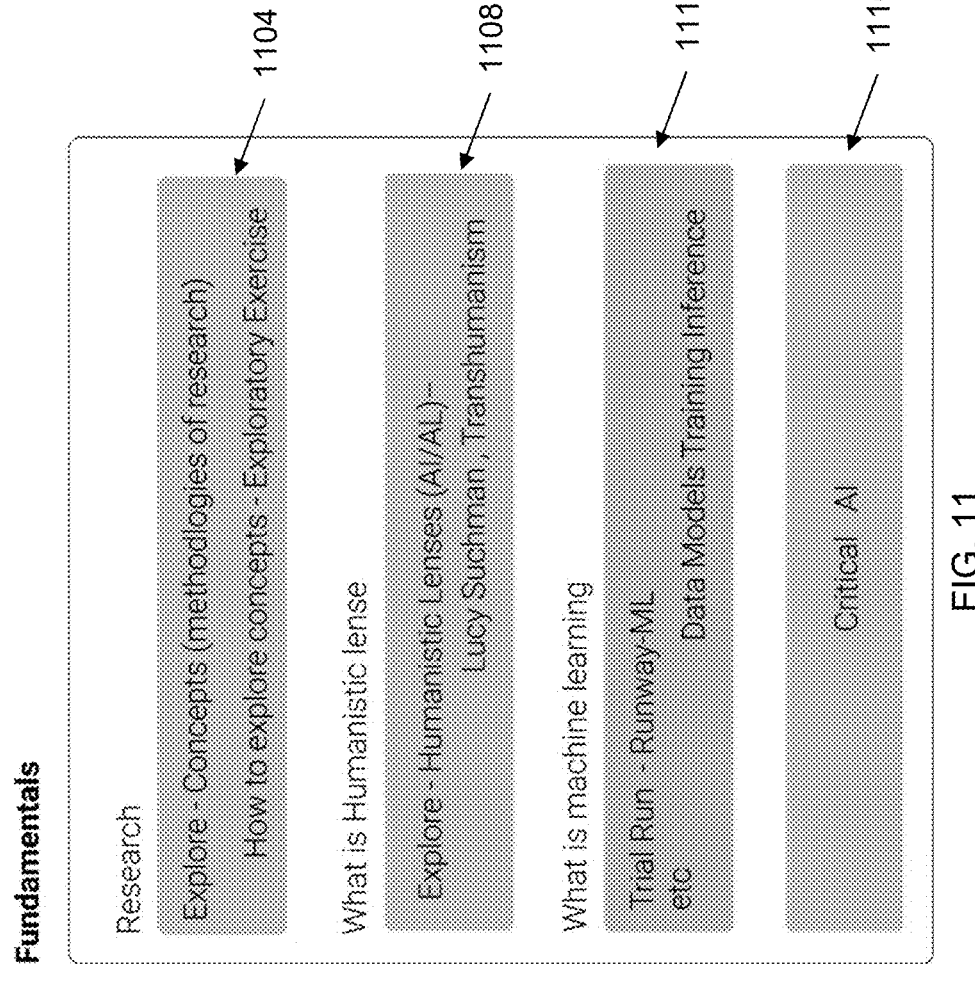
FIG. 11 illustrates fundaments of the collaborative software tool in use, according to an embodiment of the present disclosure.

FIG. 11 illustrates an example of the fundamentals in action with the mapping sections implemented 1100. As shown in FIG. 11, the explore concepts step includes exploring the methodologies of research 1104. The process continues by exploring humanistic lenses 1108. The process continues by using a training model inference 1112. The process continues with Critical AI 1116.

Figure 12:
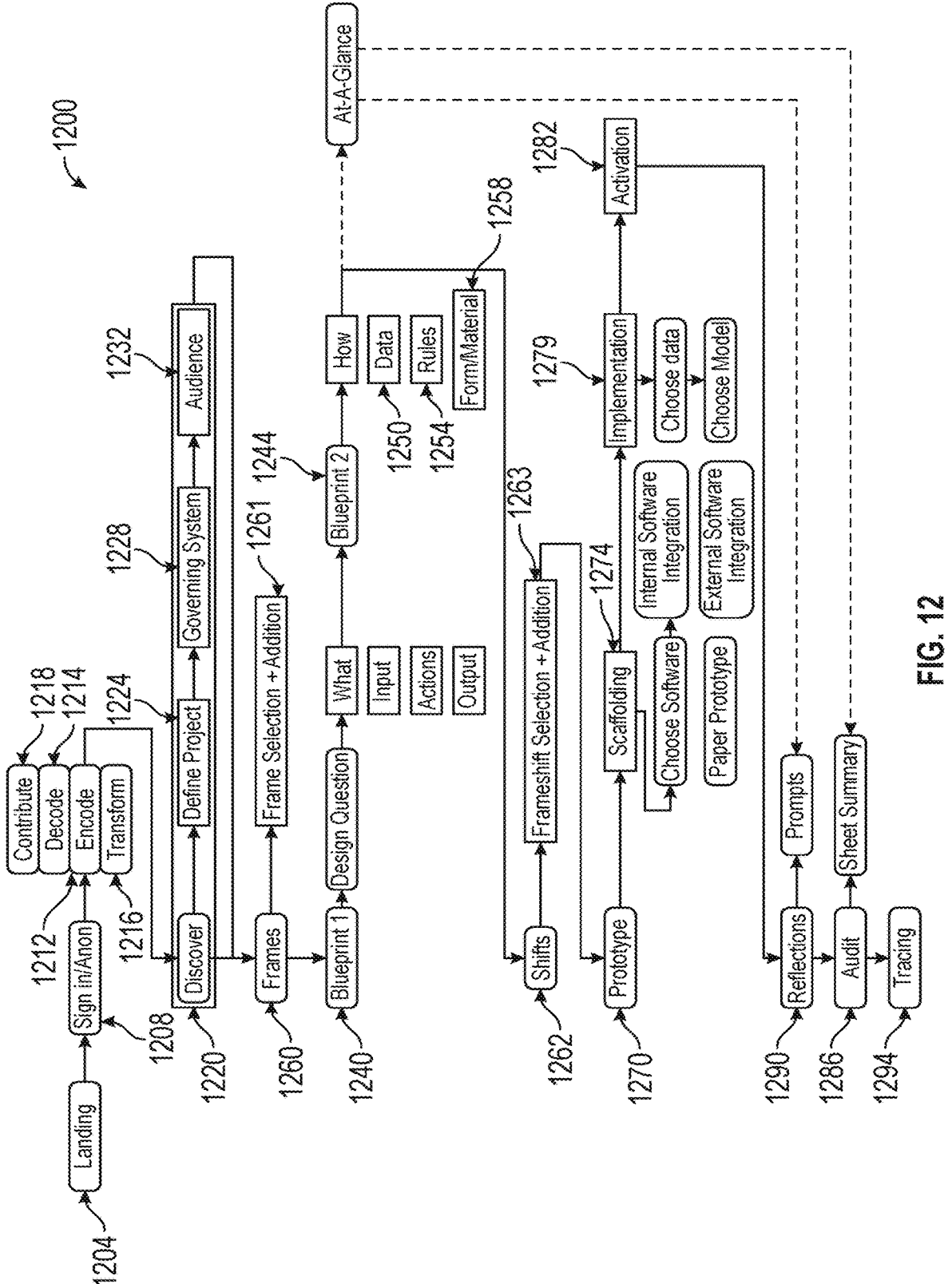
FIG. 12 illustrates a process of designing social technologies using the tool, according to an embodiment of the present disclosure.

FIG. 12 illustrates a process of designing social technologies using the tool and various sections of the tool 1200. It will be appreciated that the sections are modular and that the order of the process is not limited to that shown in FIG. 12. As shown in FIG. 12, a user may access the tool at a landing 1204 where the user is prompted to sign in or access the tool anonymously 1208. The user then selects that they want to encode 1212 to indicate that they are designing social technologies. The designers may also enter into the project by trying to understand an existing project (decode) 1214, transform or modify an existing one (like remixing) 1216, or contribute a perspective, data or model, or any type of insight into an existing project 1218.

In FIG. 12, the tool may begin with a discover process 1220, in which designers are asked to think about the discovery process (e.g., who are they designing with, who are they designing for) and the context (e.g., projects focused on intelligence vs. life). The designers are asked to describe or define the project 1224. The designers are also prompted to identify themselves or, in some cases, may want to be protect and not identify themselves. The community is defined or the individuals on the project may also be identified in this section. The user also decides the "governing system" of the project 1228, including which parts of the project are open to additional outside collaboration. In this section, the users implement the data collection system, where the user decides which data they want attached to the project in various sections. The users decide the duration of the data usage, and the rules for usage, and which pieces of data (or information) will be used. The project may be attached to the tool's database but may also link out to other databases. The user may also prototype what it would be like to use a different database (e.g., relational vs. object oriented, etc.). The designers are also asked to identify who they are creating the project for (i.e., the audience) 1232, such that it can be determined whether there are any potential disconnects between the people creating the tools and the people using or being affected by these tools.

As shown in FIG. 12, the process also includes a blueprint section-blueprint 1 1240 and blueprint 2 1244. It will be appreciated that this may be done earlier or later in the process. Additionally, as will be discussed in further detailed hereinafter, various cards can be locked and commented on or the whole section can be locked or commented on during the blueprint process. Part 1 of blueprint 1240 focuses on what does the project do (e.g., inference) and part 2 of blueprint 1244 focuses on how it works (e.g., training). The blueprint section is interchangeable, and can take on its own form.

As shown in FIG. 12, the tool also includes a data collection section 1250. In the data collection process 1250 the user is asked to critically think about data collection, type of data, who decides what becomes data, and who creates the data question. Here, the user either retrains or identifies or creates "rules" 1254. Rules may include artificial intelligence, life, and knowledge models—which may include" deep learning, machine learning models, algorithms, and community or individually defined rules that may become a model or algorithm. Users are prompted to think about the knowledge system, transfer of knowledge to information, exploration of how information becomes data. In the data collection portion (in the blueprint section), there may be a versioning of the data to track who has changed what data. The user also explores both form and material 1258. A user might want to speak to form only, or material only, or both form and material. In the form/material question, the users can create or use community and individual contributed design patterns and explorations. These patterns and/or behaviors may also incorporate a combination of patterns across realities. For example, one pattern in AR may affect or incorporate information from VR, or IRL. The design or learning output from one reality (VR) may generate or be an input for another reality (AR).

The tool may also include a frames section 1260 and/or a frameshifts sections 1262. The frames section 1260 or frameshifts section 1262 may include frames, lenses, filters, etc. that can be applied to the project holistically or on each section. These frames may represent current thinking about a technology from a specific perspective, or they may offer shifts in the way the technology or parts of the technology are framed or understood. The frames may also encourage designers or contributors to think critically about a technology project. In the frames section 1260, the user may select frames or add frames 1261. Similarly, in the frame selection and addition, a user may select frames or add frames 1263.

The process also includes a prototype section 1270, scaffolding section 1274, implementation section 1279, activation section (also referred to as testing) 1282, and audit section 1286, discussed in further detail hereinafter. The tool may also include a reflections section 1290 and a tracing section 1294. The scaffolding section 1274 includes choosing software 1275 and performing an internal software integration 1276. An external software integration 1277 may also be done. A paper prototype 1278 may also be generated during the scaffolding section. The implementation section 1279 may include choosing data 1280 and choosing a model 1281.

Figure 13:
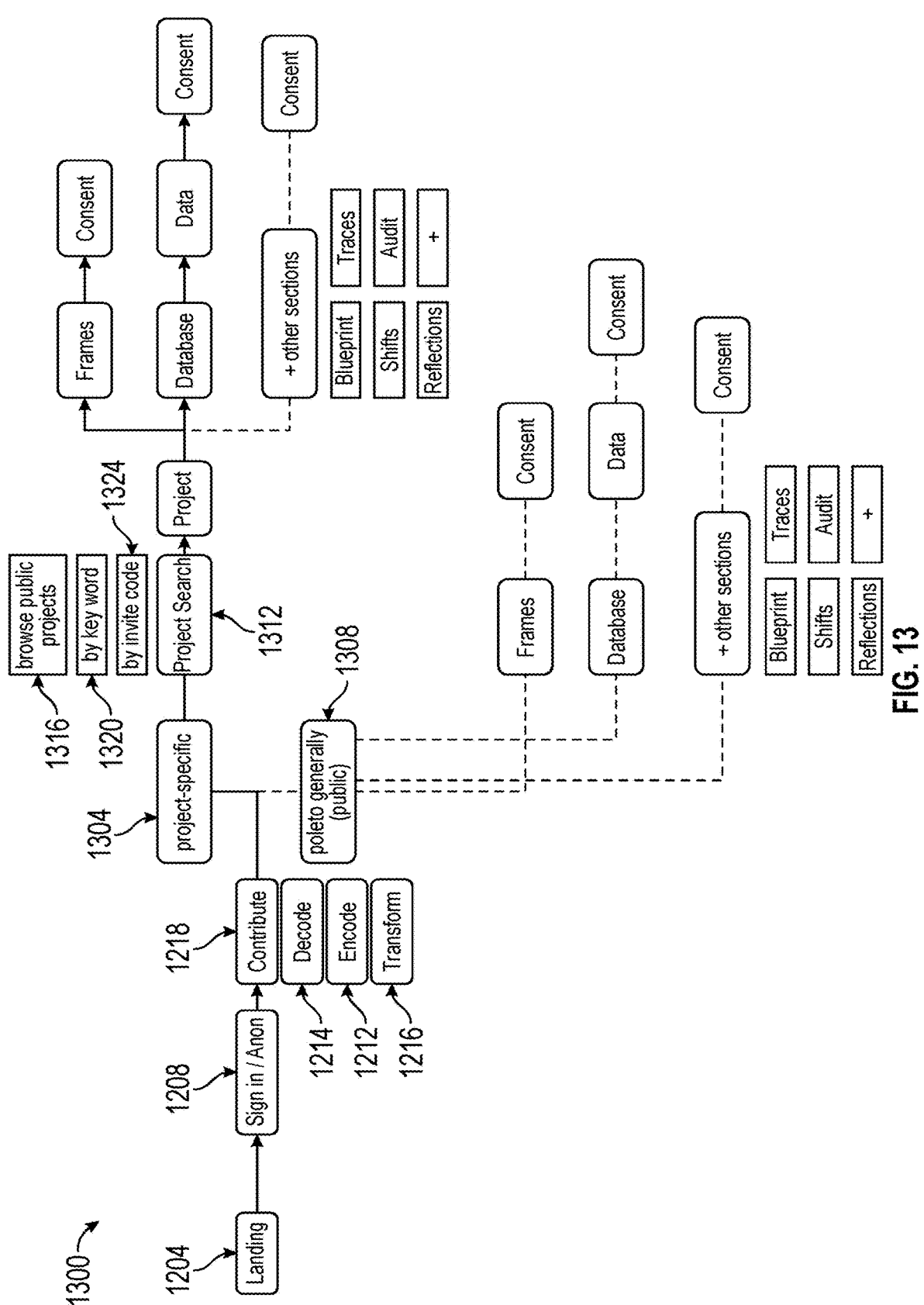
FIG. 13 illustrates a system map, according to an embodiment of the present disclosure.

FIG. 13 illustrates a system map 1300 according to embodiments of the present disclosure. In addition to making a project (through decode, encode, or transform), the tool also provides a path for "donation" or "contribution" to existing projects, or to the tool's public library. These donations can be in the form of data or "frames". This allows those contributing or donating to consent to who or what projects they are donating to. In this example, the creator enters the landing page 1204, signs in 1208, and chooses the contribute option 1218. These donations can be in the form of, for example, data or "frames".

The user may choose to contribute to a project that they have been invited to (that is not publicly available), which may include responding to a product or working on a shared research project 1304. The creator may also or alternatively opt to choose a publicly available project to contribute to 1308.

When the contribution is to a specific project, the user may perform a project search 1312. The project search may be done using, for example, browsing public projects 1316, by key word 1320, or by invite code 1324.

In both iterations, the creator may contribute to data, frames, shifting of frames—or any portion of the tool—such as the consent, blueprint section, audit, etc.

Figure 14:
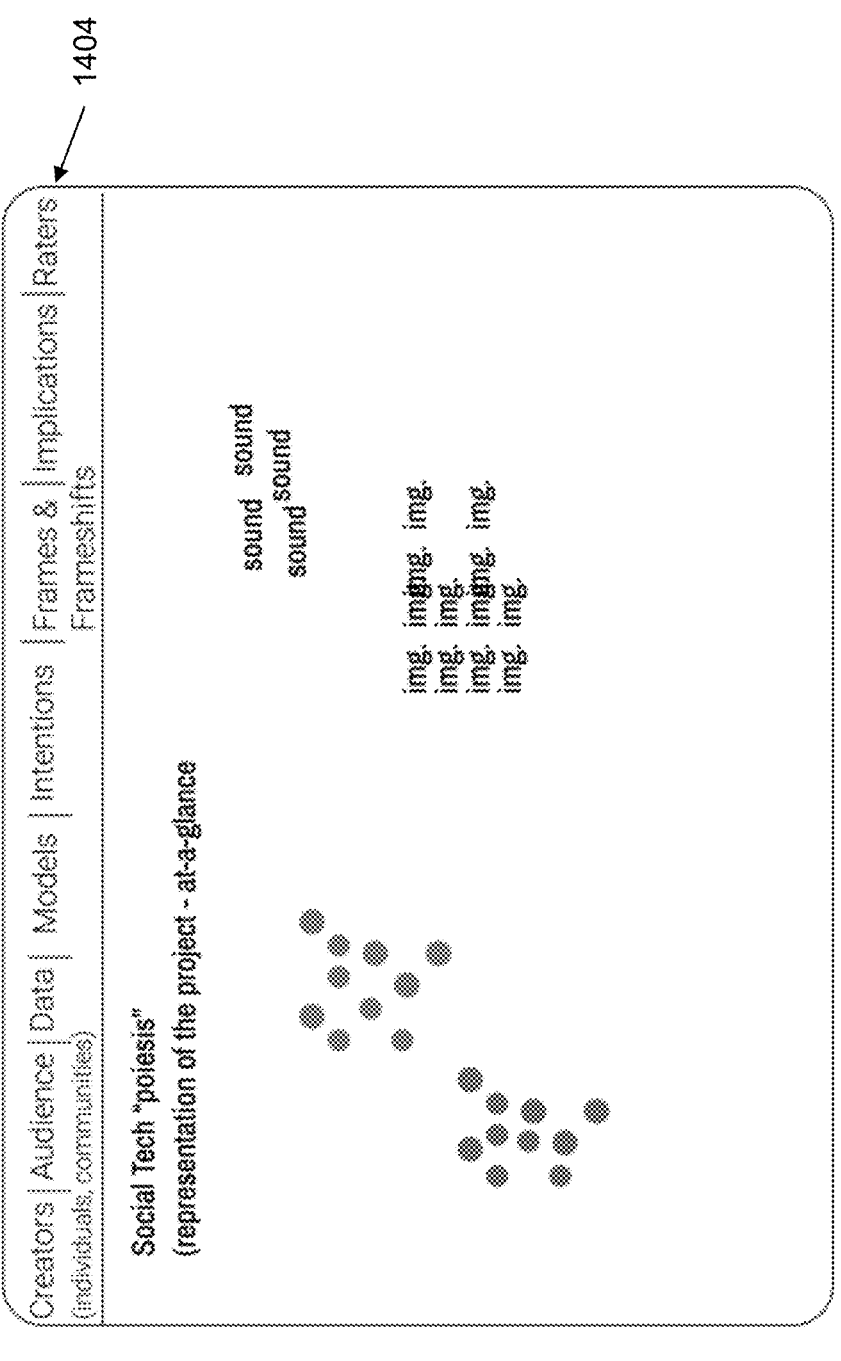
FIG. 14 illustrates an exemplary project representation, according to an embodiment of the present disclosure.

FIG. 14 illustrates an exemplary project representation 1400. In the project representation 1400, a user can add modules/sections to the headers 1404. This is the "at a glance" view of the data, algorithms, software and lenses used in the project. Similar to a QR code, it is a quick read for someone new to the project. A visualization/sound (earcon) of the project summary that shows the project at a glance (visual, sound, etc) poiesis/imprint. This can be realized on paper, a screen, using VR and AR or can be embedded or stored in objects. Users add the headers above based on their project. Additional categories can also be pulled from the methods/landing page.

Figure 15:
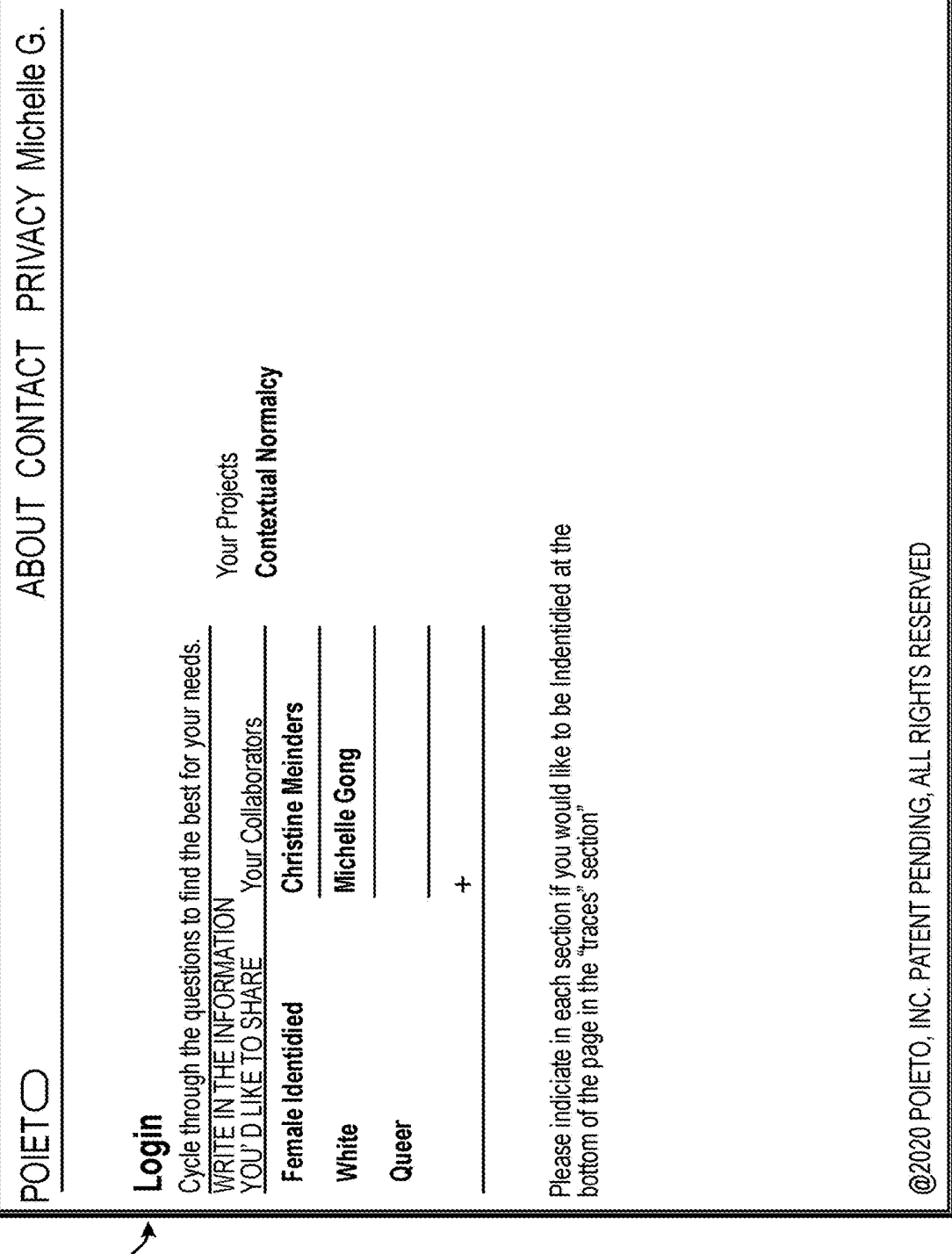
FIG. 15 illustrates an exemplary user interface screen of the login page, according to an embodiment of the present disclosure.

FIG. 15 illustrates an exemplary user interface screen of the login page 1500. As shown in FIG. 15, in the creator section, the user is asked to enter in their own demographic information, and may add their own identifying information. And, they are asked to share this information in each relevant section. Here, they can identify what groups they are a part of or would like to join.

FIG. 16 illustrates an exemplary user interface of a section where users can select whether to remake (transform), create (encode), deconstruct (decode) or contribute to a social technology project 1600. A project can be driven by individuals, nonprofits or self-defined communities. The tool allows for a community to contribute their info and collaborate together. The mechanics of community sourced input is expressed in how a team may collaborate from the very beginning or pull from community sourced data, with community defined leaders and—creating checkpoints specific to each project.

FIG. 17 illustrates an exemplary project setup user interface 1700 where the project creator is asked if they will enter as an individual or as a group. If the user is part of a group, they are further requested to enter the group name. The creator can enter in an existing project name or add an invite code.

FIG. 18 illustrates an exemplary user interface illustrating a discover section of the tool 1800. In the discover section of the tool 1800, the user is prompted with several questions and asked to think about the project (e.g., who is making it and who is it for). In the example shown in FIG. 18, the user is presented with various approaches to AI-via a checkbox or they may write in a response. The user is able to describe their projects, and keywords may be used later for recommendations at certain stages of the projects. The user can write in questions/considerations, find more questions, and/or upvote existing questions. Similar to other sections of the tool, they may upvote or downvote specific questions.

FIG. 19 is an exemplary user interface section 1900 of the tool where the user or group identifies the intended audience of the project. This helps people recognize if the project is being designed for the user or group that they are or are not a part of. Additionally, the designers can upvote/downvote questions, write in questions, and/or find questions that fit with the project.

FIGS. 20A-20M illustrates exemplary screen shots relating to the frames section of the tool 2000. The social and community created frames 2004 help prototype through possible design futures. These frames may be used to describe existing approaches to technology, or may offer a "frame" shift-new approach to creating a tech project. Examples of frames 2004 include privacy, bias, time, level of connectivity and the like. The frames 2004 may directly affect a project if it requires changes in data or models, as discussed in further detail with respect to the data/model mapping section).

Figure 20A:
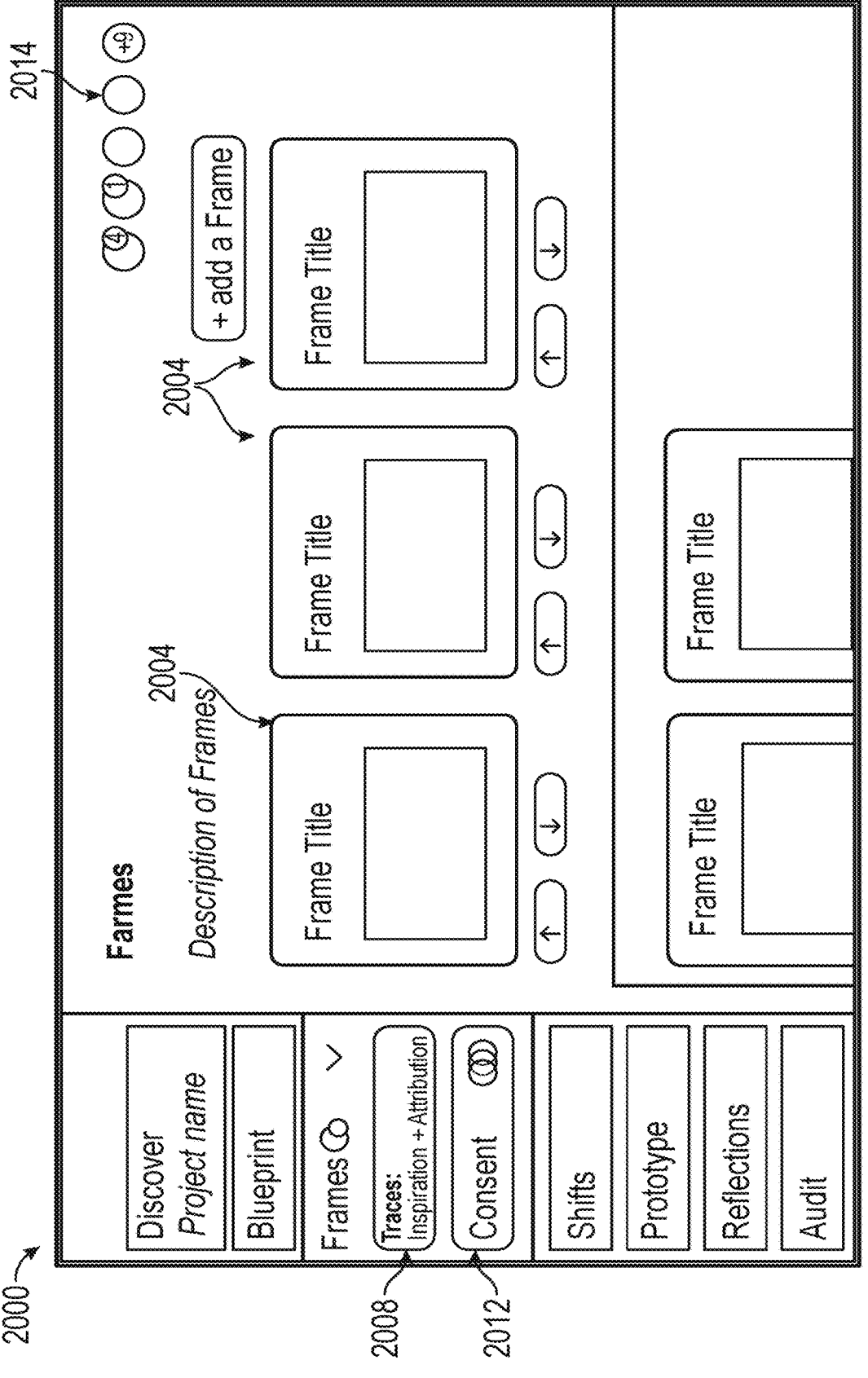
FIG. 20A illustrates an exemplary screen shot relating to the frames section of the tool showing aspects of frames, traces and consent, according to an embodiment of the present disclosure.

FIG. 20A illustrates an exemplary screen shot relating to the frames section of the tool 2000. Within the frames section shown in FIG. 20A and throughout the entire duration of the tool (the discover section, blueprint, shifts, prototype, reflections, audit—and any additional sections) illustrates a drop down section for traces 2008 (tracing the attributions and inspiration of those directly contributed to the portion of the project being created (showing what they did). The consent icon 2012 is off in this subsection of frames which is shown in a later screen as a pop out. The circle icons 2014 in the top right represent contributors. Although traces and consent are illustrated in the frames section, it will be appreciated that these can be part of any section (e.g., blueprint, discover, etc.)

Figure 20B:
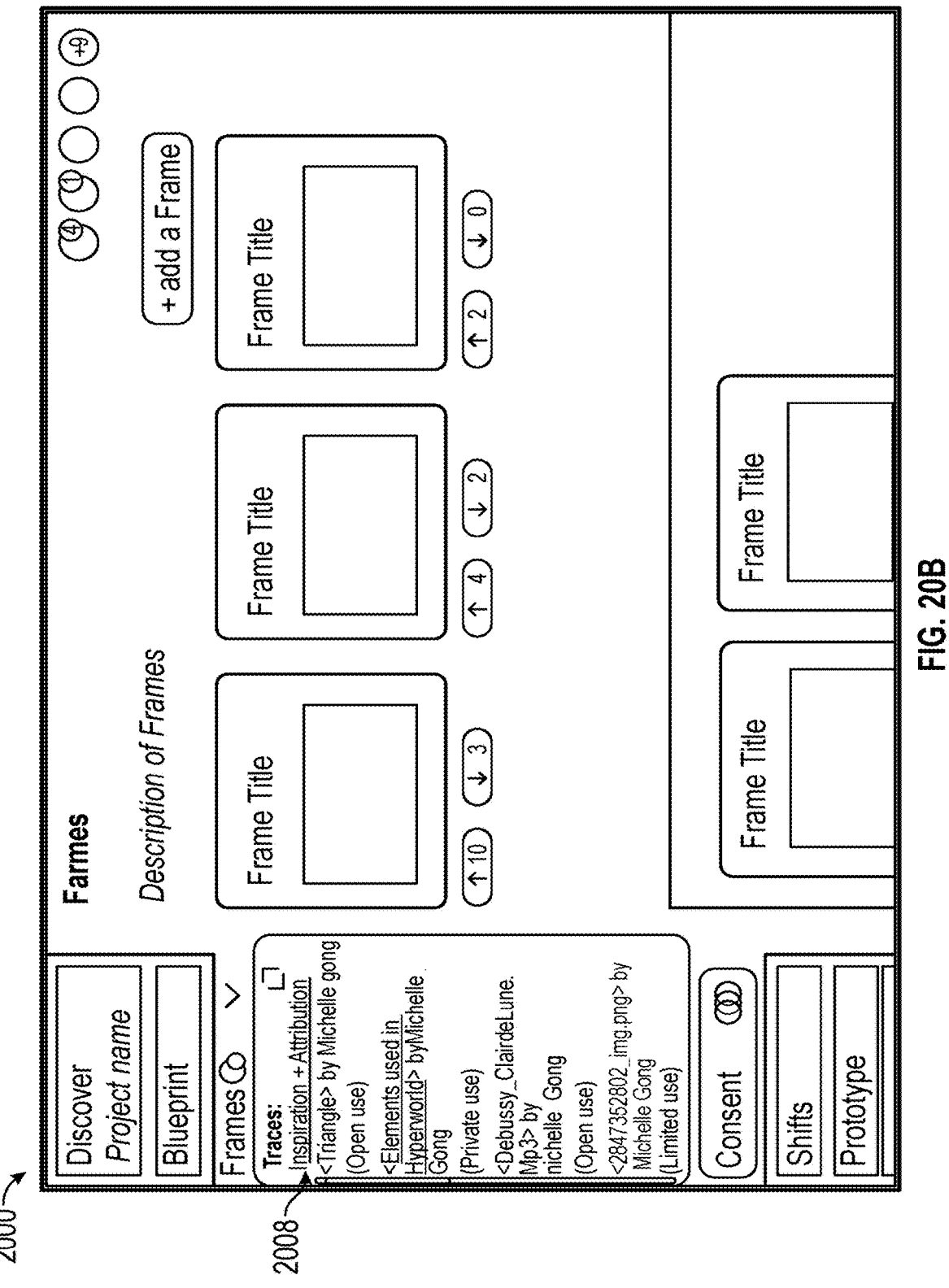
FIG. 20B illustrates an exemplary screen shot relating to the frames section of the tool, according to an embodiment of the present disclosure.

As shown in FIG. 20B and discussed above, one aspect of the frames section 2000 is traces 2008. Traces 2008 show a ledger of inspiration and attribution 2016 for each section.

Figure 20C:
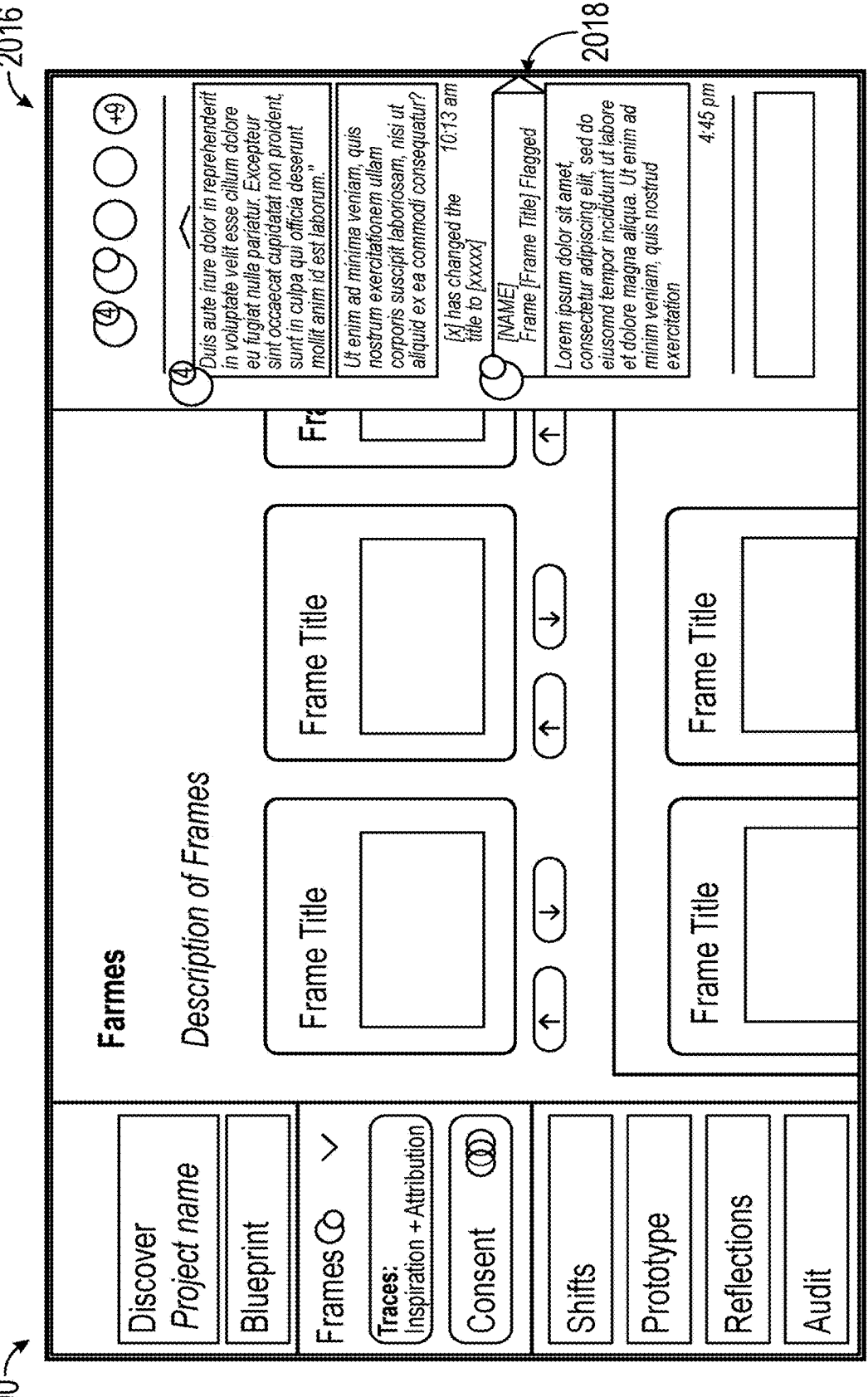
FIG. 20C illustrates an exemplary screen shot relating to the frames section of the tool and aspects of flagging and rating, according to an embodiment of the present disclosure.

As shown in FIG. 20C, one aspect of the frames section 2000 includes flagging and comments on sections of project 2016. As shown in FIG. 20C, the dark triangle on the right 2018 signals that someone has flagged a section for review. A comment may be added to provide context as to why the section has been flagged for review. The flagging and comments section 2016 may also incorporate rating systems used internally or when active as a user research tool when reviewing a corporate prototype. It will be appreciated that the flagging and commenting may also be a part of other sections of the tool (e.g., blueprint, discover, etc.).

Figure 20D:
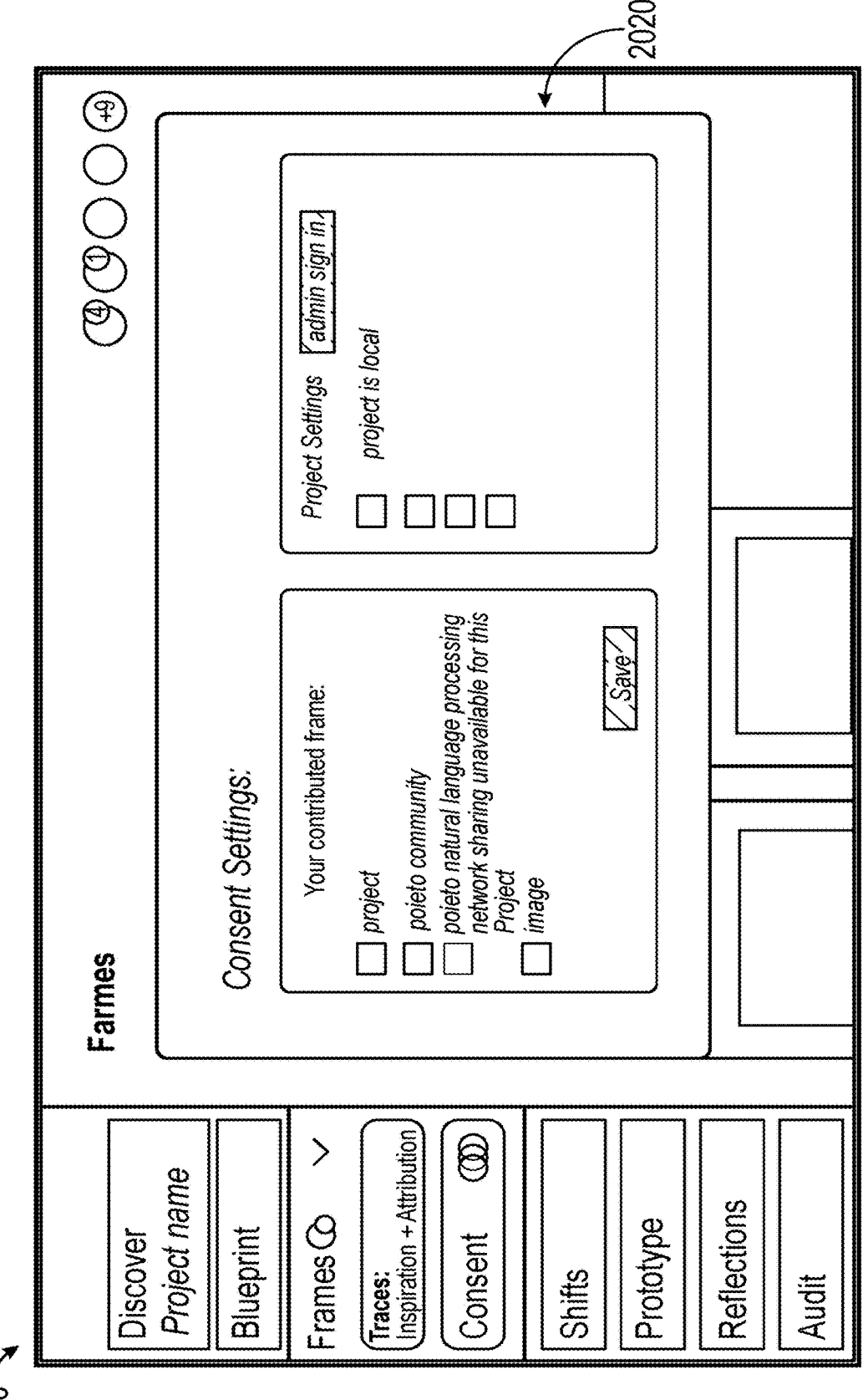
FIG. 20D illustrates an exemplary screen shot relating to the frames section of the tool and aspects of content, according to an embodiment of the present disclosure.

FIG. 20D illustrates another exemplary screen shot relating to the frames section of the tool 2000 illustrating an exemplary screenshot of the consent section 2020. In the consent section 2020, the user can identify existent areas they give their consent to have their contributions used, they may also write in new suggested areas, and identify specific pieces of data to be shared, as well as how that information is shared (for example is it a local ml system, or cloud-connected).

Figure 20E:
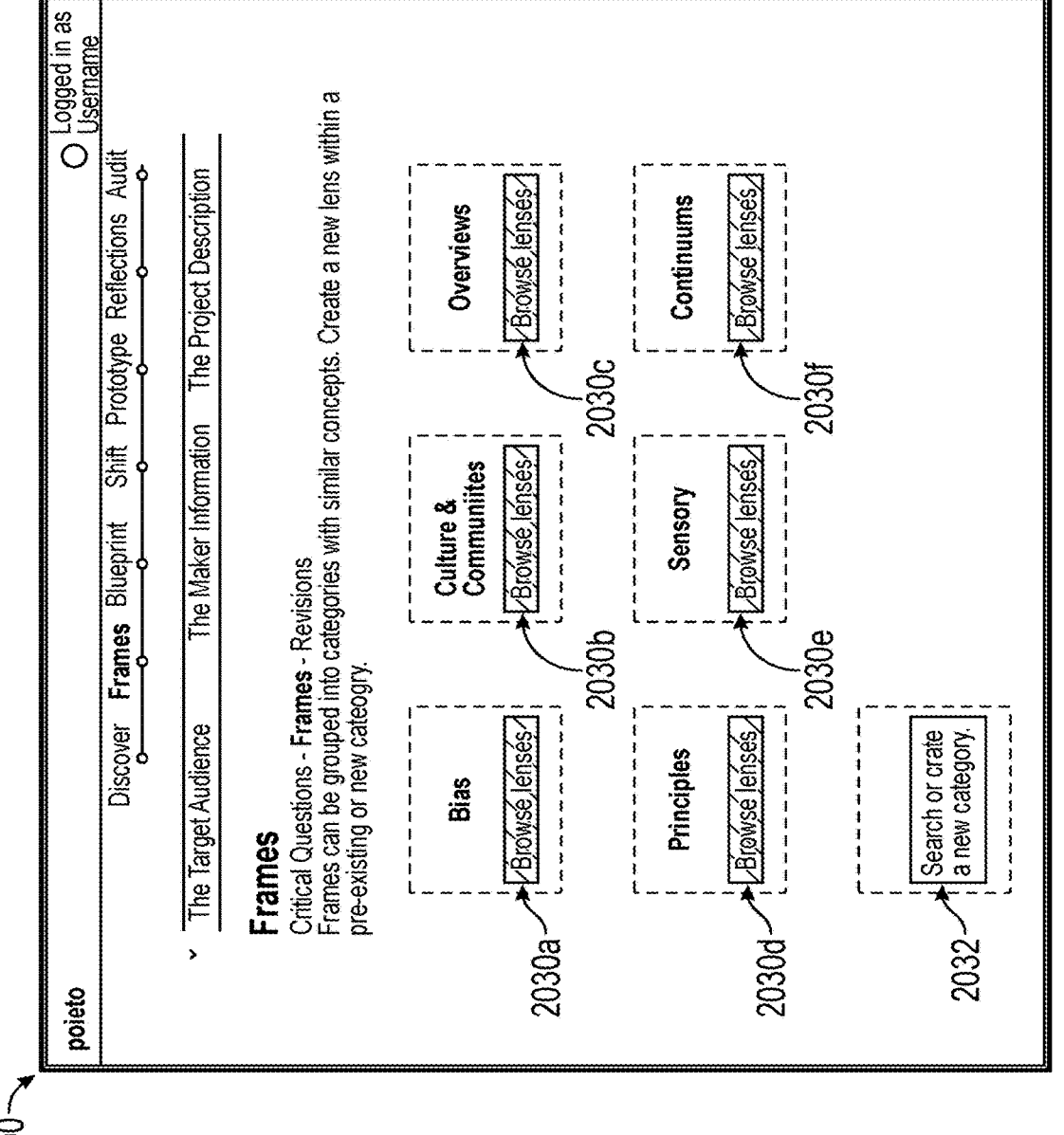
FIGS. 20E and F illustrate exemplary screen shots relating to the frames section of the tool, according to an embodiment of the present disclosure.

As shown in FIG. 20E, the frames (filter, lenses) 2004 can be grouped into categories with similar concepts 2030*a-f.* A new frame can be created within a pre-existing category 2030*a-f* or a new category 2032. Each individual or group of people may contribute or add frames as they see fit. The individuals or groups adding frames may also be identified. The frames may be individual frames or a grouping of frames (pack).

Figure 20F:
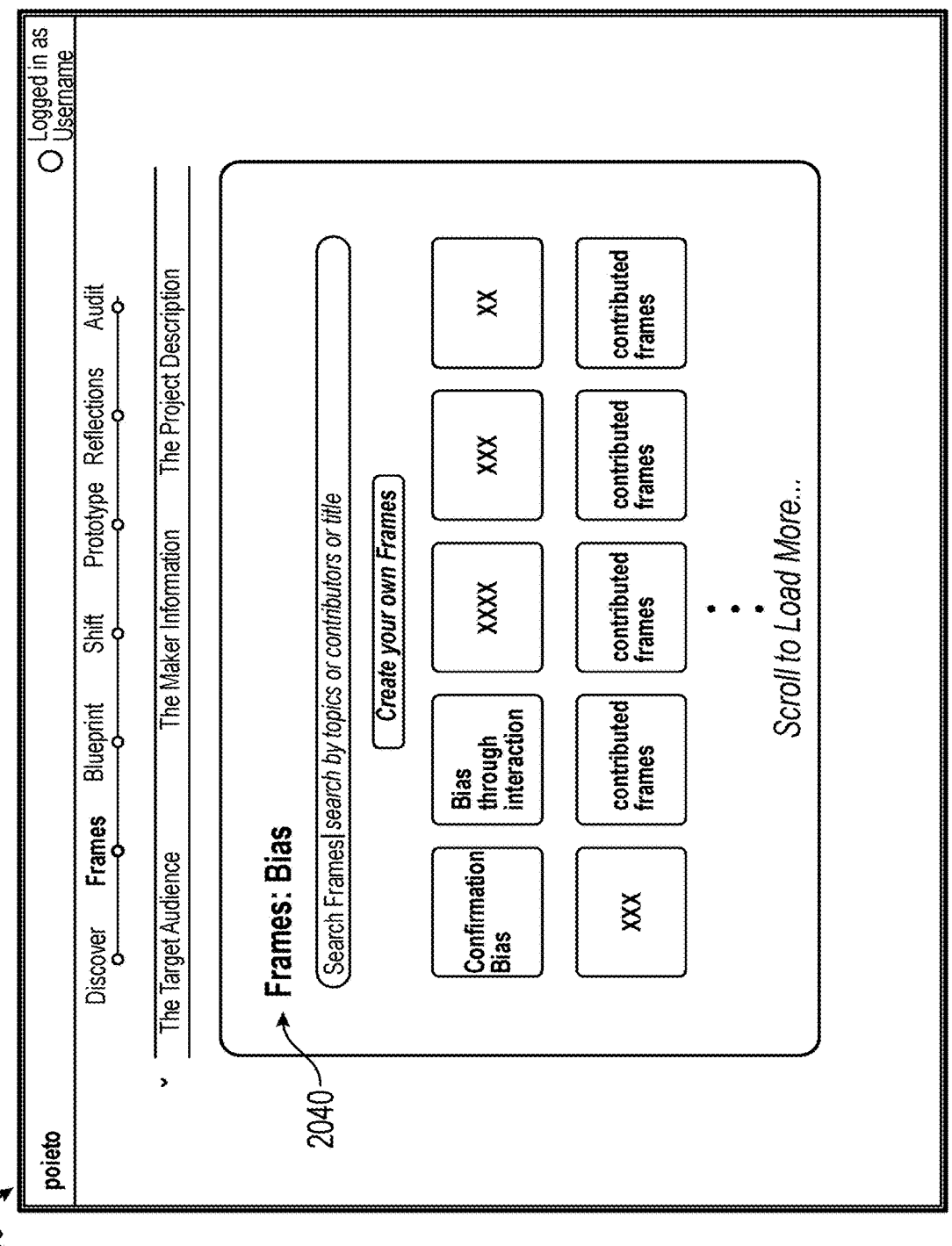
FIGS. 20G-20M illustrates exemplary screen shots relating to the frames section of the tool, according to an embodiment of the present disclosure.
Figure 20G:
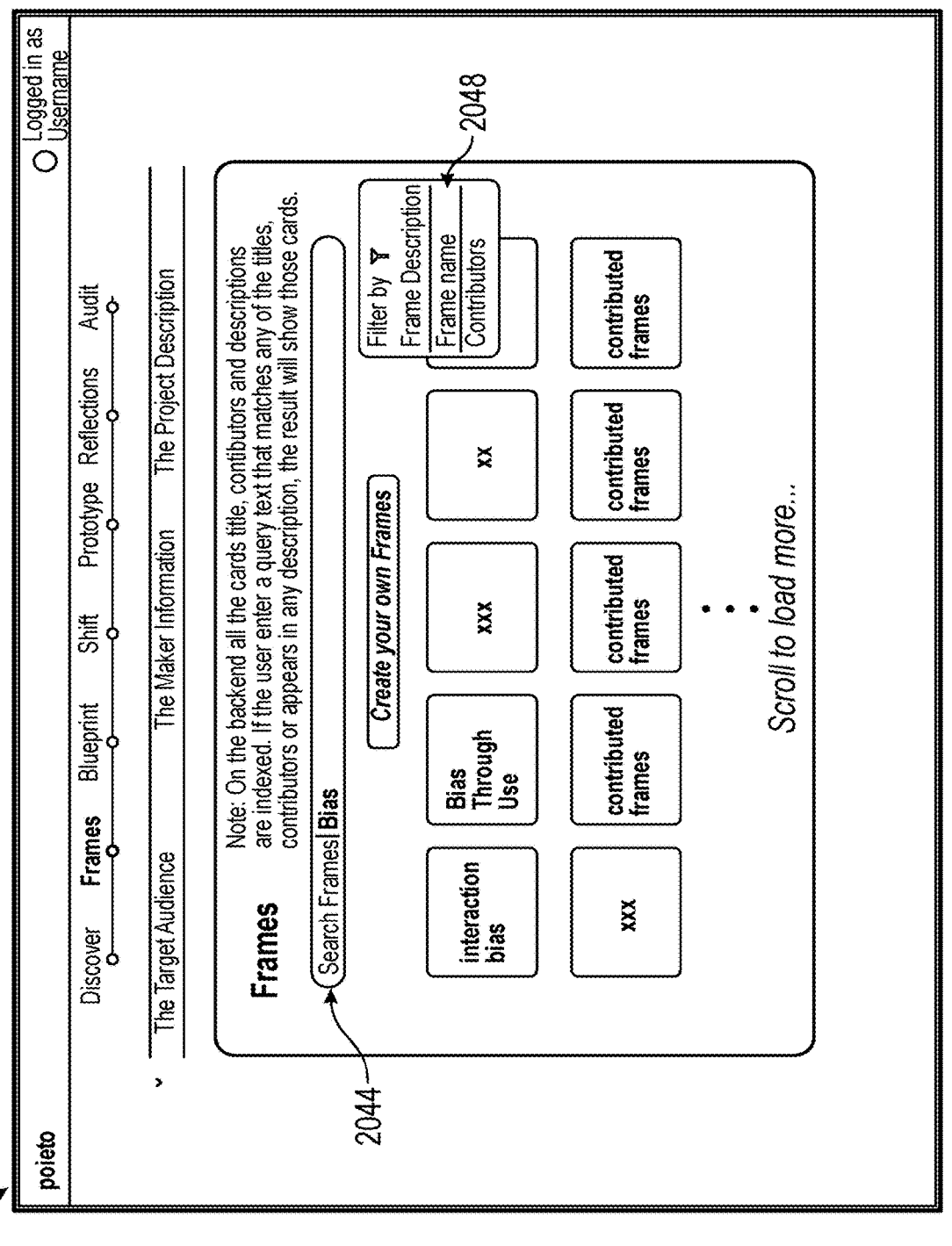
Figure 20H:
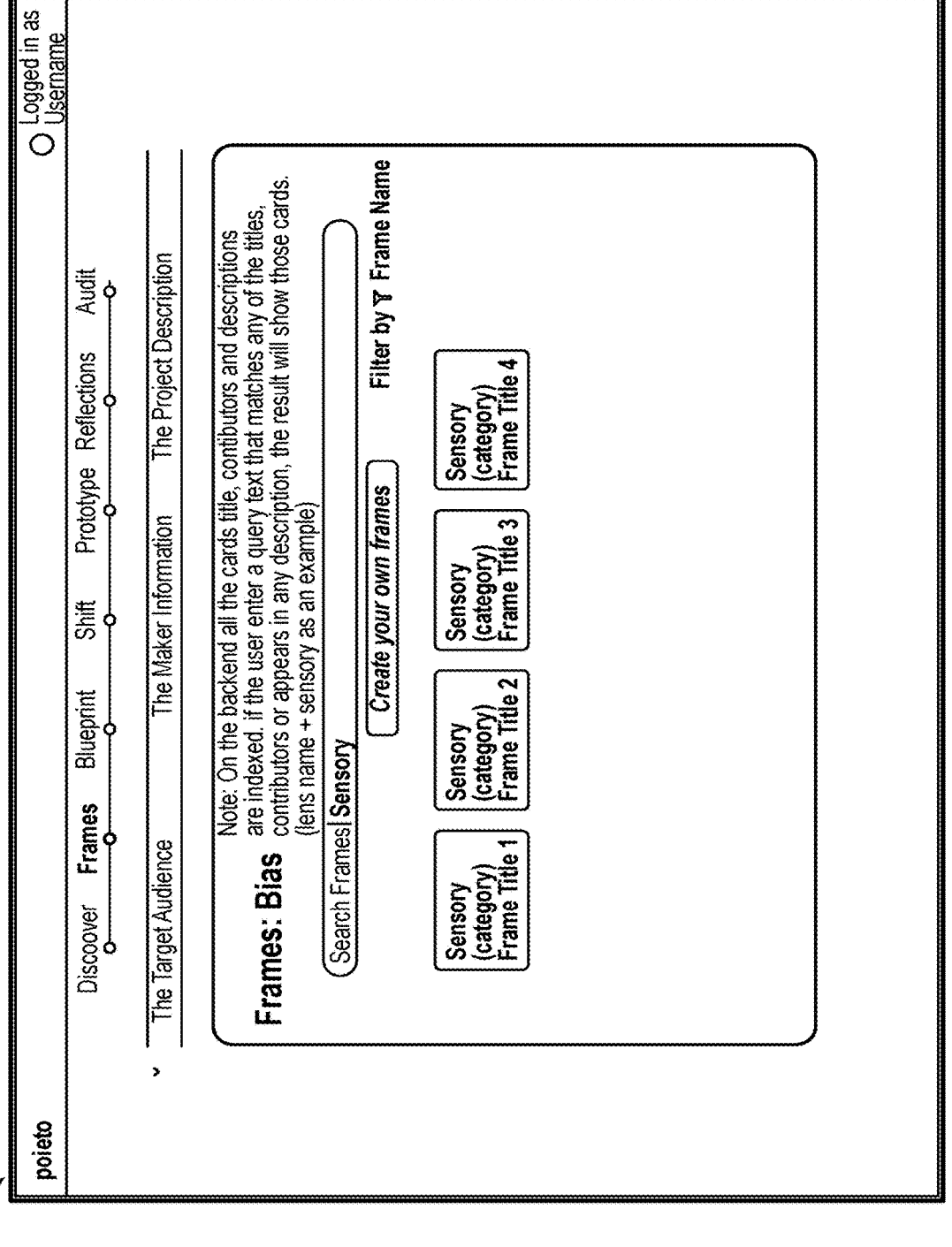

As shown in FIGS. 20F and 20G, the frames may be searched. As shown in FIG. 20F, the frames may be searched by category (e.g., bias) 2140. Alternatively, as shown in FIG. 20G, a user may enter a search term in a search field 2044, which returns frames relating to that search term. For example, in FIG. 20G, the search term "bias" returns different frames relating to the "bias" search term. The frames may be indexed by title, contributors, descriptions, etc. such that a user can search by any of the title, contributor or description and any matching frames will be returned. The frames may be further filtered by frame description, frame name or frame description 2148, as shown in FIG. 20G. FIG. 20H illustrates an alternative search for frames matching the search term "sensory." In some embodiments, the frame search results return a display with only the title of the frames. In other embodiments, the contributors and/or descriptions may also appear in the search results.

As shown in FIG. 20F-20H, the frame entry point examples identifies where individuals can search and add frames. The card may include the contributors, descriptors and other relevant information (on the front or back of the card); this information is indexed for search purposes. The group of contributors may also be grouped into groups (i.e., a whole bunch of icons in another icon).

Figure 20I:
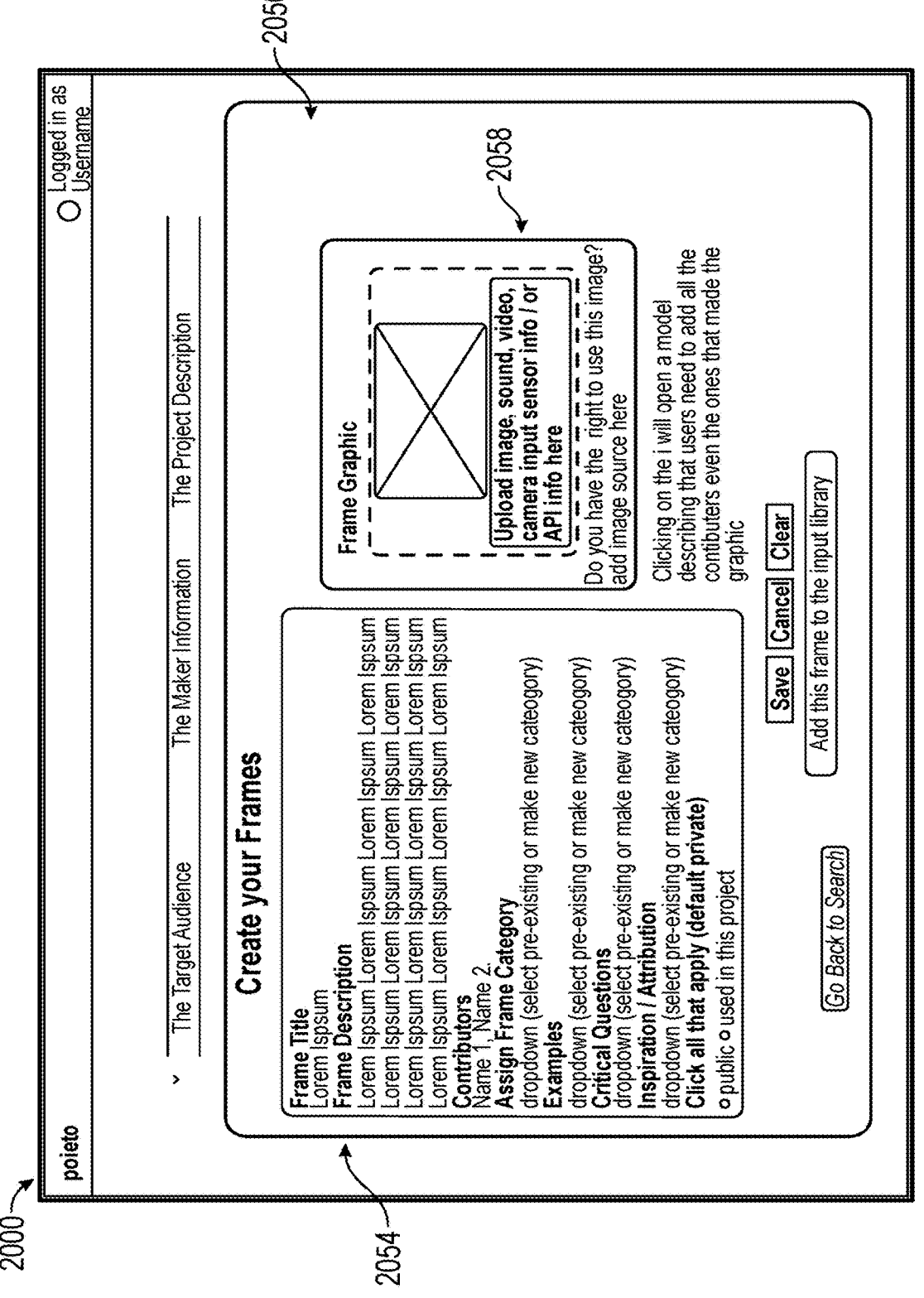

FIG. 20I is a detailed view of an exemplary screen shot of a user interface for creating an exemplary frame 2004. As shown in FIG. 20I, the frame card information and headers can be added or renamed 2054. Examples of the frame card information 2054 include the frame title, frame description, contributors, frame category, examples, critical questions, inspiration/attribution and whether the frame is public or private. The frame may also include a graphic or other files 2058 may be added to the frame. These files may be, for example, direct audio/video, images, videos, APIs, sound, sensor info, etc. It will be appreciated that the files may be uploaded or searched for and taken from other frames, data, input, cards, etc.

Figure 20J:
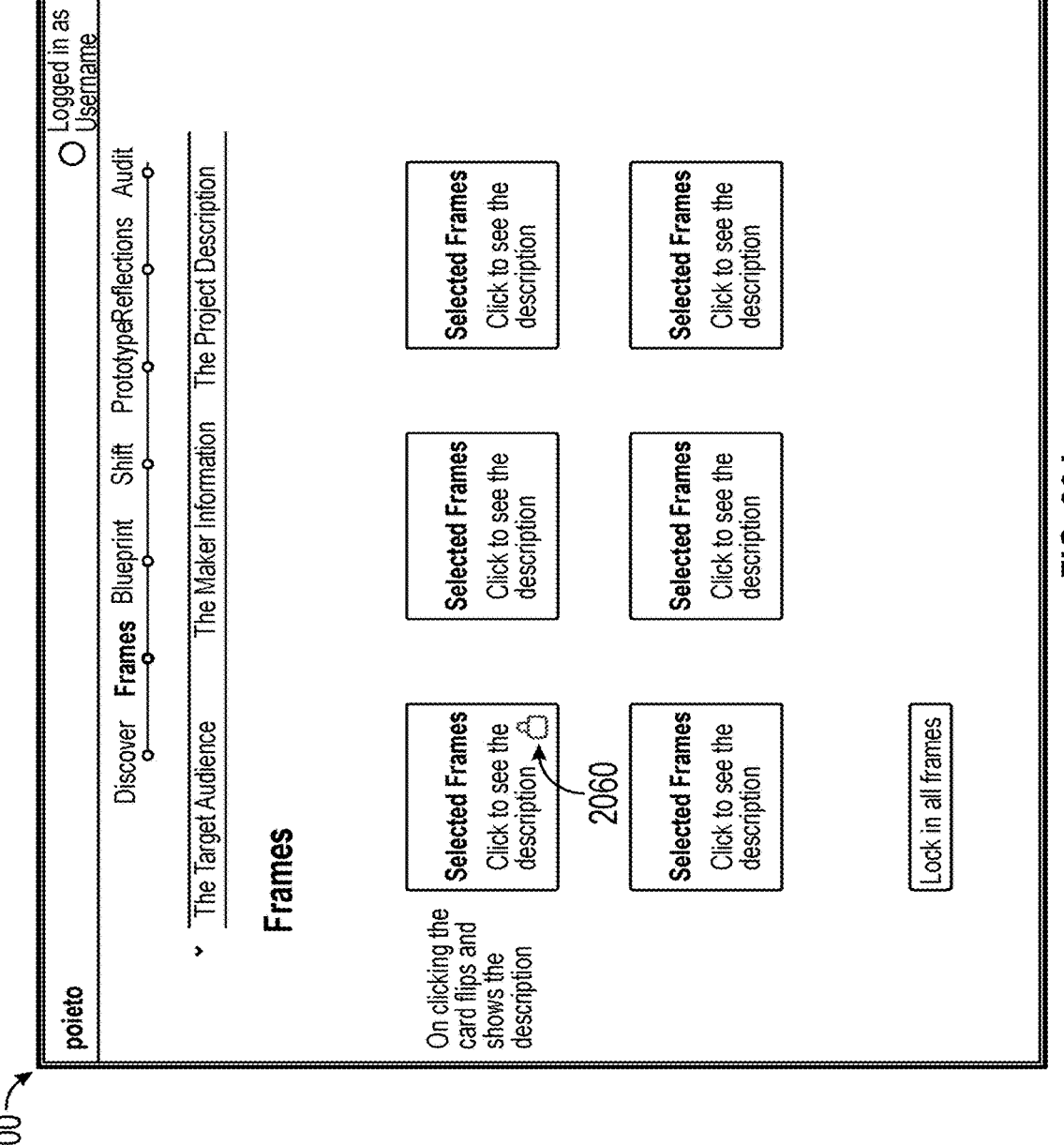

As shown in FIG. 20J, the user can lock in 2160 one frame or many frames as a group of frames. Comments can also be added to one frame or a group of frames. In one embodiment, the frame may be displayed with a description of the frame only and selecting on the frame will display additional information about the frame.

Figure 20K:
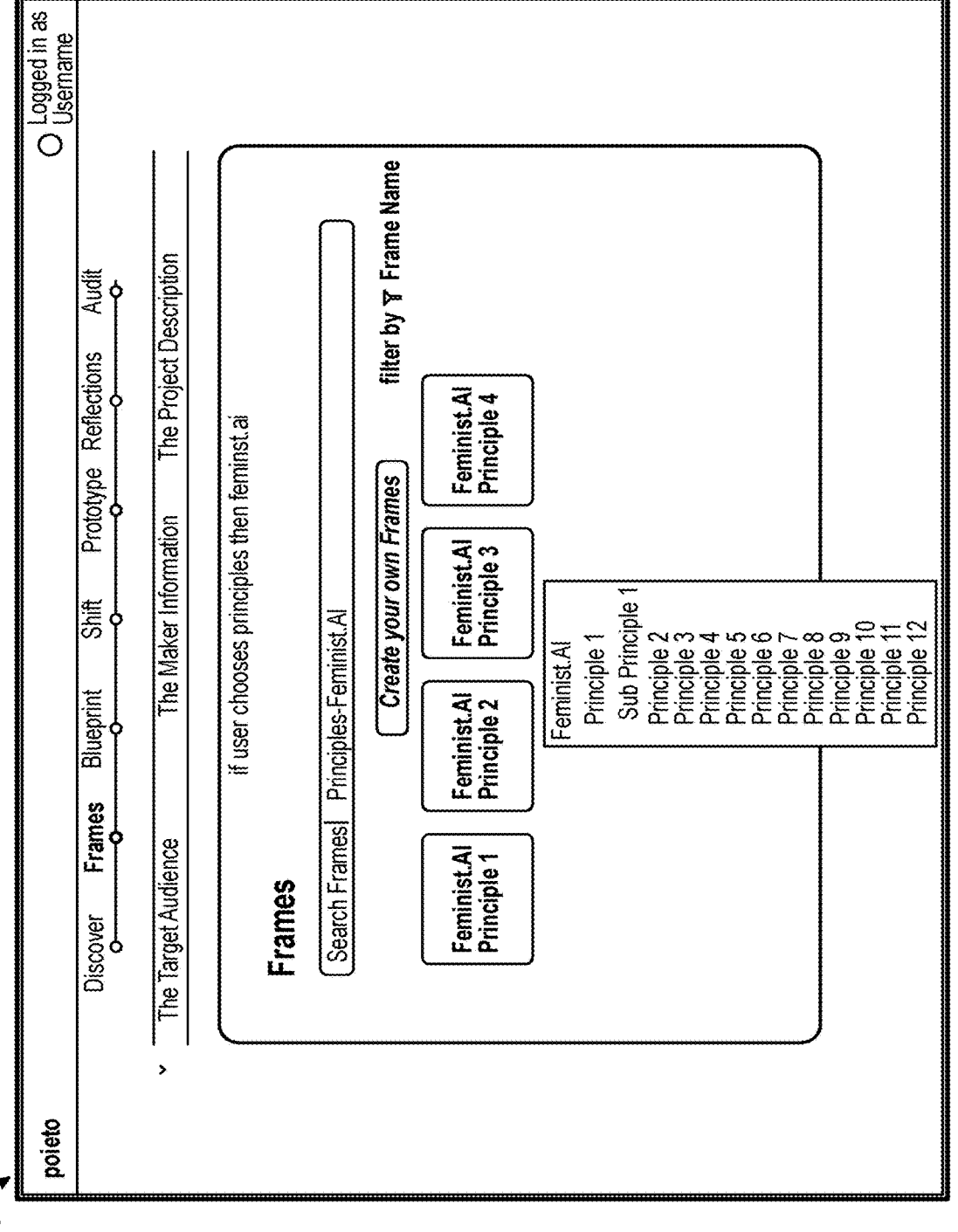

As shown in FIG. 20K, users can also search by philosophy. For example, as shown in FIG. 20K, a user may search for frames relating to the values or philosophy of an organization. For example, as shown in FIG. 20K, the search may be for a feminst.ai philosophy as a whole or may pull specific pieces of the philosophy.

Figure 20L:
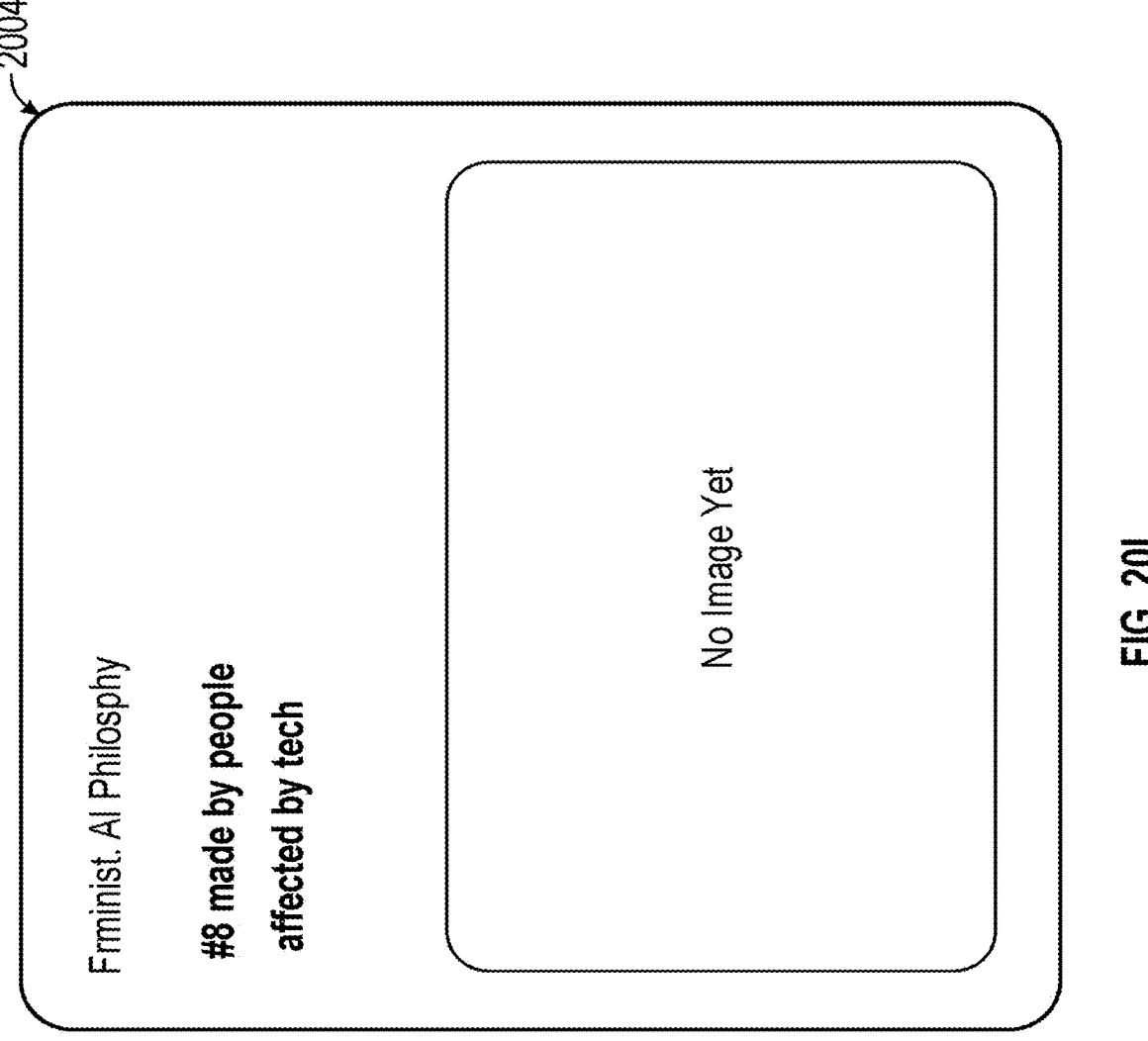

FIG. 20L illustrates a detailed view of a frame card 2004 contributed to by Feminist. AI members. This exemplary card incorporates principle #8 (visualization of the Feminist. AI philosophy that people directly affected by tech should be making the tech).

Figure 20M:
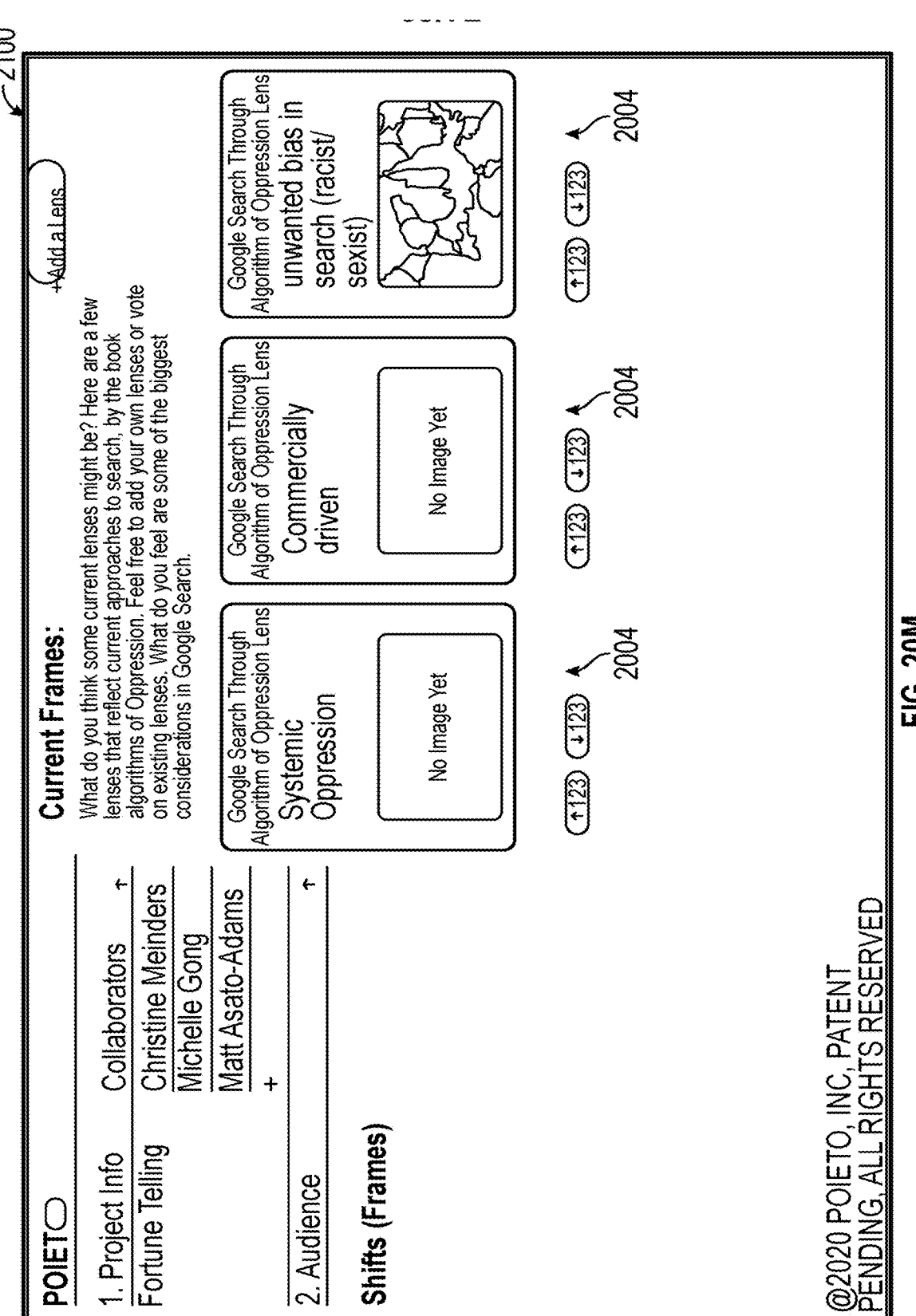

As shown in FIG. 20M, the frames can be used to help remake a project (such as a search algorithm) to identify current assumptions in the design process through different frames (lenses). Here, the current frames 2004 are pulled directly from the book Algorithms of Oppression by Safiya U. Noble as applied by (or processed by) the Feminist.AI community. All too often in tech, there is a prominent focus on the software—and its developers are well compensated for their labor regardless of whether the things they create have problematic aspects to them. Academic and community work is not being used to make software better nor are such practitioners in these areas compensated for their labor. The tool fully integrates this course correction into the design process in a way that is publicly recognized and can be financially compensated using the frames 2004. This can be incorporated in the blueprint section or other sections/actions of the tool.

Figure 21B:
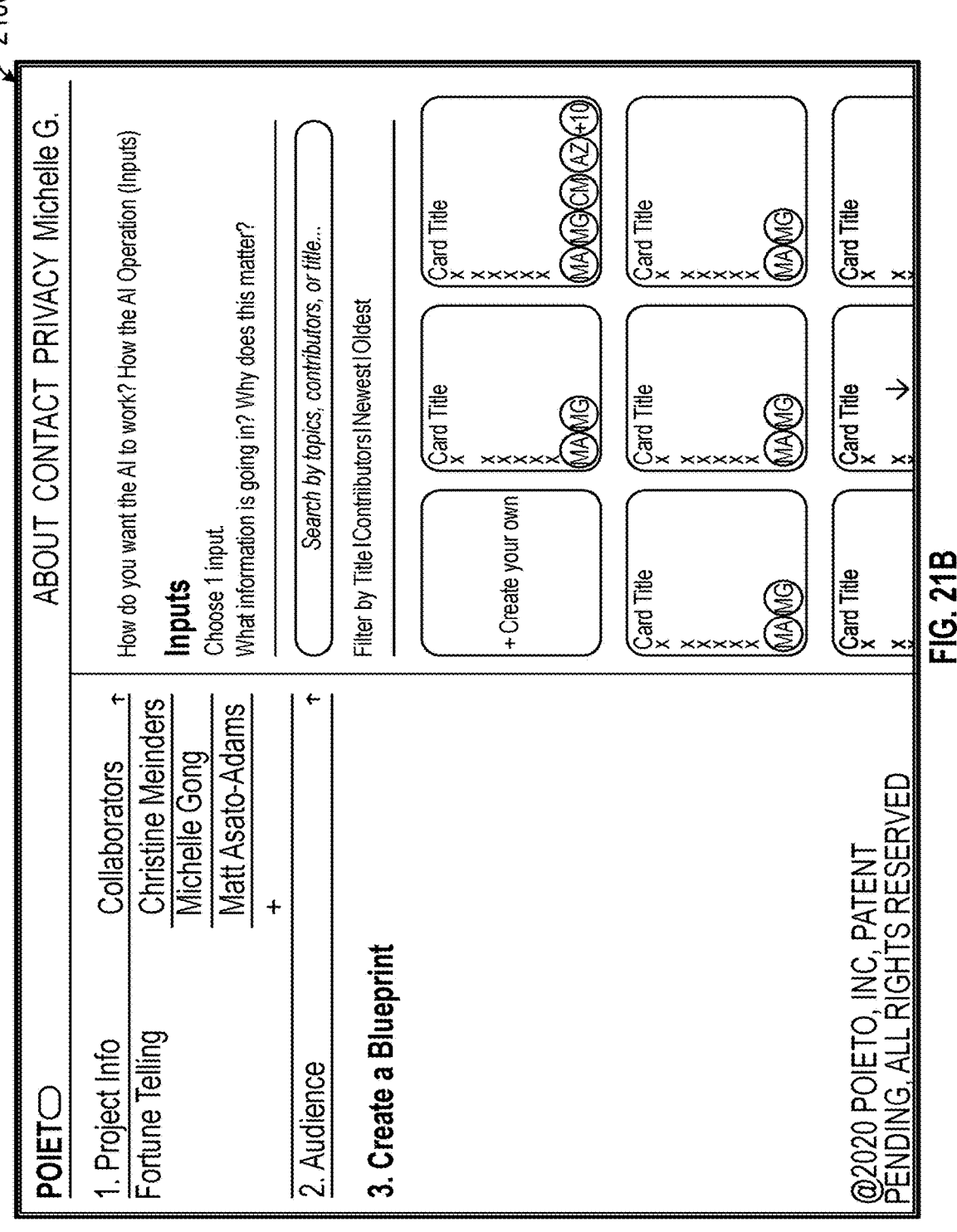

FIGS. 21A-H illustrate exemplary user interfaces relating to the blueprint section 2100. As shown in FIG. 21A, the "create a blueprint" section of the tool is shown. In this section, users can identify what is going into the system or add what they think goes into the system and open it up to community to contribute. In the actions section, the tool looks at functionality as well. Users may also rearrange the cards, which may include input, actions, output, data, rules and form/material as shown in FIG. 21A. The user defines the rules, but then the rules are broken down into functionality and model. The input may "interact with the actions/functionality", and has the form of a specific output or outputs. These sections may be moved around, locked and commented on.

As shown in FIG. 21B, the community can also contribute information and groups can collaborate together. The mechanics of community sourced input is expressed in how a team may collaborate from the very beginning or pull from community sourced data. This process can be replicated throughout the blueprint section. In this example, the creators may create their own cards for the input section. Here you see the creators (who have agreed to be identified) on the cards. This process can be replicated through the blueprint section.

Figure 21C:
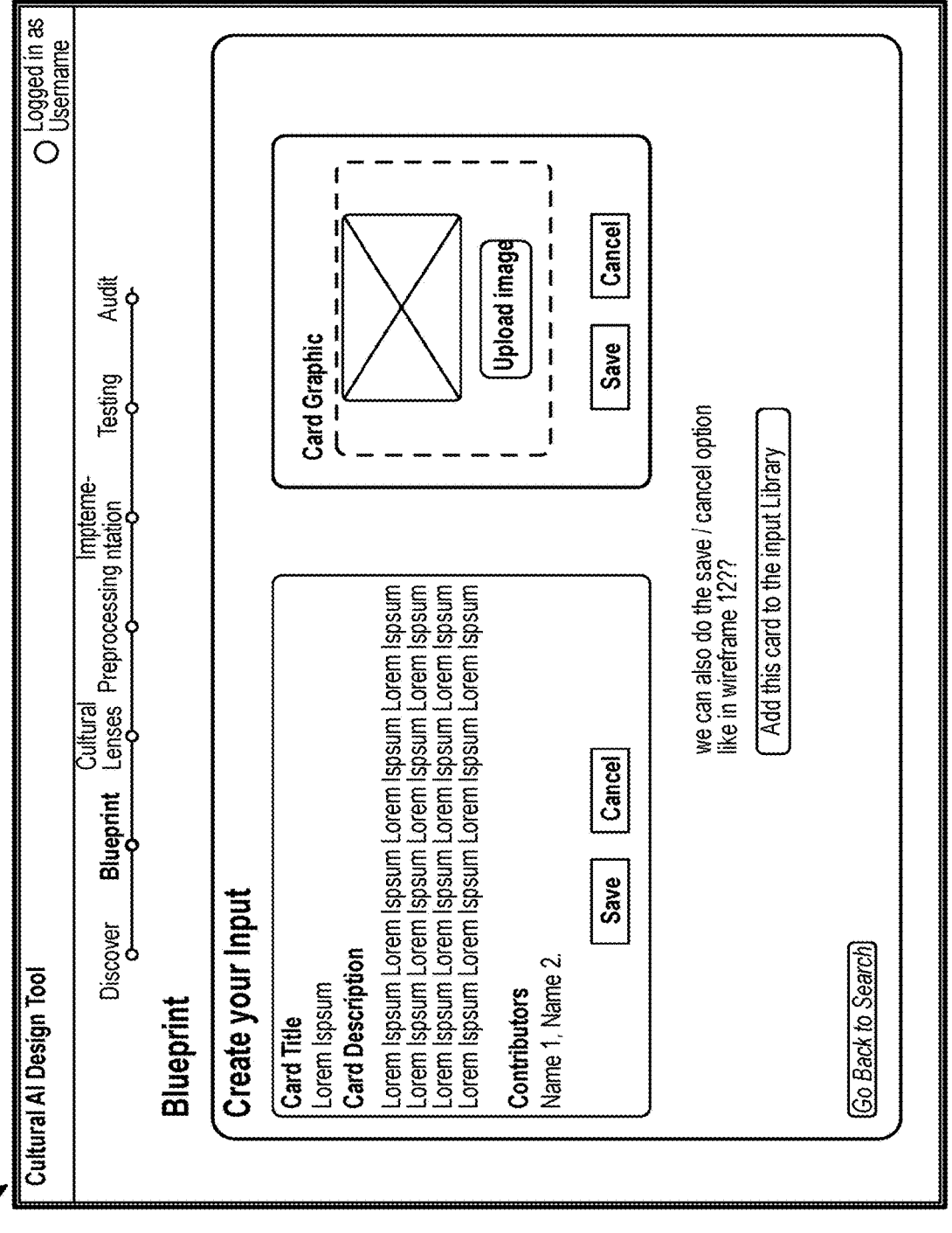

FIG. 21C illustrates an exemplary input card 2140. As shown in FIG. 21C, the card may include images, but similar to the frames card, users may add an API, sound, sensor input, live video, audio, mp3, etc. The uploads may be audio/video, image, video, API, sound, and/or sensor info that can be uploaded or searched for/taken from other frames, data, input, cards, etc.

Figure 21D:
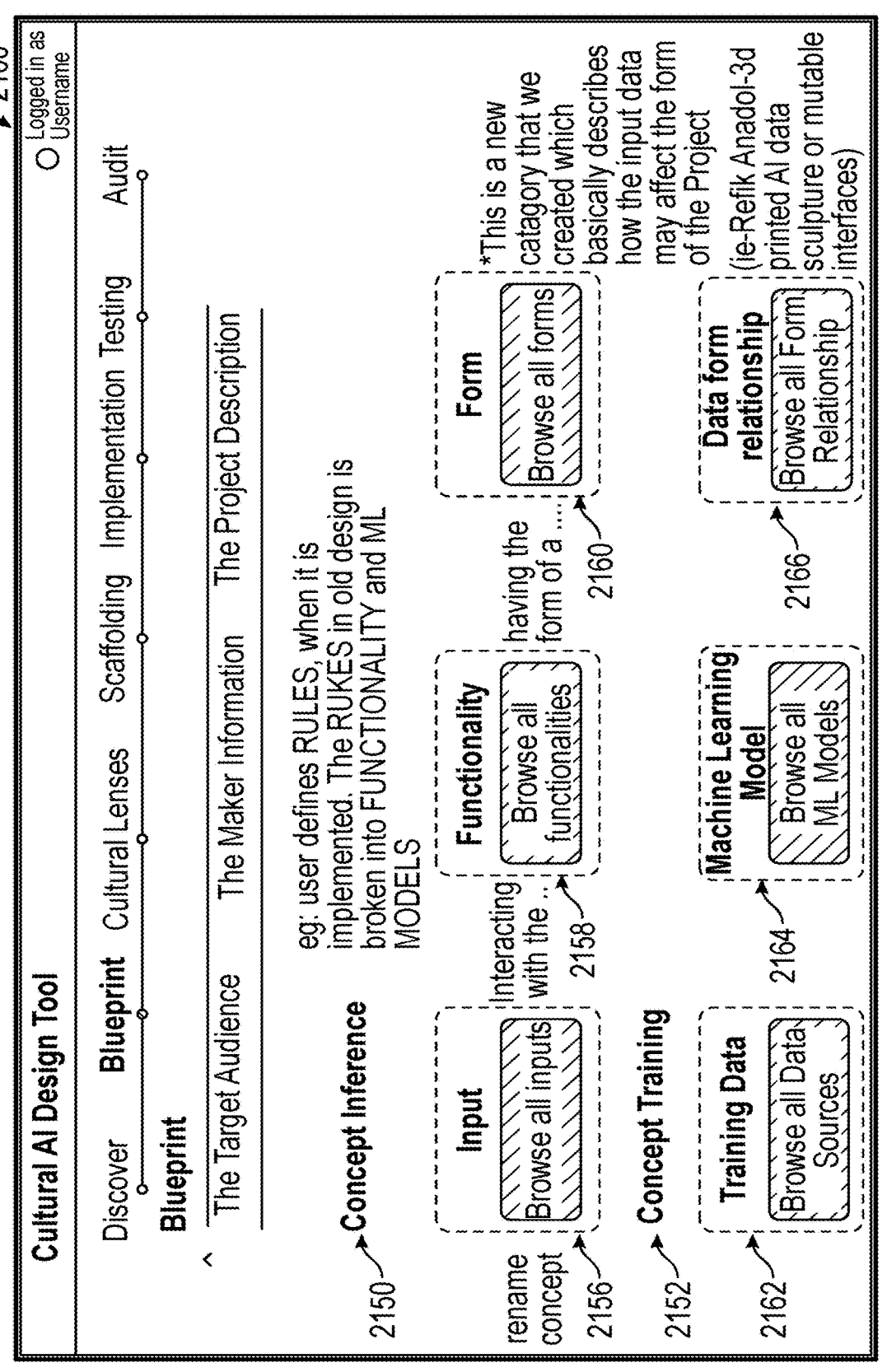

As shown in FIG. 21D, the blueprint section 2100 includes concept inference 2150 and concept training 2154. As discussed above, users define rules when it is implemented. The rules are broken into functionality and machine learning (ML) models. As shown in FIG. 21D, in concept inference 2150, the input 2156 "interacts with the actions/functionality" 2158, and has the form of a specific output or outputs 2160. In concept training 2152, the concept is trained using one or more of training data 2162, ML models 2164 and data form relationship information 2166.

Figure 21E:
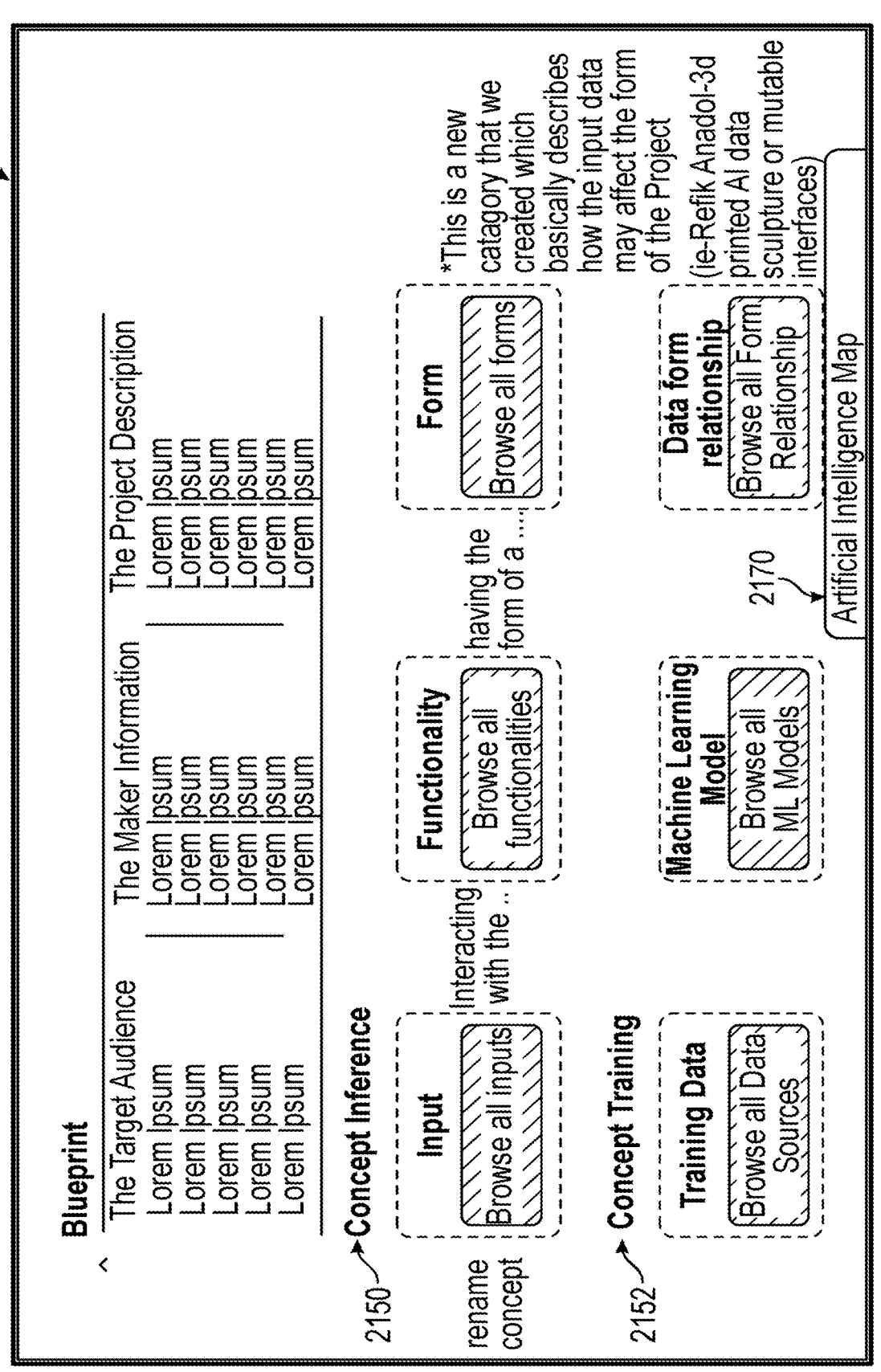
Figure 21F:
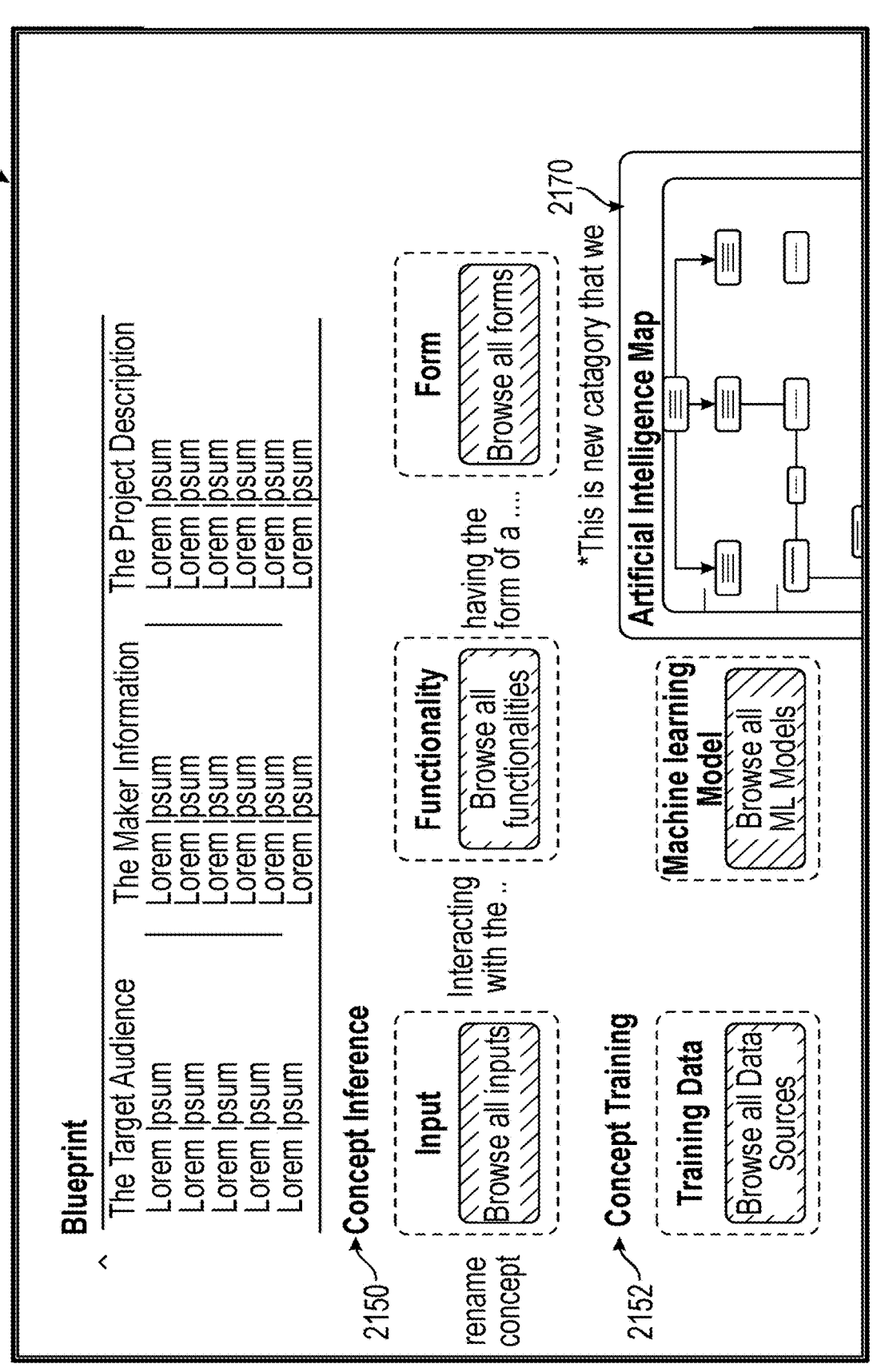

As shown in FIG. 21E, this section provides an example of the position/orientation map pop-up 2170 of FIG. 21F in a collapsed state. FIG. 21F shows the position/orientation map 2170 in the expanded state. The position/orientation map 2170 identifies where the participant is in the design process.

As discussed above and shown in FIG. 21G, the blueprint section 2100 includes two aspects:—what does it do (inference) 2150 and how does it work (training) 2152. It will be appreciated that the input data and material may affect the form or experience of the project.

Figure 21H:
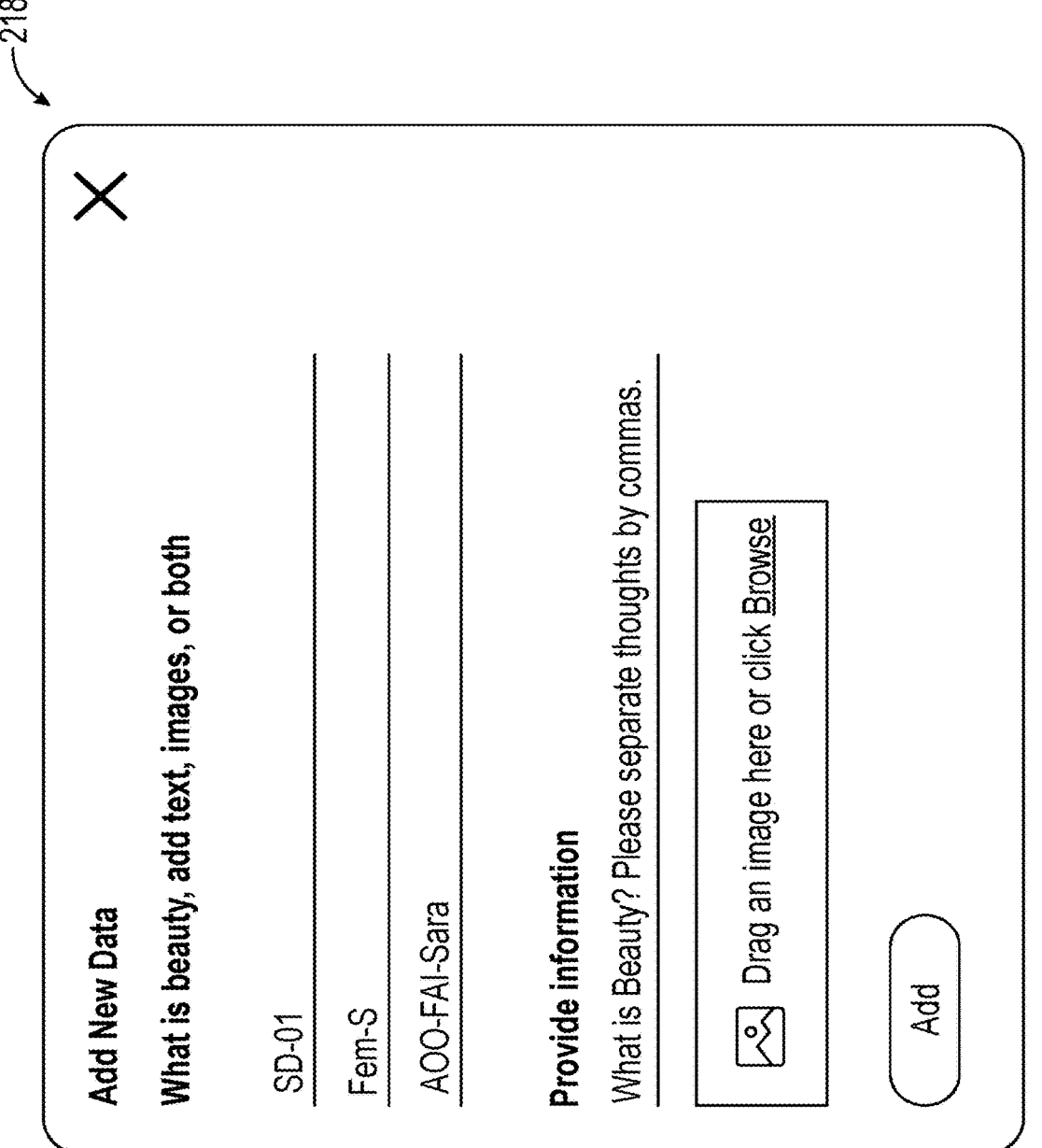

FIG. 21H illustrates an example of the data collection card 2180. Users may add elements to this card 2180 or remove elements from this card 2180 As shown in the exemplary card 2180, the users may provide information about "what is beauty" and images or other files (e.g., APIs, sound, sensor input, live video, audio, mp3, etc.) can be added. The data in the data collection card can be source data or "retraining" data.

Figure 22:
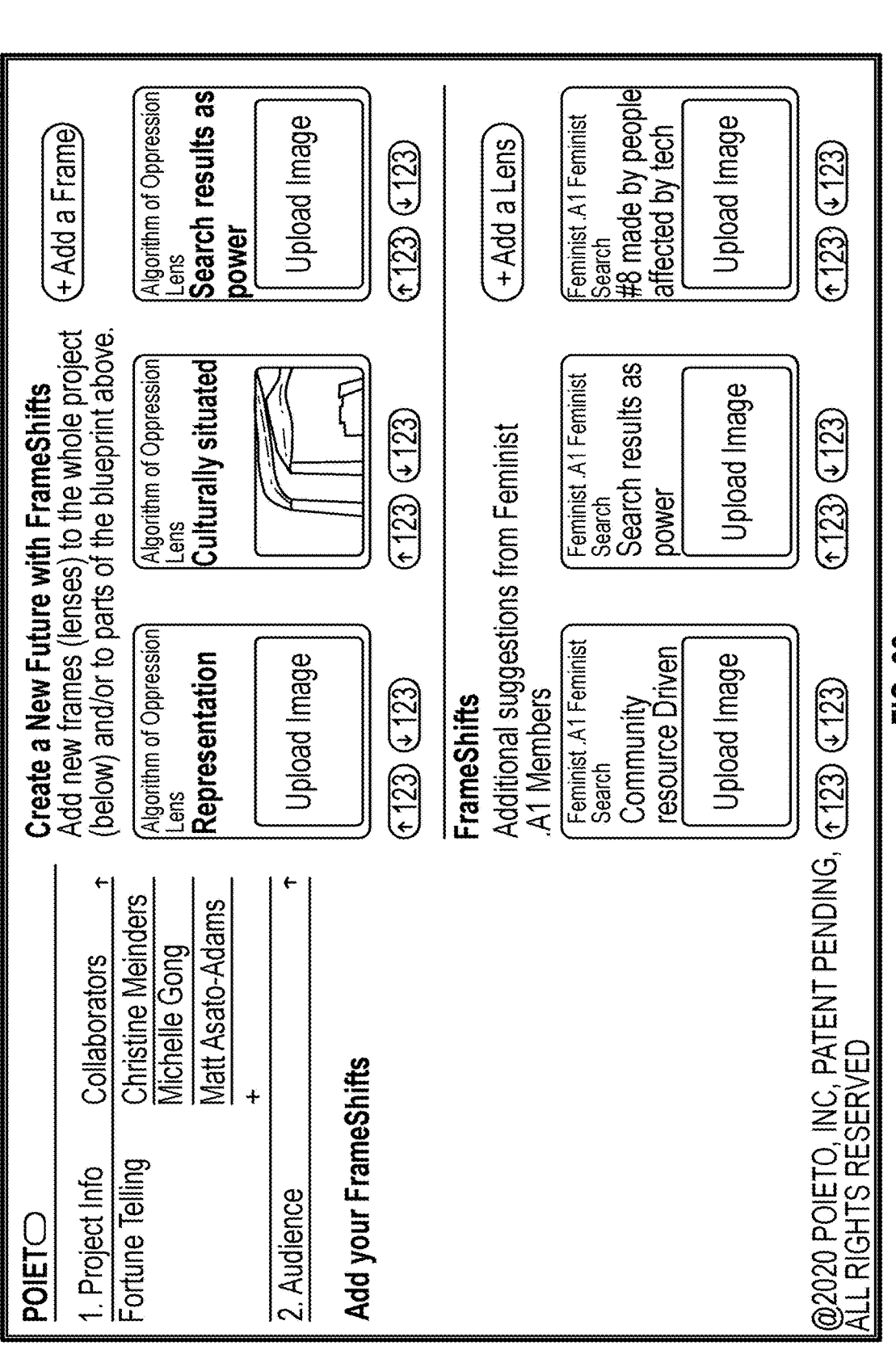
FIG. 22 illustrates an exemplary use of the tool to shift an existing frame or recommend a new frame, according to an embodiment of the present disclosure.

FIG. 22 illustrates an exemplary use of the tool to shift an existing frame or recommend a new frame (i.e., frameshift) 2200. As shown in FIG. 22, a user can add as many layers (grouping) of frames or individual frames as needed. In FIG. 22, the first row illustrates a set of frames offers new perspectives from the Algorithms of Oppression Lenses book by Safiya U. Noble-here we ask, what if we designed for positive representation, multiple culturally situated searches, and use search as a form of community power. The second row illustrates additional frames suggested for the project. In this section, people may revisit previous project information—like the frames—and may offer a shift in that thinking. The frames may come from an individual, a book, a group of people, etc. and people may login and suggest or remove frames.

FIGS. 23A-23B, 24A-J and 25 illustrate examples of the prototype section of the tool, which includes scaffolding, implementation (data and model), and activation (also understood as testing) modules.

Figure 23B:
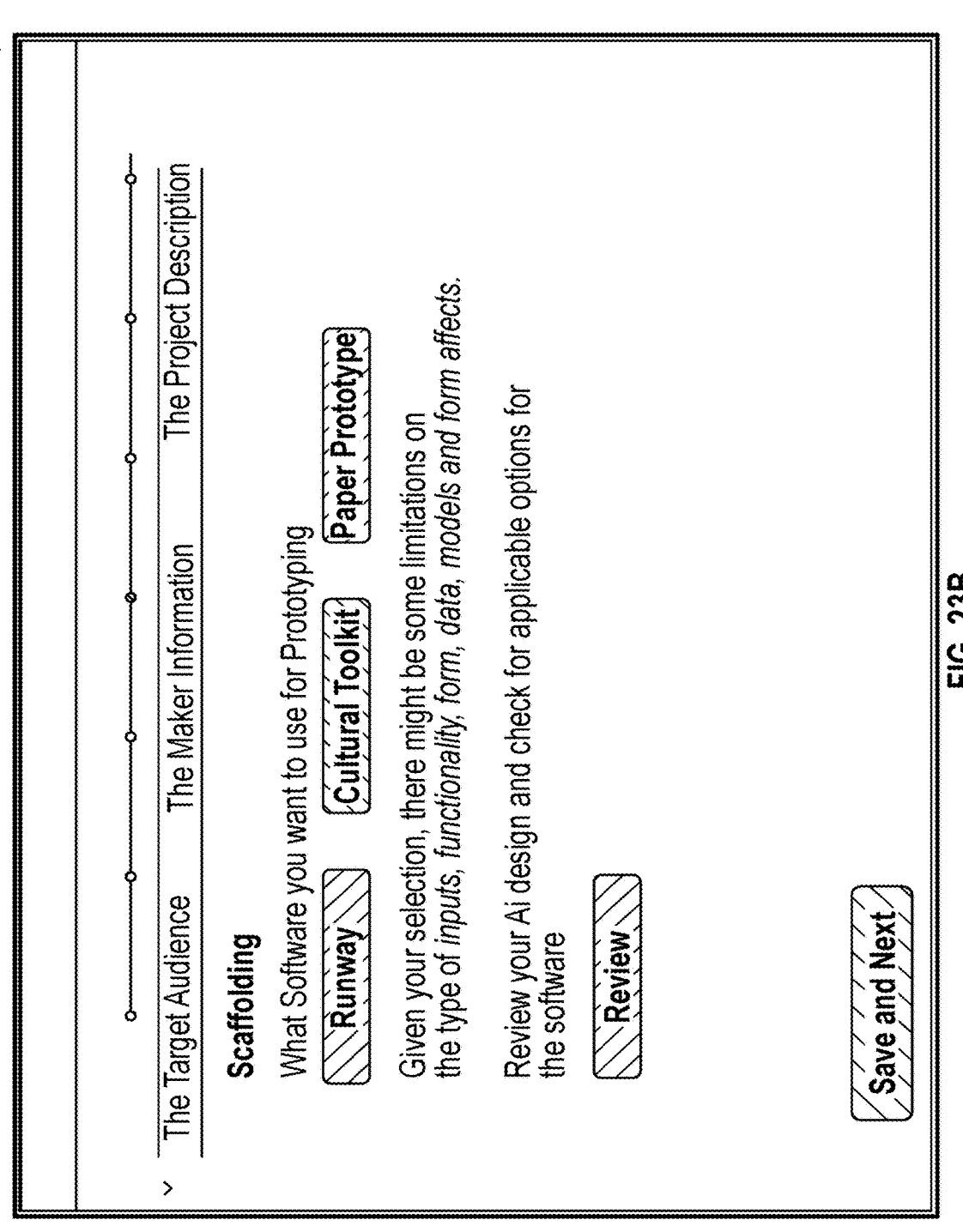

FIGS. 23A and 23B illustrate an example of the scaffolding section of the tool 2300. In the scaffolding section 2300, a user identifies integration with potential software. In this section, the user identifies the compatibility with other tools or sections of the collaborative software tool sections (and the ability to integrate with those sections). For example, if a user is using runway ml, but wants to upload audio data, when they get to data uploads, a warning will appear about compatibility and make suggestions regarding other options. The project creator may also use the models or algorithms built within (or local to) the tool itself FIGS. 24A-F are exemplary user interfaces relating to the data uploading implementation section of the tool 2400 and FIGS. 24G-J are exemplary user interfaces relating to the model implementation section of the tool 2450.

Figure 24C:
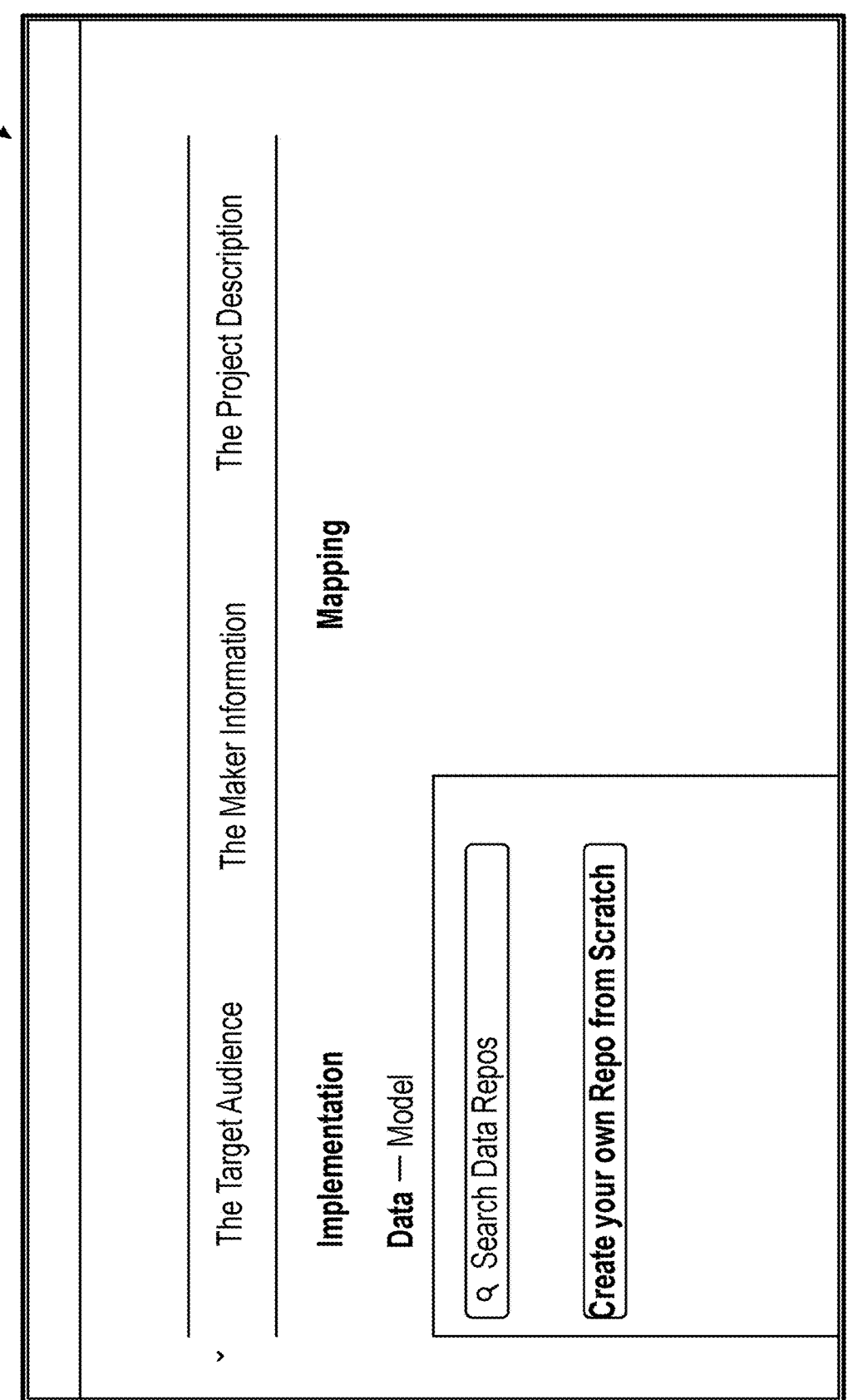
Figure 24D:
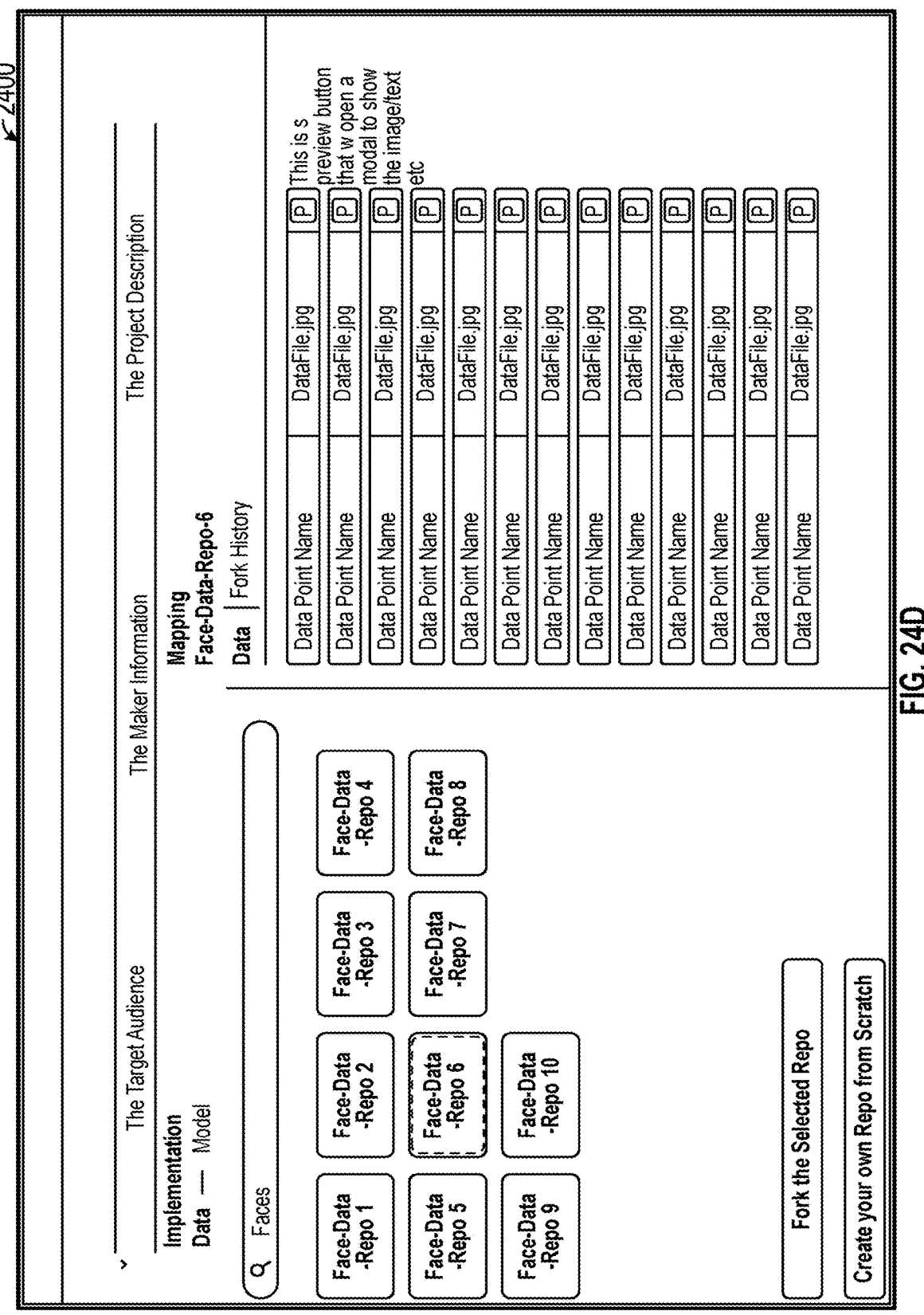
Figure 24F:
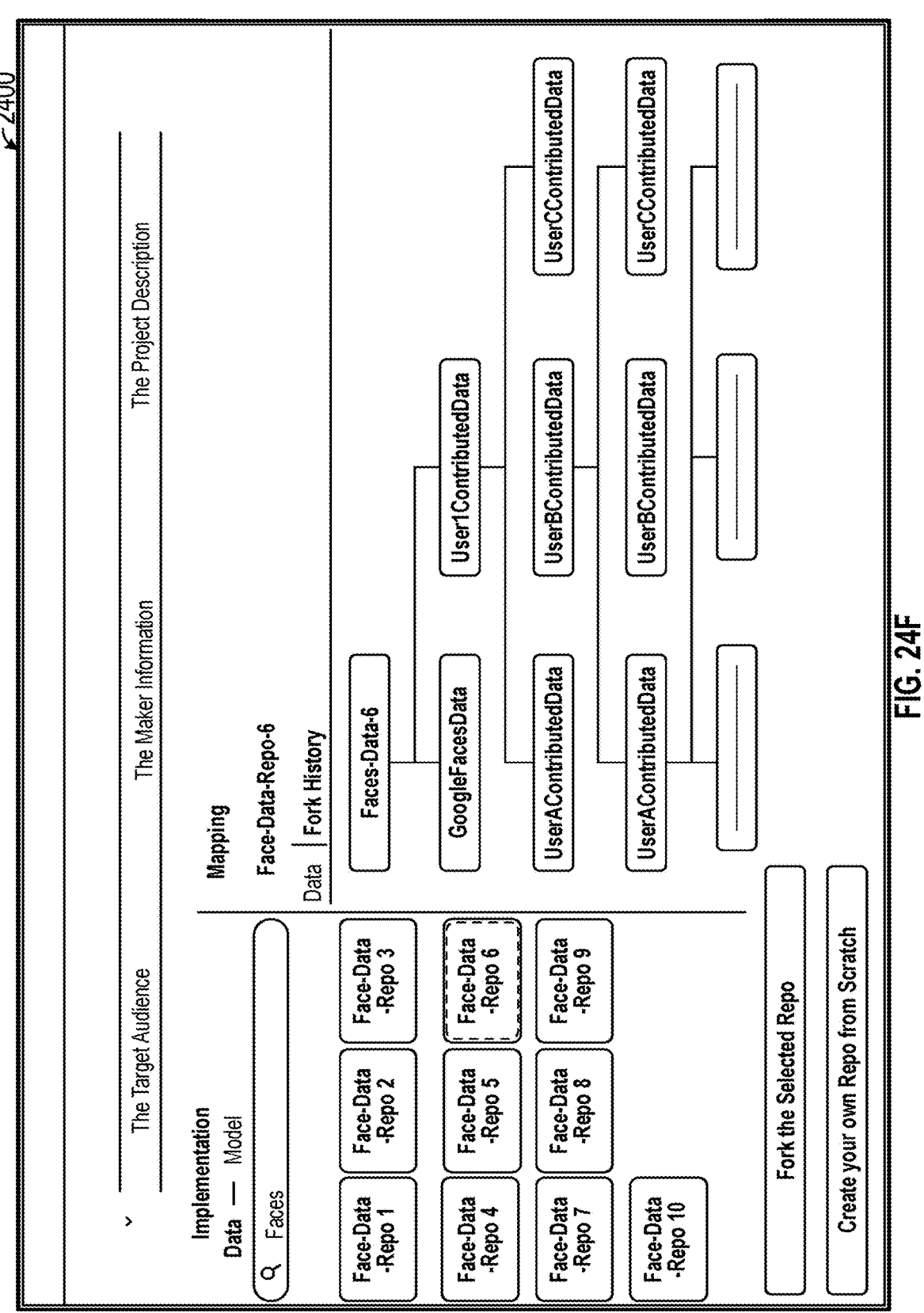
Figure 24G:
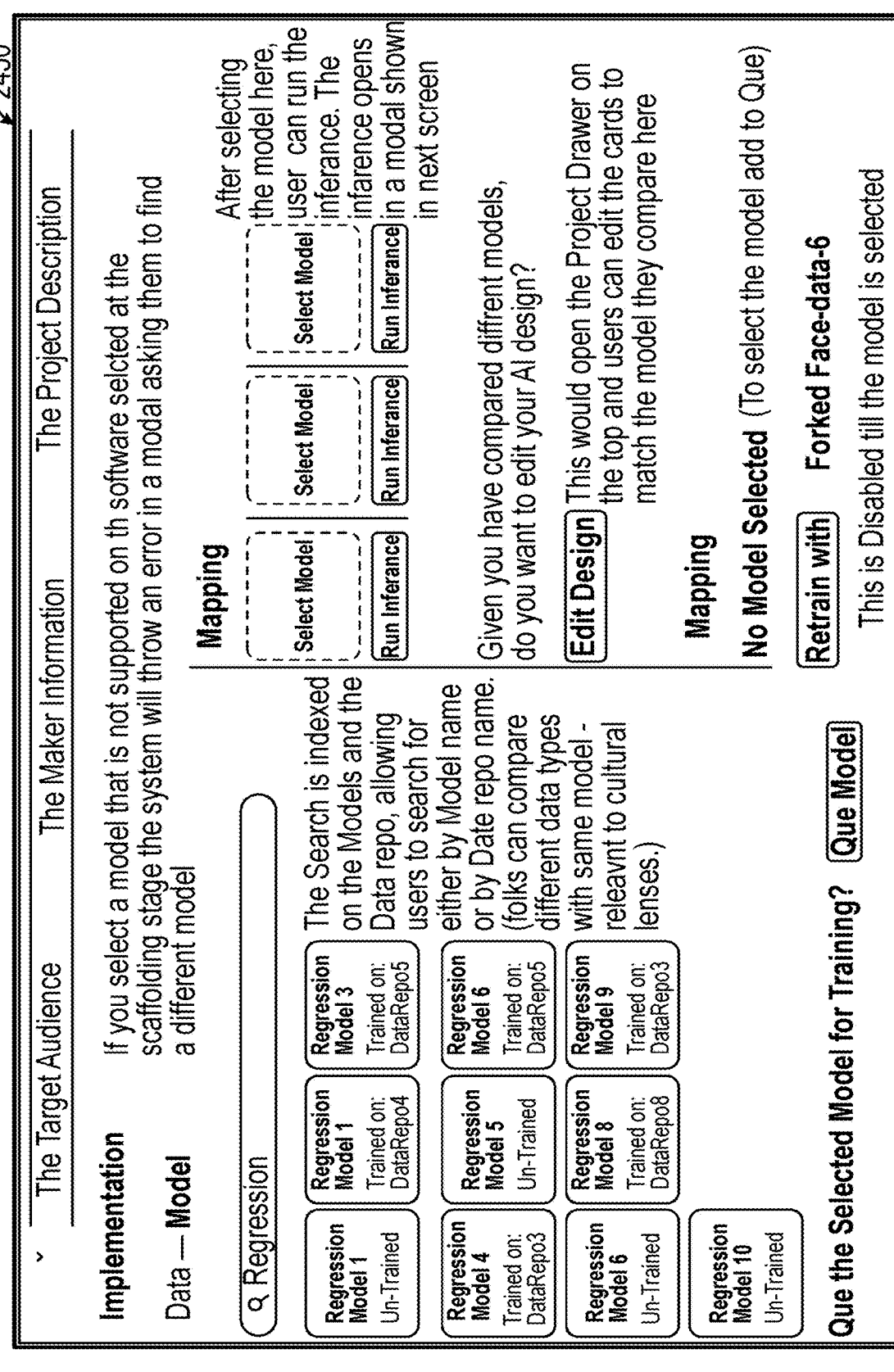
FIGS. 24G-J are exemplary user interfaces relating to the model implementation section of the tool, according to embodiments of the present disclosure.
Figure 24H:
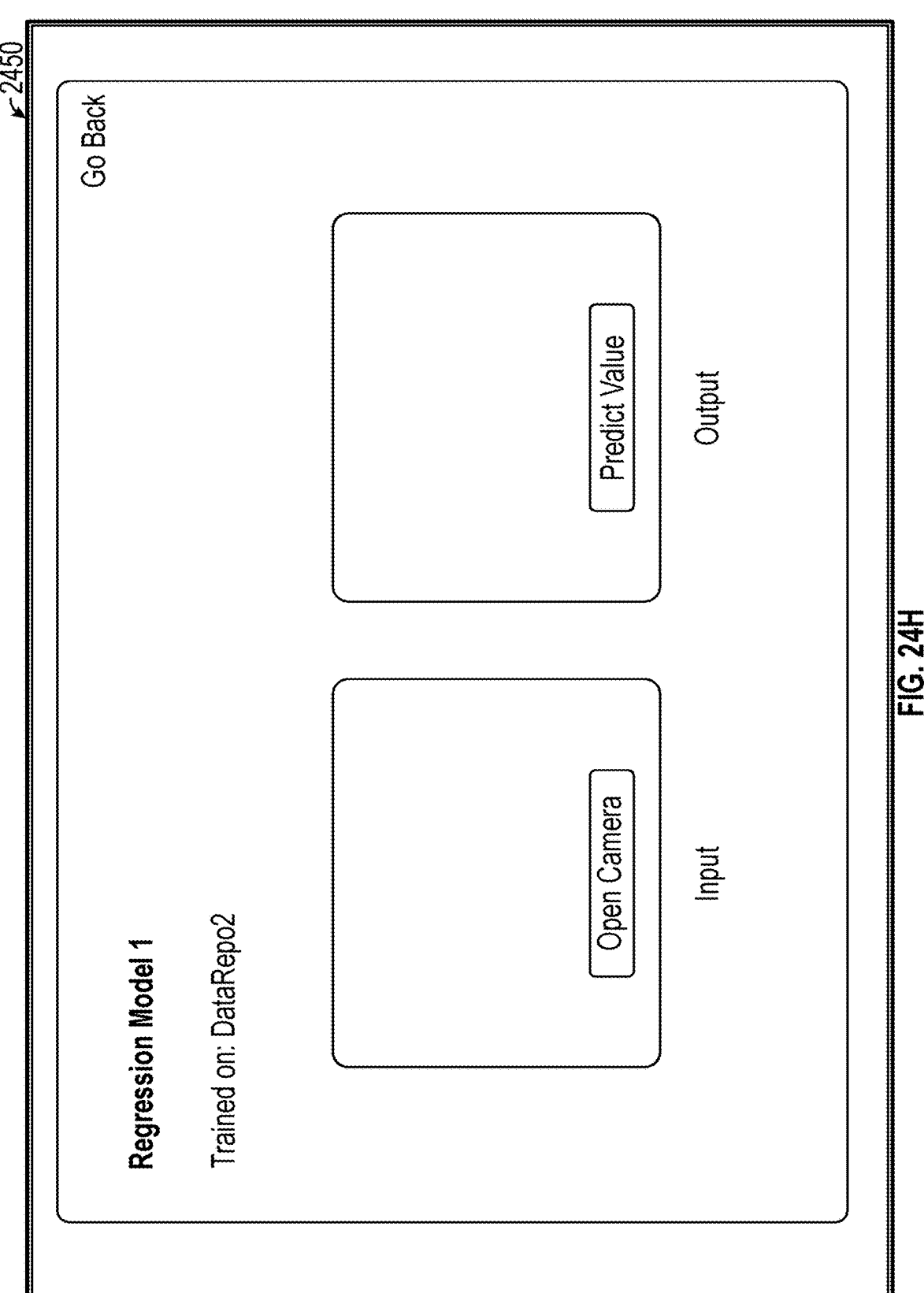
Figure 24I:
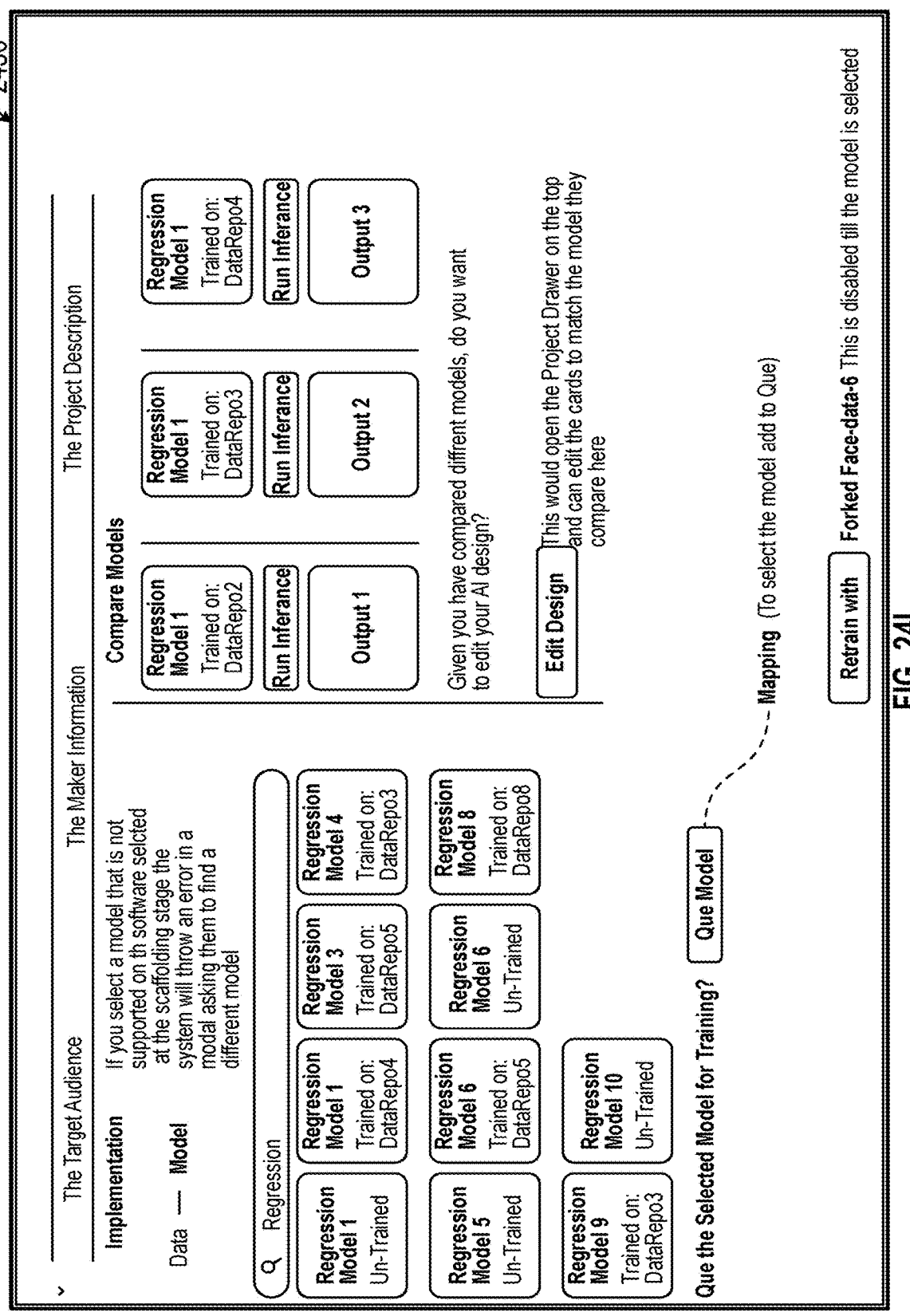
Figure 24J:
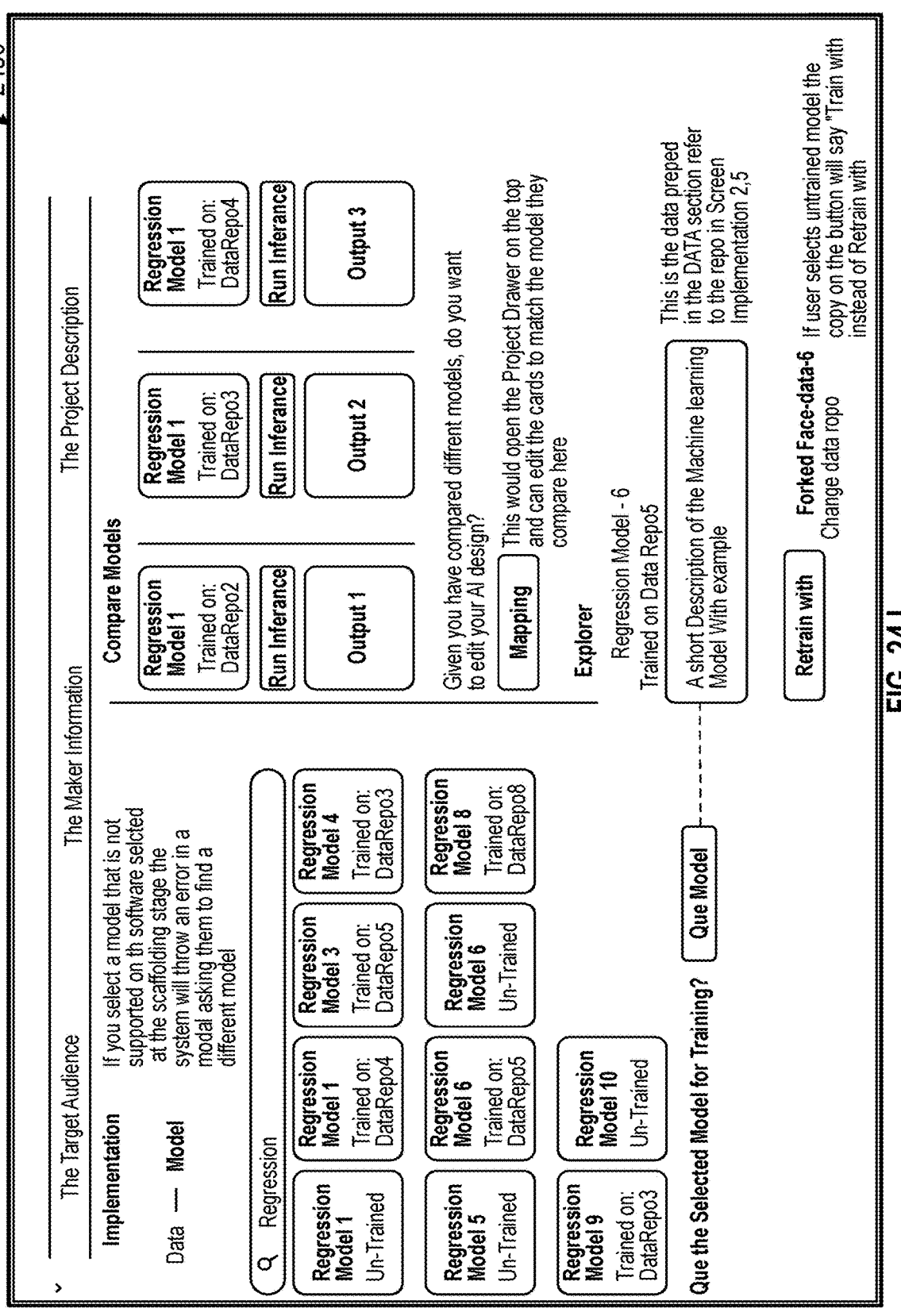

As shown in FIG. 24A, in the data implementation section 2400, a user can create/upload data from an existing dataset locally, a remote or networked dataset, or may input an API. FIG. 24B illustrates an exemplary upload process. On the design card, the user can see the history of the model, how it was made, who contributed, and at what point it was changed or updated. For example, the user may load a csv or excel file exported from unity, containing movement (e.g., information from an accelerometer sensor). Rating of various objects in unity (sound, visuals, videos, patterns, etc)—focusing on more embodied approaches to data collection. The user may also upload data from those in their network (it may only be available to them via their drive). Here, the creator is asked creator and sourcing information (i.e., who is sourcing the information including, for example, social and background information). FIG. 24C illustrates an example where the user can explore or map the data and model section. As shown in FIG. 24D, the user may incorporate a data repo that already exists (e.g., via github, gitlab, internally with a group data network). The user may also see previous versions of the data (e.g., data updated or retrained by the Feminist.AI community). As shown in FIG. 24E, the user can add their own data to the data repo, and work with their own forked data. As shown in FIG. 24F, the user can select the model within the repository—then the toolkit shows the history of the model, how it was made, who contributed, and at what point it was changed or updated.

FIGS. 24 G-J show the model implementation section 2450. The model implementation may compare different models with one dataset, or one model with different datasets. As shown in FIG. 24G, the user can run inference on various models (with one data set) and can also engage in the reverse (where they use various datasets on one model and compare). If a user selects a model that is not supported by the software selected in the scaffolding section, the tool will throw an error in a model requesting that the user select another model. The search is indexed on the models and the data repository, allowing the users to search either by model name or data repository name (and can compare different data types with the same model relevant to the individual or community created frames (lenses)). After selecting a model, the users can run the inference. The inference opens in a modal shown in FIG. 24H. The "edit design" button opens a project drawer that allows users to edit cards to match the model. FIG. 24H illustrates an example of a model instance being run. FIG. 24I illustrates an example of an implementation model search. In this section, users can queue various models and retrain with a specific dataset. The dataset is disabled until the model is selected. FIG. 24J illustrates an implementation model search where a particular model has been selected.

Figure 25:
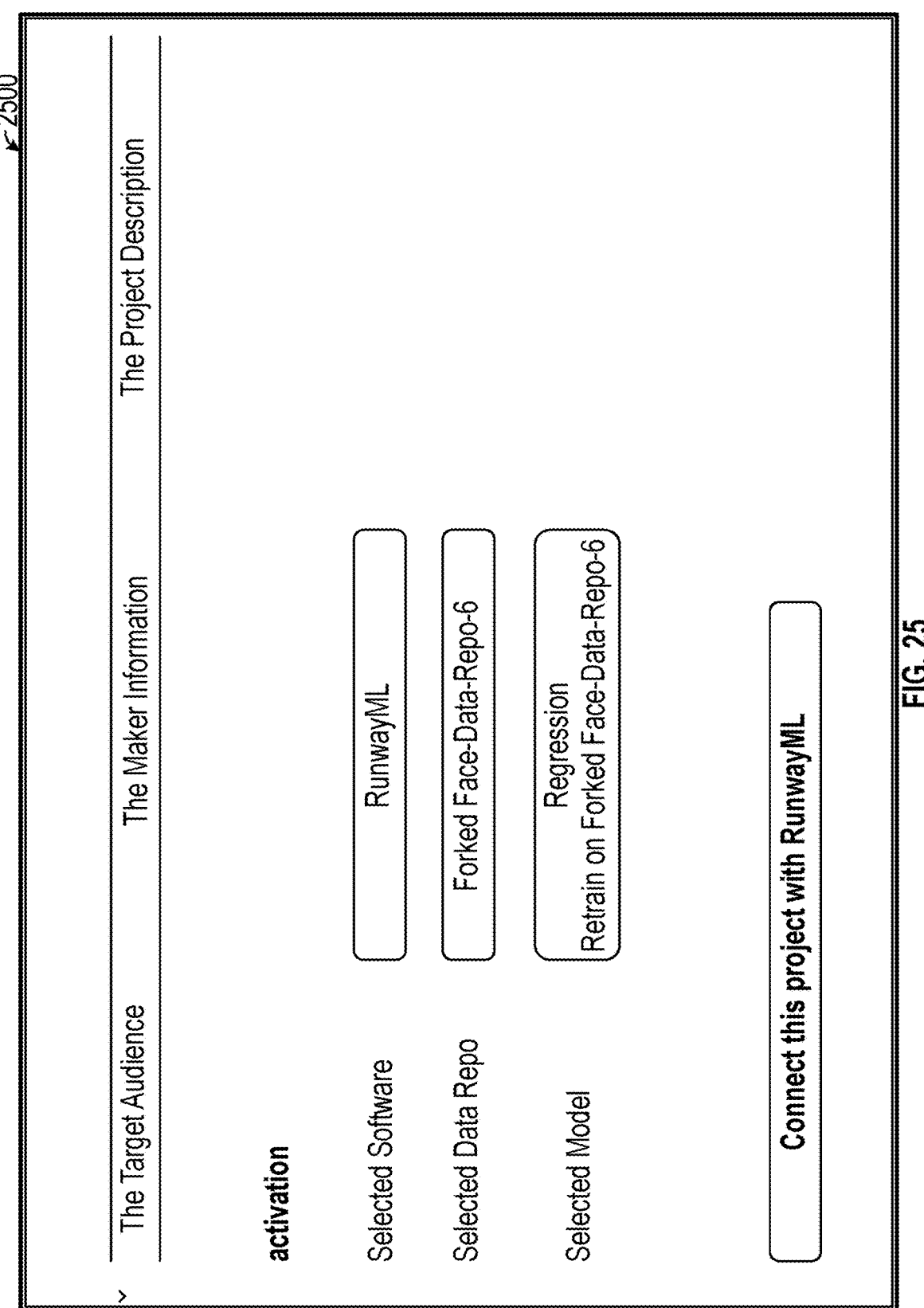
FIG. 25 illustrates an example of the activation (testing) section of the tool, according to an embodiment of the present disclosure.

FIG. 25 illustrates an example of the activation (testing) section 2500 of the tool. In this section, the user identifies any software integrations, models and data. If there are any issues here, suggestions are made regarding alternative models, data, etc. User may be redirected to other sections or required to update data or data parameters. Here, the user may connect their project with external software (if it has not already been connected).

Figure 26A:
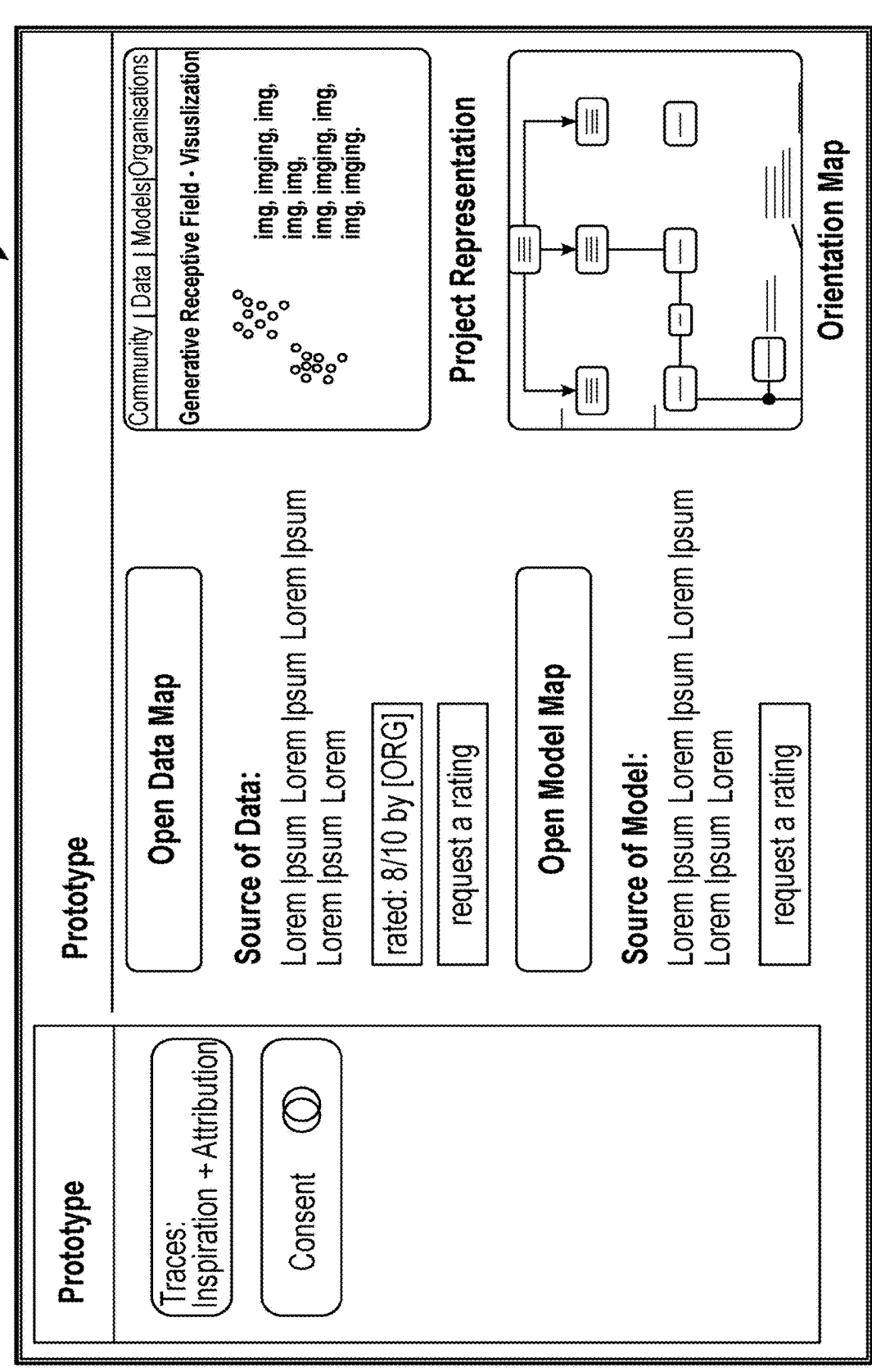
Figure 26B:
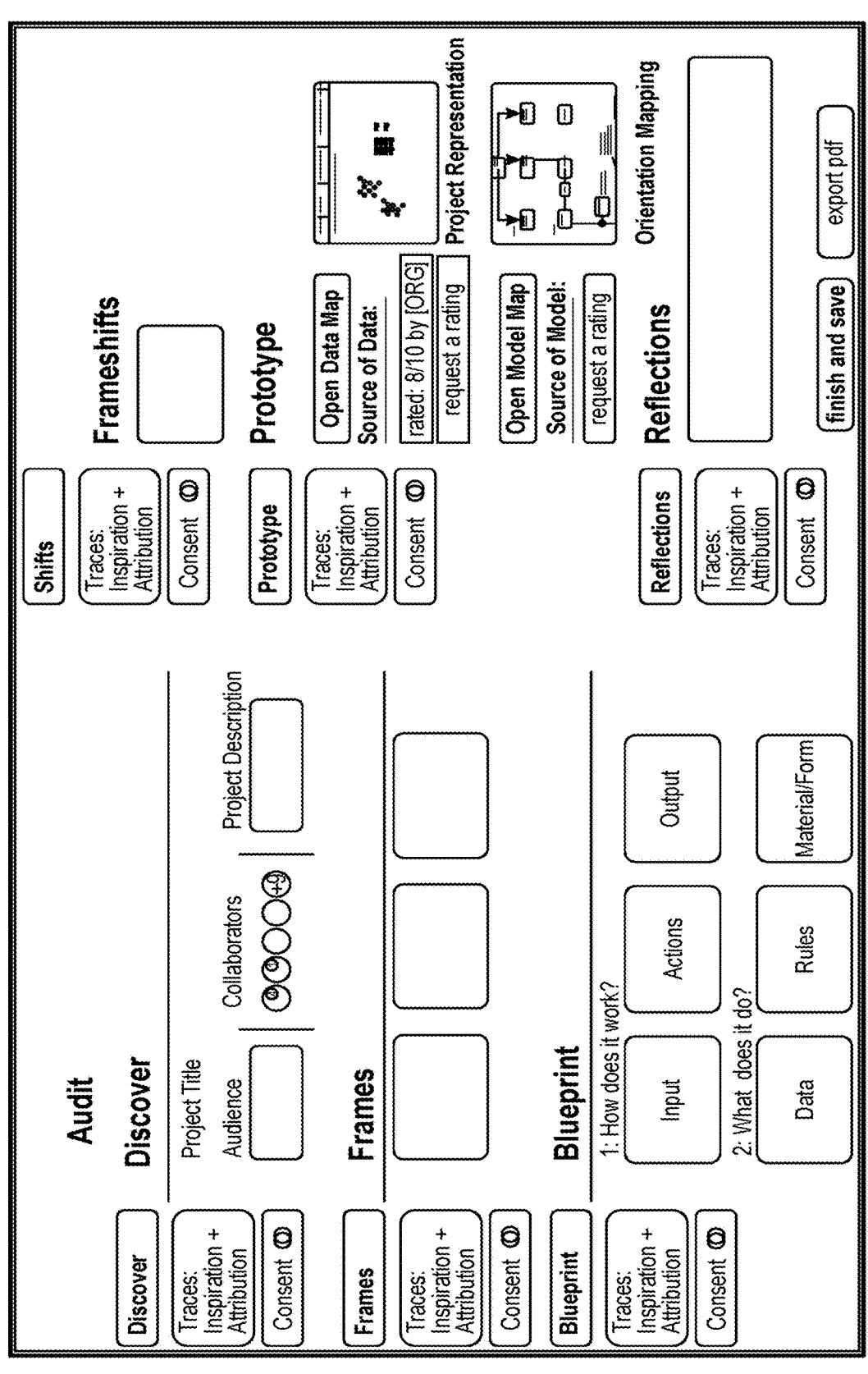

FIGS. 26A-E illustrate alternative variations of the audit section (2600, 2610, 2620, 2630, 2640) of the tool. This section may also include an at-a-glance section (project representation)—where there is a sensory (or accessible) entry point to the project—through a visualization, sound or sensor output that represents the whole project—through visuals or other sensory inputs/outputs, where the user can add information that is important to the final project representation card. In the audit section of the tool (in this case, the project representation), the user can see the state of diversity of dataset and the various considerations. On the screen, this is the section that "pops out" to represent various projects. The final snapshot identifies who was involved and their decision making. The final project asks people to socially position their work and describe where it lives. The audit section allows for the project to be viewed holistically, commented on, connected with—here the project can show some of the frames and considerations made during the design process, look at the consent section, inspiration, comments, flagging and rating sections, as well as ask people to consider the social implications of the project, where it may live, and if there is a disconnect between the users and creators. This audit section provides a view (or recap) of the data, algorithms, software and lenses used in the project. The visualization/sound (earcon) of the project summary shows the project representation (visual, sound, etc) poiesis/imprint and can be realized on paper, screen, via VR and AR or may be embedded or stored in objects. Users can add headers to the project representation section of the audit section based on the project and any additional categories pulled from the methods/landing page. FIGS. 26A-C also include the orientation/position map.

Figure 27B:
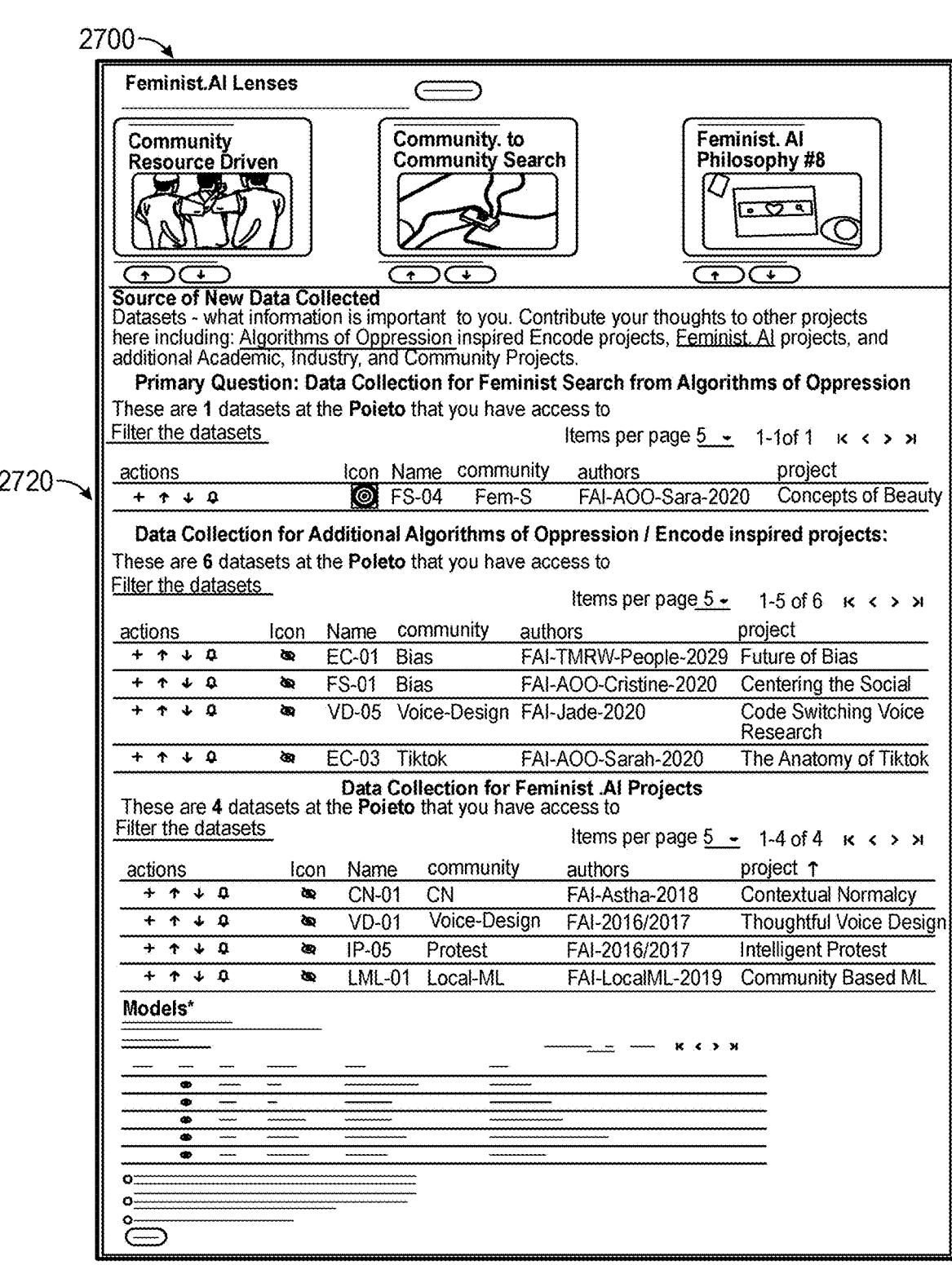
Figure 27C:
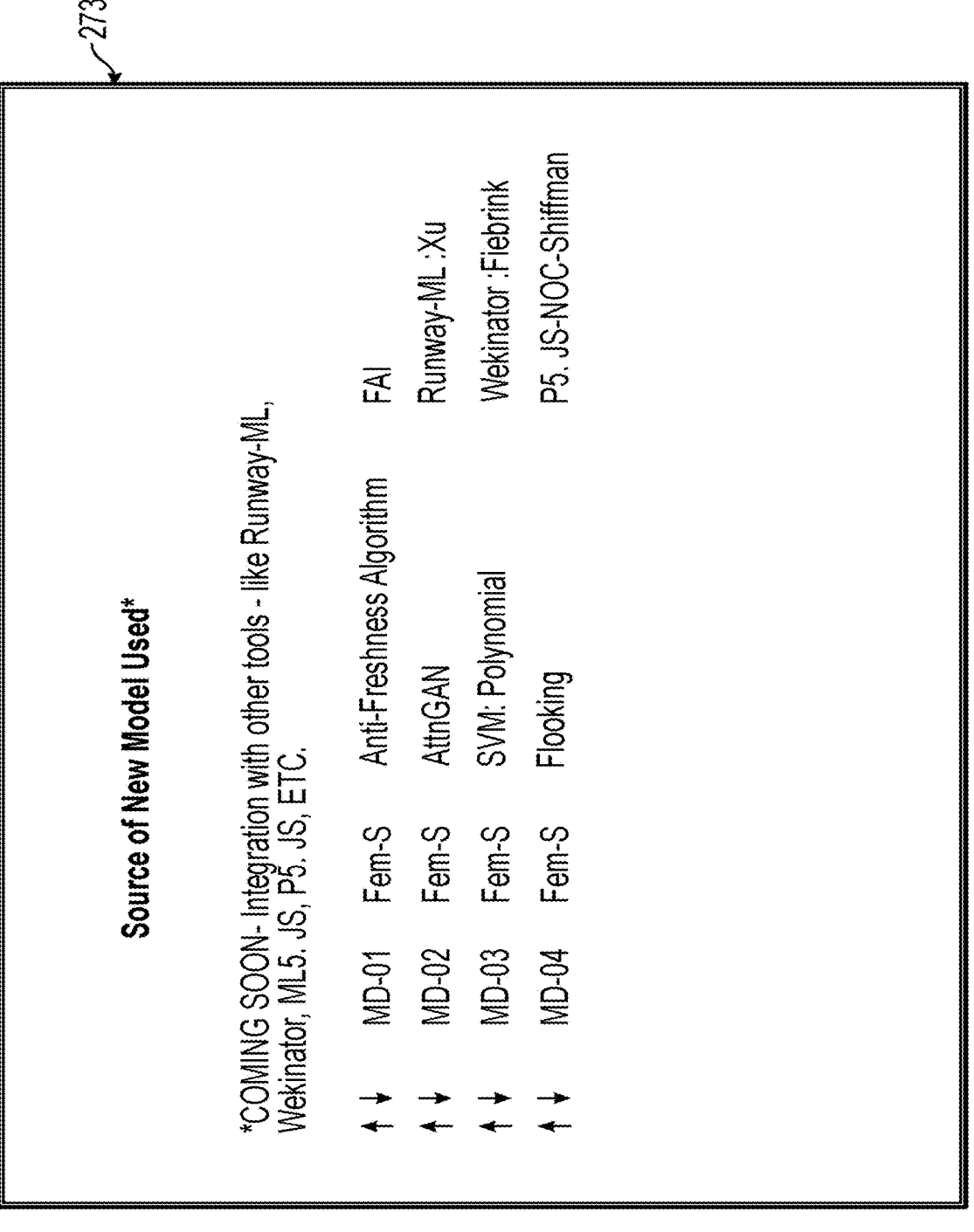

FIG. 27A-D are exemplary user interfaces that illustrate a project page 2700, which incorporates data collection section (for a specific project or related projects), showing that projects can be grouped by non-profits, academic institutions, project type, the individuals creating the project or own the project and the like. The tool provides a place to collect data and make critical projects with input from communities, as shown in FIGS. 27A and 27B. In this project pages/data collection example, a user can contribute information, which reframes the process of search, inspired by Algorithms of Oppression by Safiya U. Noble, contributed by the Feminist.AI community. Communities contribute and this this information can be used in education programming of the tool. Projects from this information page can be remixed or used in the tool (if consent is given). The tool provides a place to collect data and make critical projects with input from communities. Communities contribute and this this information can be used in education programming of the tool. Projects from this information page can be remixed or used in the tool (if consent is given). As shown in FIG. 27C, a user can click on existing models or suggest new ones in the sources of model section 2730, like the anti-freshness algorithm or link out to something like runway ml, or p5.js to incorporate with the project.

Rather than using google search to reimagine google search, a user can do it with, for example, Wekinator, Runway ML, or p5.js. In the data collection information shown in FIG. 27B and reproduced in FIG. 27D, a user can contribute information to existing algorithms of oppression inspired or Feminist.AI projects. For example, they can contribute by checking the plus button 2735 in the data collection section 2720 to launch a data contribution card 2740, as shown in FIG. 27D.

Figure 28:
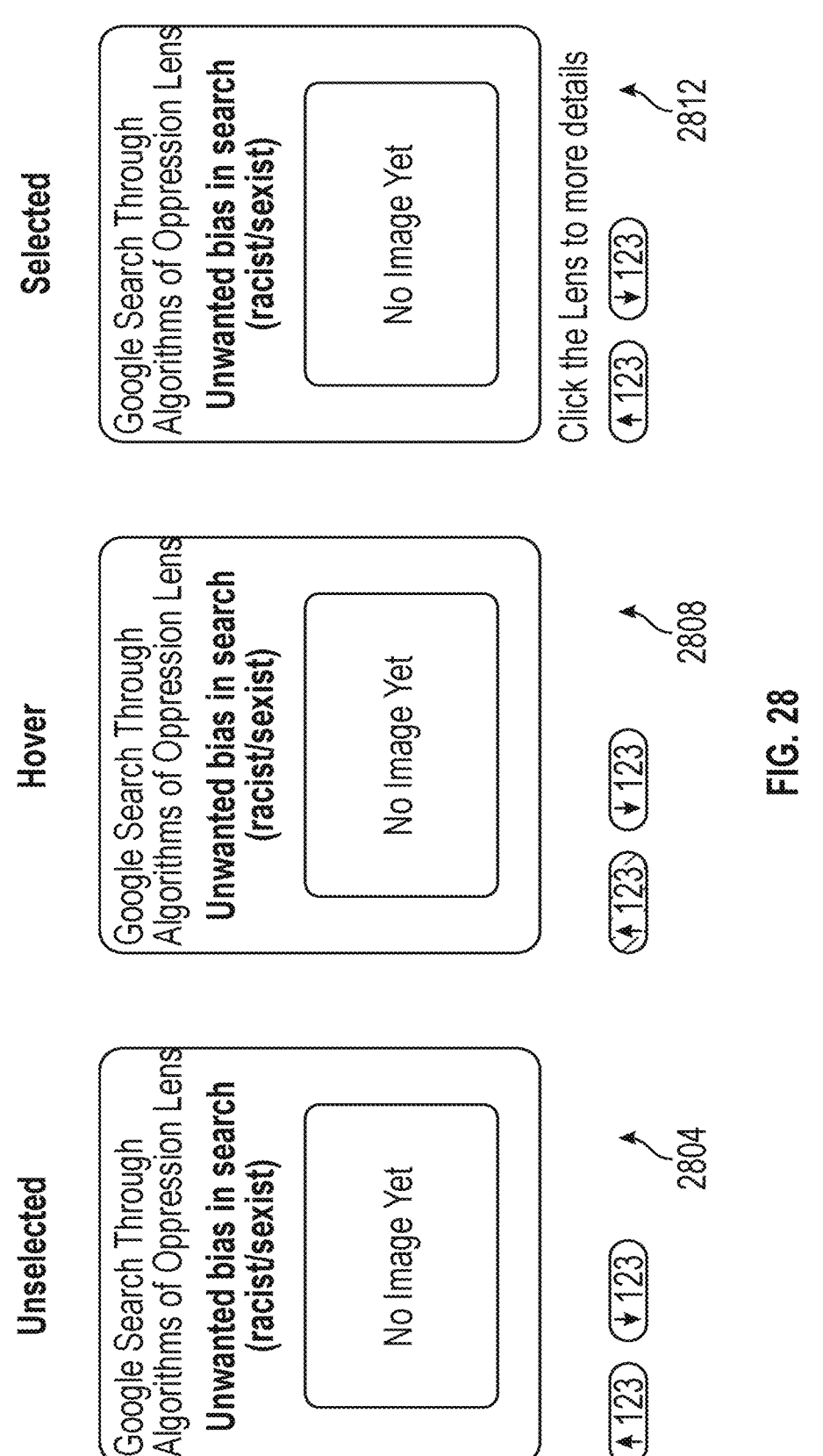
FIG. 28 is an exemplary user interface that illustrates card selection states within the tool, according to an embodiment of the present disclosure.

FIG. 28 illustrates the card selection states within the tool, according to an embodiment of the present disclosure. As shown in FIG. 28, exemplary card selection states include unselected 2804, hover 2808 and selected 2812.

Figure 29:
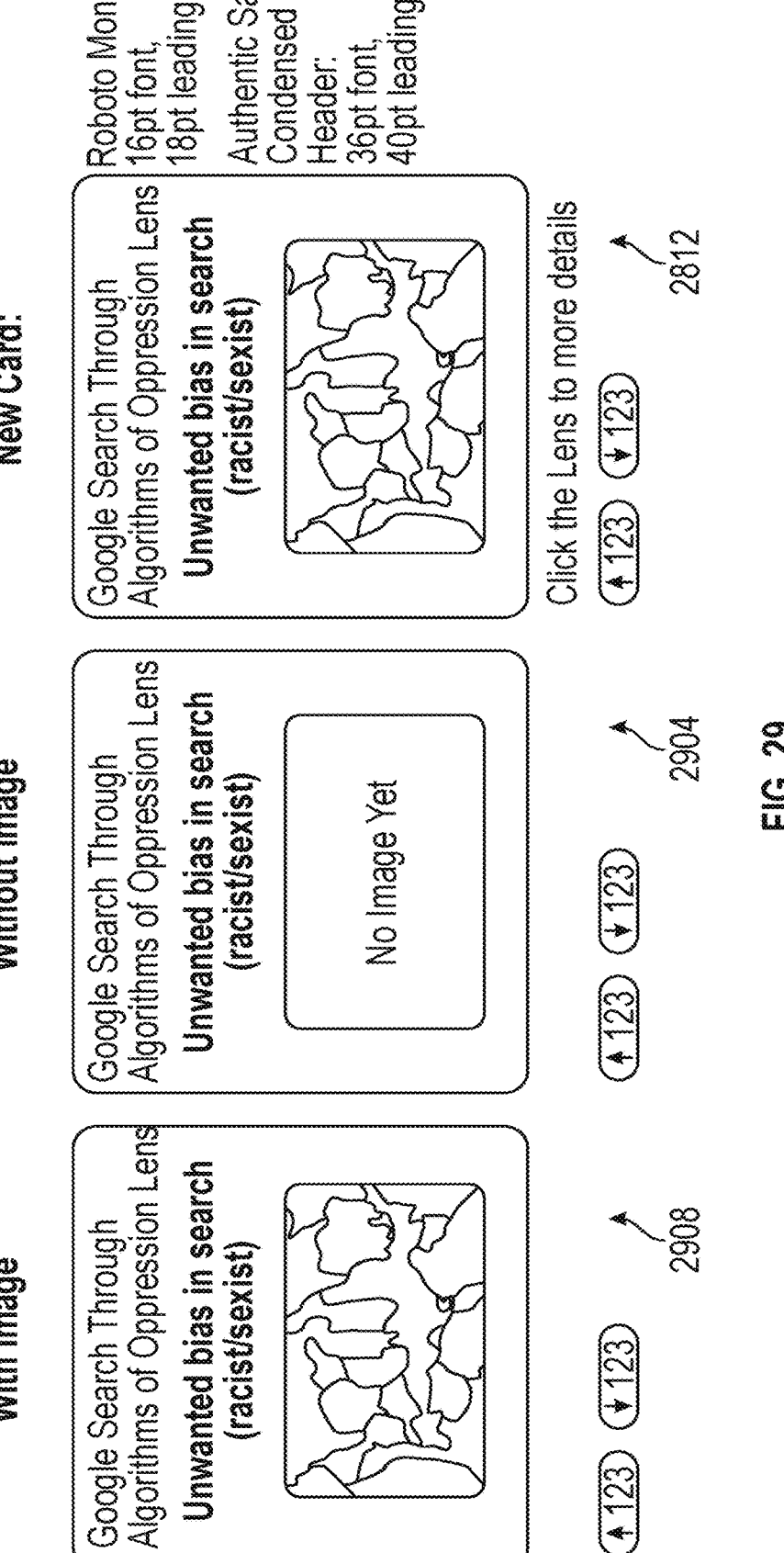
FIG. 29 illustrates an example of adding an image or other content to a blank or new card, according to an embodiment of the present disclosure.

FIG. 29 illustrates examples of types of data collection cards including blank cards 2904, cards with an added image or other input (such as a sound, API, etc.) 2908, and a new card 2912.

Machine Learning

Various aspects of the present disclosure can be performed by a machine-learning algorithm, as readily understood by a person skilled in the art. In some examples, the steps 120 and 130 of FIG. 1, steps 320 and 330 of FIG. 3, steps 420 and 430 of FIG. 4, steps 510 and 540 of FIG. 5, steps of the processes of FIGS. 12 and 13 can be performed by a supervised or unsupervised algorithm. For instance, the system may utilize more basic machine learning tools including (1) decision trees ("DT"), (2) Bayesian networks ("BN"), (3) artificial neural network ("ANN"), or (4) support vector machines ("SVM"). In other examples, deep learning algorithms or other more sophisticated machine learning algorithms, e.g., convolutional neural networks ("CNN"), or capsule networks ("CapsNet") may be used.

DT are classification graphs that match input data to questions asked at each consecutive step in a decision tree. The DT program moves down the "branches" of the tree based on the answers to the questions (e.g., First branch: Does the dataset comprise widely representative data? yes or no. Branch two: Is the dataset missing a specific racial/ethnic group? yes or no, etc.).

Bayesian networks ("BN") are based on likelihood something is true based on given independent variables and are modeled based on probabilistic relationships. BN are based purely on probabilistic relationships that determine the likelihood of one variable based on another or others. For example, BN can model the relationships between input datasets, output datasets, material, and any other information as contemplated by the present disclosure. Using an efficient BN algorithm, an inference can be made based on the input data.

Artificial neural networks ("ANN") are computational models inspired by an animal's central nervous system. They map inputs to outputs through a network of nodes. However, unlike BN, in ANN the nodes do not necessarily represent any actual variable. Accordingly, ANN may have a hidden layer of nodes that are not represented by a known variable to an observer. ANNs are capable of pattern recognition. Their computing methods make it easier to understand a complex and unclear process that might go on during predicting a body position of the user based a variety of input data.

Support vector machines ("SVM") came about from a framework utilizing of machine learning statistics and vector spaces (linear algebra concept that signifies the number of dimensions in linear space) equipped with some kind of limit-related structure. In some cases, they may determine a new coordinate system that easily separates inputs into two classifications. For example, a SVM could identify a line that separates two sets of points originating from different classifications of events.

Deep neural networks (DNN) have developed recently and are capable of modeling very complex relationships that have a lot of variation. Various architectures of DNN have been proposed to tackle the problems associated with algorithms such as ANN by many researchers during the last few decades. These types of DNN are CNN (Convolutional Neural Network), RBM (Restricted Boltzmann Machine), LSTM (Long Short Term Memory) etc. They are all based on the theory of ANN. They demonstrate a better performance by overcoming the back-propagation error diminishing problem associated with ANN.

Machine learning models require training data to identify the features of interest that they are designed to detect. For instance, various methods may be utilized to form the machine learning models, including applying randomly assigned initial weights for the network and applying gradient descent using back propagation for deep learning algorithms. In other examples, a neural network with one or two hidden layers can be used without training using this technique.

In some examples, the machine learning model can be trained using labeled data, or data that represents certain user input. In other examples, the data will only be labeled with the outcome and the various relevant data may be input to train the machine learning algorithm.

For instance, to determine whether a particular regulation fits the input data, various machine learning models may be utilized that input various data disclosed herein. In some examples, the input data will be labeled by having an expert in the field label the relevant regulations according to the particular situation. Accordingly, the input to the machine learning algorithm for training data identify various legal regulations as 'relevant' or 'non-relevant'.

Supervised Learning: The disclosed AI tool provides for using supervised learning to engage in classification. For example, the tool pairs keywords from questions with the primary feeling word in a particular question, and uses this as training data.

Unsupervised Learning: In another embodiment of the disclosed tool, the tool removes keyword pairs and determines what patterns emerge.

Local Hardware Model

The present disclosure contemplates that a local hardware model can be used to provide various embodiments of the present disclosure. For example, the disclosed AI tool can be provided for an electromechanical device which allows a user to create and follow associative trails of links and personal annotations while interacting with the disclosed AI tool. Such a local hardware model can mimic the associate processes of the human brain (or the local hardware model mirrors other natural systems), and allow a user to better learn how to construct and deconstruct AI systems. For example, electro-mechanical controls and display device scan be integrated into a desk. Such a local hardware model can provide haptic, tactile, auditory, physical, and visual feedback to a user. Feedback can additionally be provided across realities.

Computer & Hardware Implementation of Disclosure

It should initially be understood that the disclosure herein may be implemented with any type of hardware and/or software, and may be a pre-programmed general purpose computing device. For example, the system may be implemented using a server, a personal computer, a portable computer, a thin client, or any suitable device or devices.

The disclosure and/or components thereof may be a single device at a single location, or multiple devices at a single, or multiple, locations that are connected together using any appropriate communication protocols over any communication medium such as electric cable, fiber optic cable, or in a wireless manner.

It should also be noted that the disclosure is illustrated and discussed herein as having a plurality of modules which perform particular functions. It should be understood that these modules are merely schematically illustrated based on their function for clarity purposes only, and do not necessary represent specific hardware or software. In this regard, these modules may be hardware and/or software implemented to substantially perform the particular functions discussed. Moreover, the modules may be combined together within the disclosure, or divided into additional modules based on the particular function desired. Thus, the disclosure should not be construed to limit the present invention, but merely be understood to illustrate one example implementation thereof.

The computing system can include clients and servers. A client and server are generally remote from each other and typically interact through a communication network. The relationship of client and server arises by virtue of computer programs running on the respective computers and having a client-server relationship to each other. In some implementations, a server transmits data (e.g., an HTML page) to a client device (e.g., for purposes of displaying data to and receiving user input from a user interacting with the client device). Data generated at the client device (e.g., a result of the user interaction) can be received from the client device at the server.

In some examples, the present disclosure contemplates any of the following networks (or a combination of the networks), including: a distributed network, a decentralized network, an edge network, a federated network, and/or a mesh network.

Implementations of the subject matter described in this specification can be implemented in a computing system that includes a backend component, e.g., as a data server, or that includes a middleware component, e.g., an application server, or that includes a frontend component, e.g., a client computer having a graphical user interface or a Web browser through which a user can interact with an implementation of the subject matter described in this specification, or any combination of one or more such backend, middleware, or frontend components. The components of the system can be interconnected by any form or medium of digital data communication, e.g., a communication network. Examples of communication networks include a local area network ("LAN") and a wide area network ("WAN"), an internetwork (e.g., the Internet), mesh networks, and peer-to-peer networks (e.g., ad hoc peer-to-peer networks).

Implementations of the subject matter and the operations described in this specification can be implemented in digital electronic circuitry, or in computer software, firmware, or hardware, including the structures disclosed in this specification and their structural equivalents, or in combinations of one or more of them. Implementations of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a "data processing apparatus" on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto-optical disks; and CDROM and DVD-ROM disks. The processor and the memory can be supplemented by, or incorporated in, special purpose logic circuitry.

Other examples of processors include AI hardware devices.

CONCLUSION

The various methods and techniques described above provide a number of ways to carry out the invention. Of course, it is to be understood that not necessarily all objectives or advantages described can be achieved in accordance with any particular embodiment described herein. Thus, for example, those skilled in the art will recognize that the methods can be performed in a manner that achieves or optimizes one advantage or group of advantages as taught herein without necessarily achieving other objectives or advantages as taught or suggested herein. A variety of alternatives are mentioned herein. It is to be understood that some embodiments specifically include one, another, or several features, while others specifically exclude one, another, or several features, while still others mitigate a particular feature by inclusion of one, another, or several advantageous features.

Furthermore, the skilled artisan will recognize the applicability of various features from different embodiments. Similarly, the various elements, features and steps discussed above, as well as other known equivalents for each such element, feature or step, can be employed in various combinations by one of ordinary skill in this art to perform methods in accordance with the principles described herein. Among the various elements, features, and steps some will be specifically included and others specifically excluded in diverse embodiments.

Although the application has been disclosed in the context of certain embodiments and examples, it will be understood by those skilled in the art that the embodiments of the application extend beyond the specifically disclosed embodiments to other alternative embodiments and/or uses and modifications and equivalents thereof.

In some embodiments, the terms "a" and "an" and "the" and similar references used in the context of describing a particular embodiment of the application (especially in the context of certain of the following claims) can be construed to cover both the singular and the plural. The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (for example, "such as") provided with respect to certain embodiments herein is intended merely to better illuminate the application and does not pose a limitation on the scope of the application otherwise claimed. No language in the specification should be construed as indicating any non-claimed element essential to the practice of the application.

Certain embodiments of this application are described herein. Variations on those embodiments will become apparent to those of ordinary skill in the art upon reading the foregoing description. It is contemplated that skilled artisans can employ such variations as appropriate, and the application can be practiced otherwise than specifically described herein. Accordingly, many embodiments of this application include all modifications and equivalents of the subject matter recited in the claims appended hereto as permitted by applicable law. Moreover, any combination of the above-described elements in all possible variations thereof is encompassed by the application unless otherwise indicated herein or otherwise clearly contradicted by context.

Particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

All patents, patent applications, publications of patent applications, and other material, such as articles, books, specifications, publications, documents, things, and/or the like, referenced herein are hereby incorporated herein by this reference in their entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that can be employed can be within the scope of the application. Thus, by way of example, but not of limitation, alternative configurations of the embodiments of the application can be utilized in accordance with the teachings herein. Accordingly, embodiments of the present application are not limited to that precisely as shown and described.

What is claimed is:

1. A method comprising:
   defining a project comprising one or more artificial intelligence (AI) models executed by one or more processors;
   providing identification information identifying a designer of the project and associated with an unwanted bias, an intent of the project, and an intended audience of the project;
   identifying frames characterizing the project, wherein the frames comprise data relating to the one or more models and perspective data that specify a perspective characterizing the project, and wherein the frames identify issues of the project relating to the unwanted bias;
   generating, by the one or more processors, and based on the identified frames, a blueprint to identify whether changes in the models or data used by the models are required; and
   making changes, by the one or more processors, to the project by changing data content of the frames to remove the unwanted bias.

2. The method of claim 1, further comprising performing data mapping.

3. The method of claim 1, further comprising performing model mapping.

4. The method of claim 1, further comprising performing form mapping.

5. The method of claim 1, wherein generating the blueprint comprises analyzing artificial intelligence (AI) relating to the project.

6. The method of claim 5, wherein analyzing the AI comprises performing project mapping.

7. The method of claim 1, further comprising generating a prototype based on the blueprint.

8. The method of claim 1, further comprising:
   allowing another user to contribute to the project by identifying additional frames.

9. The method of claim 1, further comprising performing an audit of the project.

10. A non-transitory computer-readable medium in which is embedded computer-readable code that when loaded on a computing device comprising one or more processors causes the one or more processors to perform the steps of:
   defining a project comprising one or more artificial intelligence (AI) models executed by the one or more processors;
   providing identification information identifying a designer of the project and associated with an unwanted bias, an intent of the project, an intended audience of the project;
   identifying frames characterizing the project, wherein the frames comprise data relating to the one or more models and perspective data that specify a perspective characterizing the project, and wherein the frames identify issues of the project relating to the unwanted bias;
   generating, by the one or more processors, and based on the identified frames, a blueprint to identify whether changes in the models or data used by the models are required; and
   making changes, by the one or more processors, to the project by changing data content of the frames to remove the unwanted bias.

11. The non-transitory computer-readable medium of claim 10, further comprising performing data mapping.

12. The non-transitory computer-readable medium of claim 10, further comprising performing model mapping.

13. The non-transitory computer-readable medium of claim 10, further comprising performing form mapping.

14. The non-transitory computer-readable medium of claim 10, wherein generating the blueprint comprises analyzing artificial intelligence (AI) relating to the project.

15. The non-transitory computer-readable medium of claim 14, wherein analyzing the AI comprises performing project mapping.

16. The non-transitory computer-readable medium of claim 10, further comprising generating a prototype based on the blueprint.

17. The non-transitory computer-readable medium of claim 10, further comprising:

allowing another user to contribute to the project by identifying additional frames.

18. The non-transitory computer-readable medium of claim 10, further comprising performing an audit of the project.

* * * * *